US012230347B2

(12) United States Patent
Suh et al.

(10) Patent No.: US 12,230,347 B2
(45) Date of Patent: Feb. 18, 2025

(54) SYSTEM AND MEMORY WITH CONFIGURABLE METADATA PORTION

(71) Applicant: QUALCOMM Incorporated, San Diego, CA (US)

(72) Inventors: Jungwon Suh, San Diego, CA (US); Dexter Tamio Chun, San Diego, CA (US); Anand Srinivasan, San Diego, CA (US); Olivier Alavoine, San Diego, CA (US); Laurent Rene Moll, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/322,997

(22) Filed: May 24, 2023

(65) Prior Publication Data

US 2023/0298682 A1 Sep. 21, 2023

Related U.S. Application Data

(62) Division of application No. 17/245,981, filed on Apr. 30, 2021, now Pat. No. 11,728,003.
(Continued)

(51) Int. Cl.
*G11C 29/42* (2006.01)
*G11C 7/10* (2006.01)
(Continued)

(52) U.S. Cl.
CPC ............ *G11C 29/42* (2013.01); *G11C 7/1045* (2013.01); *G11C 29/18* (2013.01); *G11C 29/44* (2013.01); *G11C 2029/1202* (2013.01)

(58) Field of Classification Search
None
See application file for complete search history.

(56) References Cited

U.S. PATENT DOCUMENTS

| 5,703,628 A | * | 12/1997 | Nishiyama | ............ | G09G 5/393 |
| | | | | | 345/543 |
| 6,684,289 B1 | * | 1/2004 | Gonzalez | ............ | G06F 12/0246 |
| | | | | | 711/171 |

(Continued)

OTHER PUBLICATIONS

Author Unknown, "JEDEC Standard: Low Power Double Data Rate 5 (LPDDR5)," JESD209-6B, Jun. 2021, JEDEC Solid State Technology Association, 622 pages.
(Continued)

*Primary Examiner* — J. H. Hur
(74) *Attorney, Agent, or Firm* — W&T/Qualcomm

(57) ABSTRACT

Methods and apparatuses for a system error-correction code function are presented. The apparatus includes a memory configured to communicate with a host via at least one data connection and at least one non-data connection. The memory includes a memory array. The memory array includes a first portion and a second portion. The memory is further configured to, in a first mode, store and output data in the first portion and the second portion of the memory array. The first portion is addressable by a first address, and the second portion is addressable by a second address. The memory is further configured to, in a second mode, receive ECC of the data from the host via the at least one non-data connection, store the data in the first portion of the memory array, and store the ECC of the data in the second portion of the memory array based on the first address.

12 Claims, 36 Drawing Sheets

Related U.S. Application Data

(60) Provisional application No. 63/023,640, filed on May 12, 2020.

(51) Int. Cl.
  *G11C 29/12* (2006.01)
  *G11C 29/18* (2006.01)
  *G11C 29/44* (2006.01)

(56) References Cited

U.S. PATENT DOCUMENTS

| | | |
|---|---|---|
| 10,331,517 B2 | 6/2019 | Suh |
| 2006/0218467 A1* | 9/2006 | Sibigtroth ............ G11C 29/52 714/763 |
| 2007/0255981 A1 | 11/2007 | Eto |
| 2011/0084978 A1 | 4/2011 | Schuette |
| 2013/0039129 A1 | 2/2013 | Radke et al. |
| 2013/0198587 A1 | 8/2013 | Kim et al. |
| 2014/0075265 A1 | 3/2014 | Hung et al. |
| 2019/0056990 A1 | 2/2019 | Suh et al. |
| 2021/0064461 A1 | 3/2021 | Veches |
| 2021/0064463 A1 | 3/2021 | Suh et al. |
| 2021/0064467 A1 | 3/2021 | Buerkle et al. |
| 2021/0358559 A1 | 11/2021 | Suh et al. |

OTHER PUBLICATIONS

International Search Report and Written Opinion for International Patent Application No. PCT/US2021/030444, mailed Jul. 30, 2021, 13 pages.
JEDEC: "Low Power Double Data Rate 3 Sdram (LPDDR3)", JESD209-3C, Published on Aug. 2015, 2 Pages.
Reviriego P., et al., "A (64,45) Triple Error Correction Code for Memory Applications", IEEE Transactions on Device and Materials Reliability, vol. 12, No. 1, Mar. 2012, pp. 101-106.

* cited by examiner

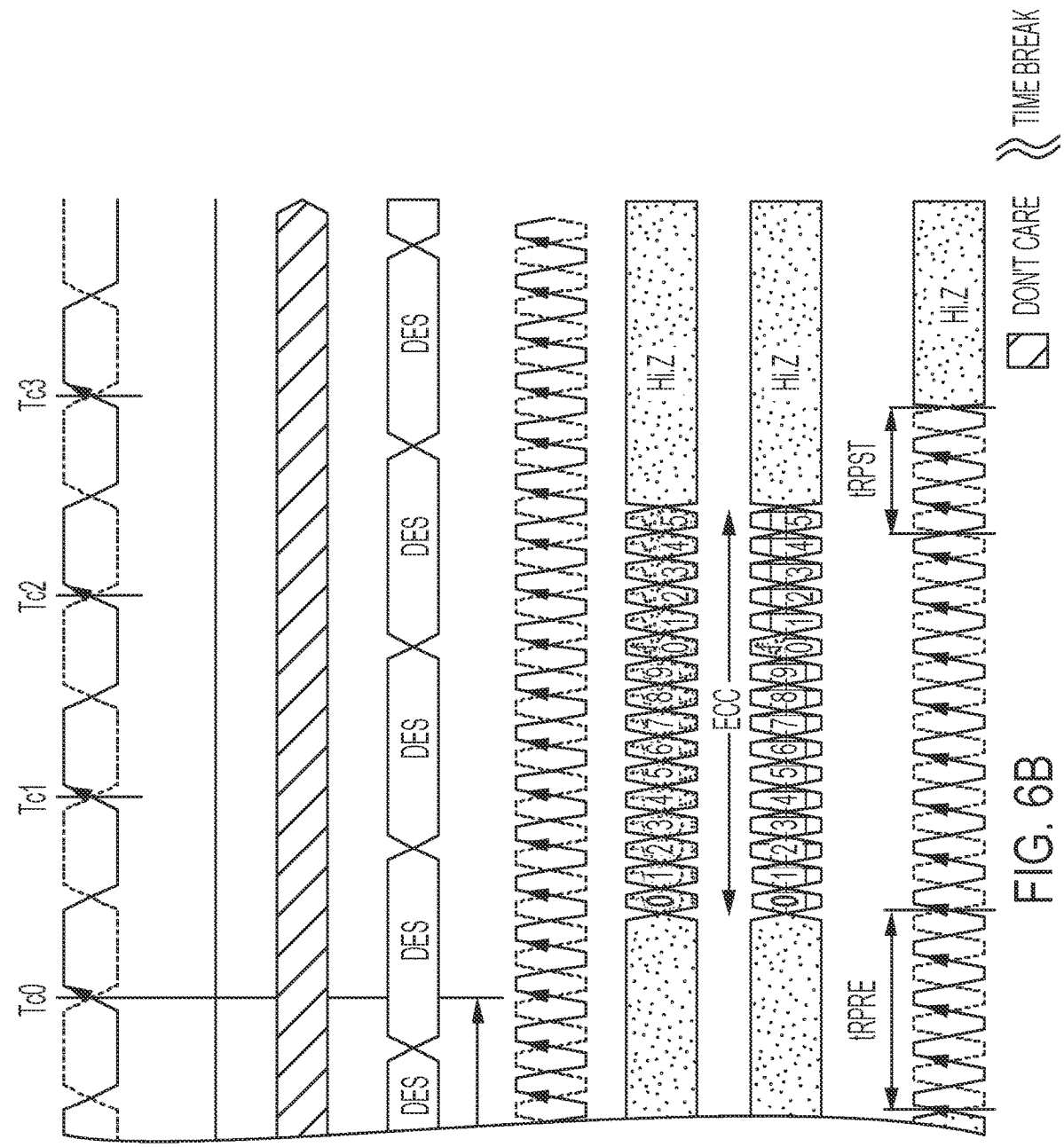

910

MRxx (Mode Register Number = xx)

| OP[7] | OP[6] | OP[5] | OP[4] | OP[3] | OP[2] | OP[1] | OP[0] |
|---|---|---|---|---|---|---|---|
| Reserved | | | | SESC (System ECC Support and Configuration) | | | |

920

| Function | Register Type | Operand | Data |
|---|---|---|---|
| SESC | Read only | OP[3:0] | 0000B:System ECC Not Supported<br>0001B:System ECC parity[0:31] per x16 Channel and BL16<br>0010B:System ECC parity[0:23] and AED E[0:7] per x16 Channel and BL16<br>0011B:System ECC parity[0:15] and AED E[0:15] per x16 Channel and BL16<br>0100B:System ECC parity[0:15] and AED E[0:7] per x16 Channel and BL16<br>0101B:System ECC parity[0:11] and AED E[0:19] per x16 Channel and BL16<br>0110B:System ECC parity[0:11] and AED E[0:7] per x16 Channel and BL16<br>Others: Reserved |

FIG. 9

SYSTEM AND MEMORY WITH CONFIGURABLE METADATA PORTION

PRIORITY APPLICATIONS

The present application is a divisional application of and claims priority to U.S. patent application Ser. No. 17/245,981, filed Apr. 30, 2021 and entitled "SYSTEM AND MEMORY WITH CONFIGURABLE ERROR-CORRECTION CODE (ECC) DATA PROTECTION AND RELATED METHODS," which is incorporated herein by reference in its entirety.

U.S. patent application Ser. No. 17/245,981 claims priority to U.S. Provisional Patent Application Ser. No. 63/023,640, filed May 12, 2020 and entitled "Memory with System ECC," which is incorporated herein by reference in its entirety.

BACKGROUND

I. Field of the Disclosure

The present disclosure relates generally to methods and apparatuses having memories with enhanced error detection and/or correction schemes and more particularly, to memories using system error detection codes (ECCs).

II. Background

A computing device (e.g., a laptop, a mobile phone, etc.) may include one or several processors to perform various computing functions, such as telephony, wireless data access, and camera/video function, etc. A memory is an important component of the computing device. The processors may be coupled to the memory to perform the aforementioned computing functions. For example, the processors may fetch instructions from the memory to perform the computing function and/or to store within the memory temporary data for processing these computing functions, etc.

SUMMARY OF THE DISCLOSURE

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes a memory configured to communicate with a host via at least one data connection and at least one non-data connection. The memory includes a memory array. The memory array includes a first portion and a second portion. The memory is configured to receive data from the host via the at least one data connection and to output the data to the host via the at least one data connection. The memory is further configured to, in a first mode, store and output the data in the first portion and the second portion of the memory array. The first portion is addressable by a first address, and the second portion is addressable by a second address. The memory is further configured to, in a second mode, receive the data from the host via the at least one data connection and receive error-correction code (ECC) of the data from the host, via the non-data connection. The memory is further configured to, in the second mode, store the data in the first portion of the memory array and store the ECC of the data in the second portion of the memory array based on the first address. The memory is further configured to, in a second mode, output the data in the first portion to the host via the at least one data connection, and output the ECC of the data to the host, via the at least one non-data connection.

Another apparatus in accordance with at least one embodiment includes a host configured to communicate with a memory via at least one data connection and at least one non-data connection. The memory includes a memory array. The memory array includes a first portion and a second portion. The host is further configured to receive data from the memory and provide data to the memory, via the at least one data connection. The host is further configured to, in a first mode, output a first address to the memory to access the data in the first portion of the memory array and output a second address to the memory to access the data in the second portion of the memory array. The host is further configured to, in a second mode, output the first address to the memory to access the data in the first portion and to access error-correction code (ECC) of the data in the second portion of the memory array, via the at least one non-data connection.

A method to communicate error correction code between a host and a memory is presented. The method includes communicating, by the memory, with the host via at least one data connection and at least one non-data connection. The memory includes a memory array. The memory array includes a first portion and a second portion. The method further includes receiving, by the memory, data from the host via the at least one data connection; outputting, by the memory, the data to the host via the at least one data connection. The method further includes storing and outputting, by the memory in a first mode, the data in the first portion and the second portion of a memory array of the memory. The first portion is addressable by a first address, and the second portion is addressable by a second address. The method further includes receiving, by the memory in a second mode, error-correction code (ECC) of the data from the host, via the at least one non-data connection; storing, by the memory in the second mode, the data in the first portion of the memory array; storing, by the memory in the second mode, the ECC of the data in the second portion of the memory array based on the first address; and outputting, by the memory in the second mode, the ECC of the data to the host, via the at least one non-data connection.

Another method to communicate error correction code between a host and a memory is presented. The method includes communicating, by the host, with the memory via at least one data connection and at least one non-data connection. The memory includes a memory array. The memory array includes a first portion and a second portion. The method further includes receiving, by the host, data from the memory via the at least one data connection and providing, by the host, the data to the memory, via the at least one data connection. The method further includes outputting, by the host in a first mode, a first address to the memory to access the data in the first portion of the memory array and outputting, by the host in the first mode, a second address to the memory to access the data in the second portion of the memory array. The method further includes outputting, by the host in a second mode, the first address to the memory to access the data in the first portion and to access the error-correction code (ECC) of the data in the second portion of the memory array, via the at least one non-data connection.

Another apparatus in accordance with at least one embodiment includes a memory configured to communicate with a host. The memory includes a memory array. The memory array includes a first portion and a second portion. The memory is configured to receive data from the host and output the data to the host. The memory is further configured to, in a first mode, store and output the data in the first portion and the second portion of the memory array. The first portion is addressable by a first address, and the second portion being addressable by a second address. The memory is further configured to, in a second mode, store and output the data in the first portion, based on the first address; receive metadata of the data from the host; and store and output the metadata in the second portion, based on the first address.

Another apparatus in accordance with at least one embodiment includes a host configured to communicate with a memory. The memory includes a memory array. The memory array includes a first portion and a second portion. The host is further configured to receive data from the memory and provide data to the memory. The host is further configured to, in a first mode, output a first address to the memory to access the data in the first portion of the memory array and output a second address to the memory to access the data in the second portion of the memory array. The host is further configured to, in a second mode, output the first address to the memory to access the data in the first portion and to access metadata of the data in the second portion of the memory array.

BRIEF DESCRIPTION OF THE FIGURES

Various aspects of apparatus and methods will now be presented in the detailed description by way of example, and not by way of limitation, with reference to the accompanying drawings, wherein:

FIGS. 6A and 6B illustrate waveforms of the system ECC function of the apparatus of FIG. 3 in a read operation, in accordance with certain aspects of the present disclosure;

FIG. 9 illustrates an embodiment of the mode register of the apparatus of FIG. 3, in accordance with certain aspects of the present disclosure;

DETAILED DESCRIPTION

Figure 1:
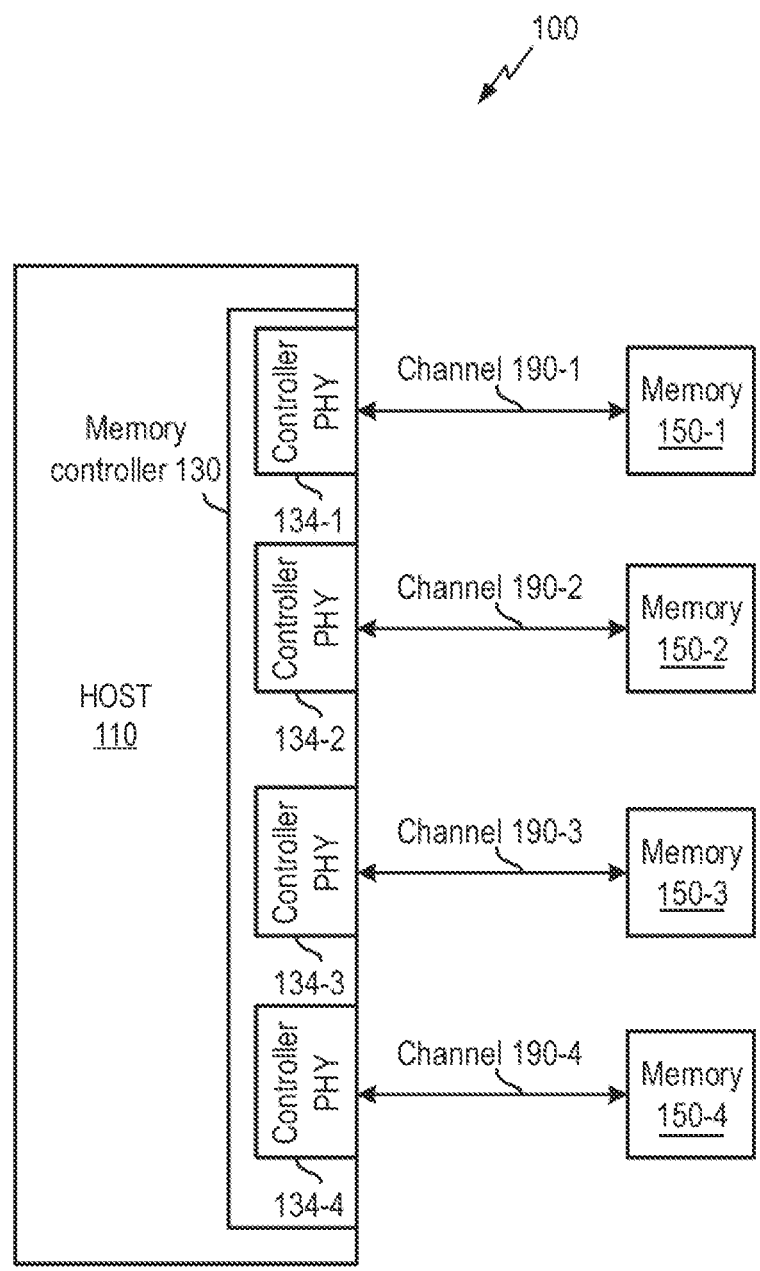
FIG. 1 illustrates an apparatus incorporating a host, memories, and channels coupling the host and the memories.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" means a transfer of electrical energy between elements A and B, to operate certain intended functions.

In some examples, the term "electrically connected" means having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. are employed for ease of reference and may not carry substantive meanings. Likewise, names for components/modules may be adopted for ease of reference and might not limit the components/modules. For example, such non-limiting names may include "read ECC" signal connection and "write ECC" signal connection. Modules and components presented in the disclosure may be implemented in hardware, software, or a combination of hardware and software. In some examples, the modules and components presented in the disclosure may be implemented in hardware only.

The term "bus system" may provide that elements coupled to the "bus system" may exchange information therebetween, directly or indirectly. In such fashion, the "bus system" may encompass multiple physical connections as well as intervening stages such as buffers, latches, registers, etc. A module may be implemented in hardware, software, or a combination of hardware and software.

The term error-correcting code or codes (ECC or ECCs) in the present disclosure may refer to error detection, error correcting, or error detection and correcting codes. The ECCs are not be limited to a particular type of coding. In some examples, the ECCs may include Hamming codes and/or parity codes.

Memories in the present disclosure may be embedded within a processor on a semiconductor die or be part of a different semiconductor die. The memories may be of various kinds. For example, the memory may be static random access memory (SRAM), dynamic random access memory (DRAM), magnetic random access memory (MRAM), NAND flash, or NOR flash, etc.

Methods and apparatuses are presented in the present disclosure by way of non-limiting examples of Low-Power Double Data Rate (LPDDR) Synchronous Dynamic Random Access Memory (SDRAM). For example, the LPDDR memory operating in accordance with LPDDR specification promulgated by Joint Electronic Device Engineering Council (JEDEC). One such LPDDR specification may be LPDDR5.

As demands grow for the computing device to perform more functions with increasing speed, errors with data stored in a memory may grow as well. Errors may grow as data stored in memories and transferred between blocks increases. One example of error correction code (ECC) for a link between a host and a memory is provided in U.S. Pat. No. 10,331,517, assigned to the assignee hereof and expressly incorporated herein by reference in its entirety. Schemes to improve error detection/correction in accessing a memory, without overburdening a host or the memory, are advantageous to improve system performance.

In addition to the link ECC provided in U.S. Pat. No. 10,331,517, other ECC schemes may be utilized. For example, within a memory, the memory may utilize array ECC that detect and/or correct errors within the memory. A host coupled to memory may separately utilize a different memory for ECC on a system-level (system ECC). In some examples, end-to-end system ECC may be implemented in a host by adding large density on-chip SRAM to store In-line ECC parity bits for certain data to enhance overall data reliability. However, such high density on-chip SRAM is very expensive in terms of overall system cost, and high density SRAM is susceptible to soft errors associated with SRAM cells.

In the present disclosure, system ECC parity bits are generated inside a host and transferred through RDQS_t (in a write operation) and DM (in a read operation) between the host and a memory device. The system parity bits may be stored together with a given data into DRAM cell array, so the ECC protection provides a unified and consistent way to reduce overall system cost by removing on-chip SRAM and to achieve better performance without requiring a separate memory link ECC.

The present disclosure thus provides a simplified and efficient ECC scheme to implement the system ECC by sharing certain resources of the link ECC. In such fashion, overall system cost might be reduced and performance improved.

FIG. 1 illustrates an apparatus 100 incorporating a host 110, memories 150, and channels 190 coupling the host 110 and the memories 150. The apparatus 100 may be, for example, a device among computing systems (e.g., servers, datacenters, desktop computers), mobile computing device (e.g., laptops, cell phones, vehicles, etc.), Internet of Things devices, virtual reality (VR) systems, or augmented reality (AR) systems, etc. The host 110 may include at least one processor, such as central processing unit (CPU), graphic processing unit (GPU), digital signal processor (DSP), multimedia engine, and/or neural processing unit (NPU). The host 110 may be configured to couple and to communicate to the memories 150 (e.g., memories 150-1 to 150-4), via channels 190 (e.g., channels 190-1 to 190-4), in performing the computing functions, such as one of data processing, data communication, graphic display, camera, AR or VR rendering, image processing, neural processing, etc. For example, the memories 150 may store instructions or data for the host to perform the aforementioned computing functions.

The host 110 may include a memory controller 130, which may include controller PHY modules 134-1 to 134-4. Each of the controller PHY modules 134-1 to 134-4 may be coupled to a respective one of the memories 150-1 to 150-4, via respective channels 190-1 to 190-4. For ease of reference, read and write are referenced from a perspective of the host 110. For example, in a read operation, the host 110 may receive via the channel 190 data stored from the memories 150. In a write operation, the host 110 may provide via the channel 190 data to be written into the memories 150 for storage. The memory controller 130 may be configured to control various aspects, such as logic layers, of communications to and from the memories 150. The controller PHY modules 134 may be configured to control electrical characteristics (e.g., voltage levels, phase, delays, frequencies, etc.) of signals provided or received on the channel 190.

In some examples, the memories 150 may be LPDDR DRAM (e.g., LPDDR5). The host 110, the memories 150, and/or the channels 190 may operate according to an LPDDR (e.g., LPDDR5) specification. In some examples, each of the channels 190 may include 16 bits of data (e.g., 16 DQs). In some examples, each of the channels 190 may operate on 32 bits of data. In FIG. 1, four channels are shown. In some examples, the apparatus 100 may include 8 or 16 channels.

Figure 2:
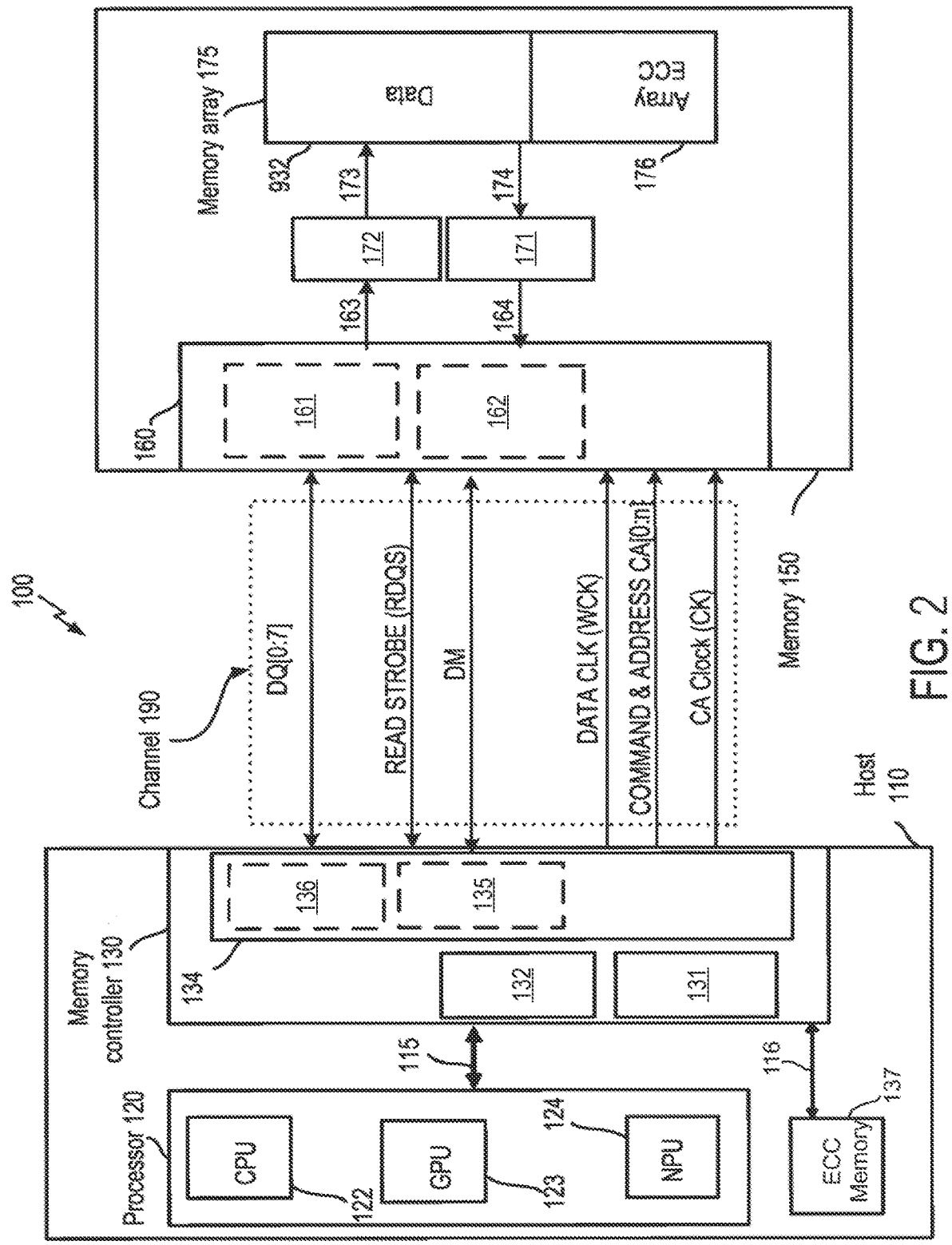
FIG. 2 illustrates another representation of the apparatus having the host, the memory, and the channel of FIG. 1.

The channel 190 is shown with greater specificity in FIG. 2. FIG. 2 illustrates another representation of the apparatus having the host 110, the memory 150, and the channel 190 of FIG. 1. The channels 190 may include a data clock (e.g., WCK) used in providing data to the respective memories 150 and a read data strobe (e.g., RDQS) used in receiving data from the respective memories 150, on a per byte basis. The channels 190 may further include a data mask (e.g., DM, sometimes referred to as DMI to indicate multiple functions performed by the signal connection) signaling used to mask certain part of data in a write operation. The channels 190 may further include command and address (e.g., CA[0:n]) and associated CA clock to provide commands (e.g., read or write commands) to the respective memories 150.

The host 110 may include at least one processor 120, which may include a CPU 122, a GPU 123, and/or an NPU 124. The host 110 may further include a memory controller 130 having a controller PHY module 134. The memory controller 130 may couple to the at least one processor 120 via a bus system 115 in performing the various computing functions. The host 110 may be configured to perform multiple ECC functions. To support a system ECC function, the host 110 may include a system ECC memory 137. The memory controller 130 may be coupled to the system ECC memory 137 via a bus system 116. The memory controller 130 may further include a system ECC decoder 131 and a system ECC encoder 132. The controller PHY modules 134 may include a link ECC decoder 135 and a link ECC encoder 136.

The apparatus 100 may implement the system ECC function to detect/correct errors arising in performing computing functions (e.g., operating with the at least one processor 120). The system ECC function might be useful for applications with low error tolerance, such as automotive applications. In some examples, the system ECC encoder 132 may generate system ECC to a block of data. The memory controller 130 may send the block of data to other modules, such as the at least one processor 120 and/or the memory 150, along with the system ECC. For example, the system ECC may be sent to the memory 150, which may store the system ECC in the same fashion as data and not perform ECC function based on the system ECC. In some examples, the memory controller 130 may receive a block of data and associated system ECC from, for example, the at least one processor 120 and/or the memory 150. The memory controller 130 may then detect/correct errors in the block of data using the system ECC.

The host 110 is coupled to the memory 150 via the channel 190, which is illustrated for a byte of data, DQ[0:7]. The channel 190 and signaling between the host 110 and the memory 150 may be implemented in accordance with the JEDEC DRAM specification (e.g., LPDDR5). As illustrated, the channel 190 includes signals connections of the DQs, a read data strobe (RDQS), a data mask (DM), a data clock (WCK), command and address (CA[0:n]), and command and address clock (CK). The host 110 may use the read data strobe RDQS to strobe (e.g., to clock) data in a read operation to receive the data on the DQs. The memory 150 may use the data mask DM to mask certain parts of the data from being written in a write operation. The memory 150 may use the data clock WCK to sample data on the DQs for a write operation. The memory 150 may use the command and address clock CK to clock (e.g., to receive) the CAs. A signal connection for each of the signaling may include a pin at the host 110, a pin at the memory 150, and a conductive trace or traces electrically connecting the pins.

The memory 150 may include a memory I/O module 160 (e.g., a PHY layer) configured to control electrical characteristics (e.g., voltage levels, phase, delays, frequencies, etc.) to provide or to receive signals on the channel 190. For example, memory I/O module 160 may be configured to capture (e.g., to sample) data, commands, and addresses from the host 110 via the channel 190 and to output data to the host 110 via the channel 190. The memory I/O module 160 may include a memory link ECC decoder 161 and a memory link ECC encoder 162.

The memory 150 may further include a memory array 175, which may include multiple memory cells (e.g., DRAM memory cells) that store data (e.g., information in general). The host 110 may read data stored in the memory array 175 and write data into the memory array 175, via the channel 190. Moreover, the memory array 175 may be configured to store ECCs, such as array ECCs, associated with the stored data. For example, a block of data (e.g., a word) may be associated with an array ECC 176 via a shared address. For example, reading (or writing into) the shared address at the memory array 175 may read out (or write into) both the block of data at the address and the array ECC 176 associated with that block of data.

The memory 150 may further include an array ECC decoder 171 and an array ECC encoder 172 to support an array ECC function. The array ECC decoder 171 may couple to the memory I/O module 160 via a node 164 and couple to the memory array 175 via a node 174. The array ECC encoder 172 may couple to the memory I/O module 160 via a node 163 and couples to the memory array 175 via a node 173. In some example, the array ECC function may detect/correct errors occurred to data stored in the memory array 175. As semiconductor process advances, memory cells are pushed to physical limits, and errors of stored data may arise, even if the data were not accessed. Accordingly, the array ECC function might be implemented to detect and/or correct those errors in storage. In some examples, the host 110 might not access or even aware of the array ECC function.

In some example, the array ECC function may be encoded (by the array ECC encoder 172) and decoded (by the array ECC decoder 171) within the memory 150. In a write operation, write data (e.g., received from the host 110 via the channel 190) may be provided to the array ECC encoder 172 via the node 163. The array ECC encoder 172 may generate an array ECC from the write data. The write data and the associated array ECC may be written into the memory array 175 via the node 173. The write data and the associated array ECC may be stored in the memory array 175 and share a common address. Thus, the write data and the associated array ECC may be accessed (read or write) via the shared common address.

In a read operation, data stored and associated array ECC stored in the memory array 175 may be provided to the array ECC decoder 171 via the node 174. The array ECC decoder 171 may detect/correct the data using the array ECC. The corrected data may be provided to the memory I/O module 160 via the node 164 as read data. The memory I/O module 160 may provide the read data to the host 110 via the channel 190. Thus, the array ECC function could be transparent to the host 110.

Further, the apparatus 100 may include a link ECC function to detect/correct errors arising from data transmissions in the channel 190. For example, in a write operation, the link ECC encoder 136 may generates a link ECC associated with a block of data to be written (e.g., write data) into the memory 150. The host 110 may provide the write data to the memory 150 via DQs signal connections and provide the link ECC to the memory 150 via a signal connection of the read data strobe RDQS. At the memory 150, the memory link ECC decoder 161 may use the link ECC to detect/correct errors in the write data. The link ECC might not be stored in the memory array 175, as the link ECC function is resolved at the memory I/O module 160.

In a read operation, the memory link ECC encoder 162 may receive data (e.g., read data) stored in the memory array 175 (e.g., via the node 174, the array ECC decoder 171, and the node 164) and generate the link ECC associated with the read data. The memory I/O module 160 may provide the read data to the host 110 via the signal connections of the DQs and provide the link ECC to the host 110 via the signal connection of the data mask DM. At the host 110, the link ECC decoder 135 may detect/correct errors in the read data using the link ECC.

As presented above, the apparatus 100 may operate multiple layers of ECC functions, each of the schemes may operate independent of others. Such multi-layered scheme create inefficiency. Certain aspects of the present disclosure provide a system ECC function that share signal connections with the link ECC function. In such fashion, system complexity and therefore, system cost, are reduced.

Figure 3:
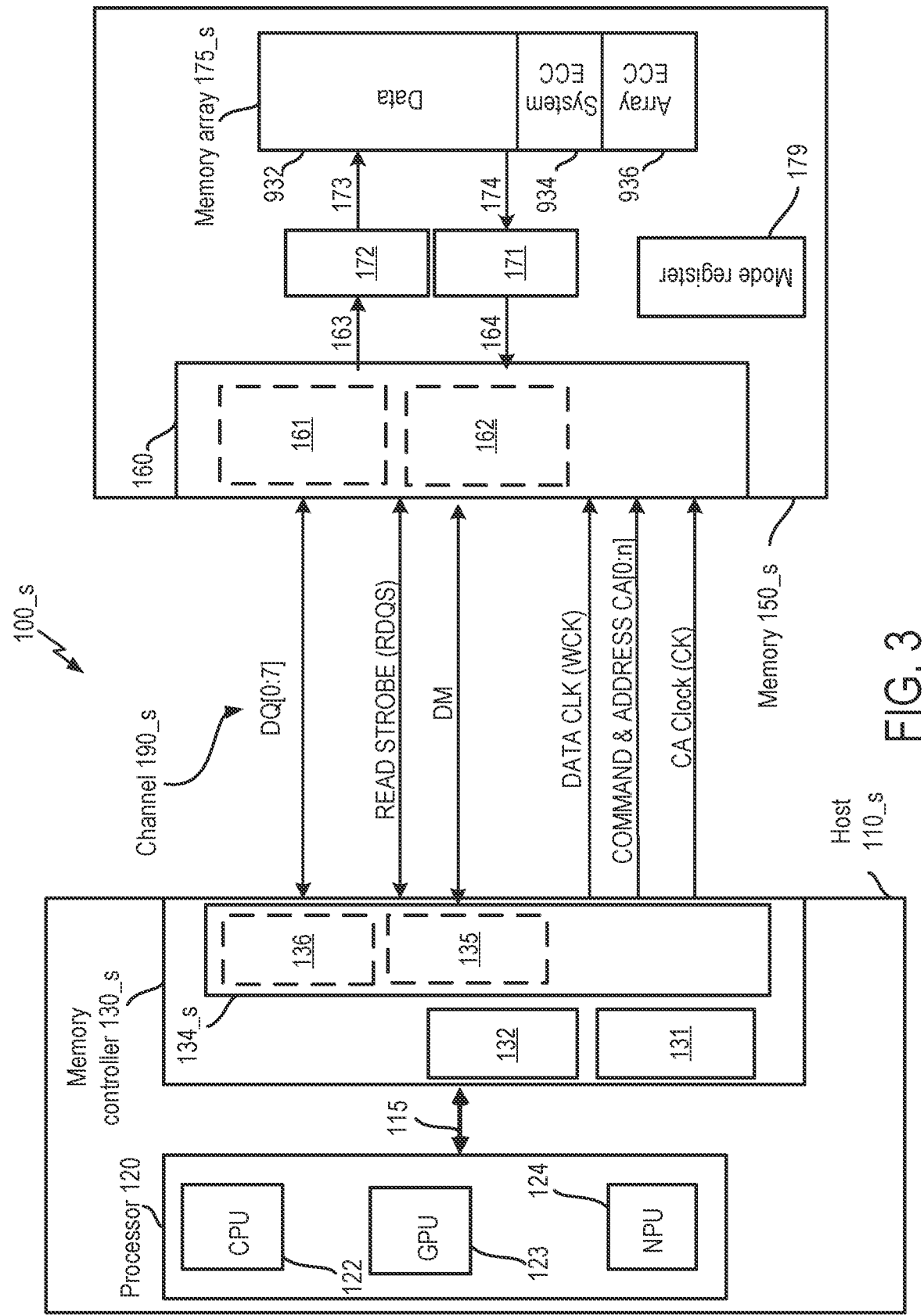
FIG. 3 illustrates another embodiment of the apparatus of FIG. 1, in accordance with certain aspects of the present disclosure.

FIG. 3 illustrates another embodiment of the apparatus 100 of FIG. 1, in accordance with certain aspects of the present disclosure. In FIG. 3, the apparatus 100_s is shown with various functional blocks and is configured to support a novel system ECC function. The apparatus 100_s may include a host 110_s configured to couple to and to communicate with a memory 150_s via a channel 190_s in performing various computing functions, such as one of data processing, data communication, graphic display, camera, AR or VR rendering, image processing, neural processing, etc. For example, the memory 150_s may store instructions or data for the host to perform the aforementioned computing functions.

The host 110_s may include at least one processor 120, which may include the CPU 122, the GPU 123, and/or the NPU 124 (see FIG. 2). The host 110_s may further include the memory controller 130_s having the controller PHY module 134_s. The memory controller 130_s may couple to the at least one processor 120 via a bus system 115 in performing the various computing functions. The controller PHY modules 134_s may be configured to control electrical characteristics (e.g., voltage levels, phase, delays, frequencies, etc.) of signals provided or received on the channel 190_s.

The host 110_s may be configured to implement a system ECC function utilizing the memory 150_s, via the channel 190_s. For example, via signal connections of the data mask DM and/or the read data strobe RDQS of the channel 190_s. For the system ECC function, the memory controller 130_s may include the system ECC decoder 131 and the system ECC encoder 132. In performing the computing functions, the system ECC encoder 132 of the memory controller 130_s may generate a system ECC code for a block of data and provide the block of data and the system ECC code to the at least one processor 120 via the bus system 115. The memory controller 130_s may receive the block of data and the associated system ECC code from the at least one processor 120 via the bus system 115. The system ECC decoder 131 may utilize the system ECC code to detect and/or correct error or errors in the block of data.

The memory 150_s may be configured to support the system ECC function. Since the apparatus 100_s utilizes the memory 150_s for the system ECC function, the system ECC memory 137 (FIG. 2) would not be required. The memory 150_s may include a memory array 175_s configured to store data in a first portion 932, system ECCs in a second portion 934, and array ECCs in a third portion 936. For example, a block of data may share a same address with an array ECC and/or a system ECC. The block of data and the array ECC or the system ECC may be accessed (read or written) using the same address. The memory 150_s may further include a mode register 179 configured to indicate (e.g., to the host 110_s) that the memory 150_s is configured to support the system ECC function.

The apparatus 100_s is further configured to utilize the memory 150_s to implement the system ECC function. In some examples, a system ECC function may support end-to-end ECC function. For example, the system ECC function may be implemented for data from the at least one processor 120 to the memory 150_s and/or data from the memory 150_s to the at least one processor 120. In some examples, the host 110_s may provide or receive the system ECC codes from the memory 150_s via signal connections of the channel 190_s, the signal connections being shared with link ECC functions.

The apparatus 100_s may support the system ECC function and a link ECC function (e.g., at different times or different operations). The memory I/O module 160 may optionally include the memory link ECC decoder 161 and the memory link ECC encoder 162 (see FIG. 2). The controller PHY modules 134_s may optionally include the link ECC decoder 135 and the link ECC encoder 136. The link ECC function may utilize the data mask DM signal connection to transport a link ECC, from the memory 150_s to the host 110_s, in a read operation and the read strobe RDQS signal connection to transport the link ECC, from the host 110_s to the memory 150_s, in a read operation.

Figure 4A:
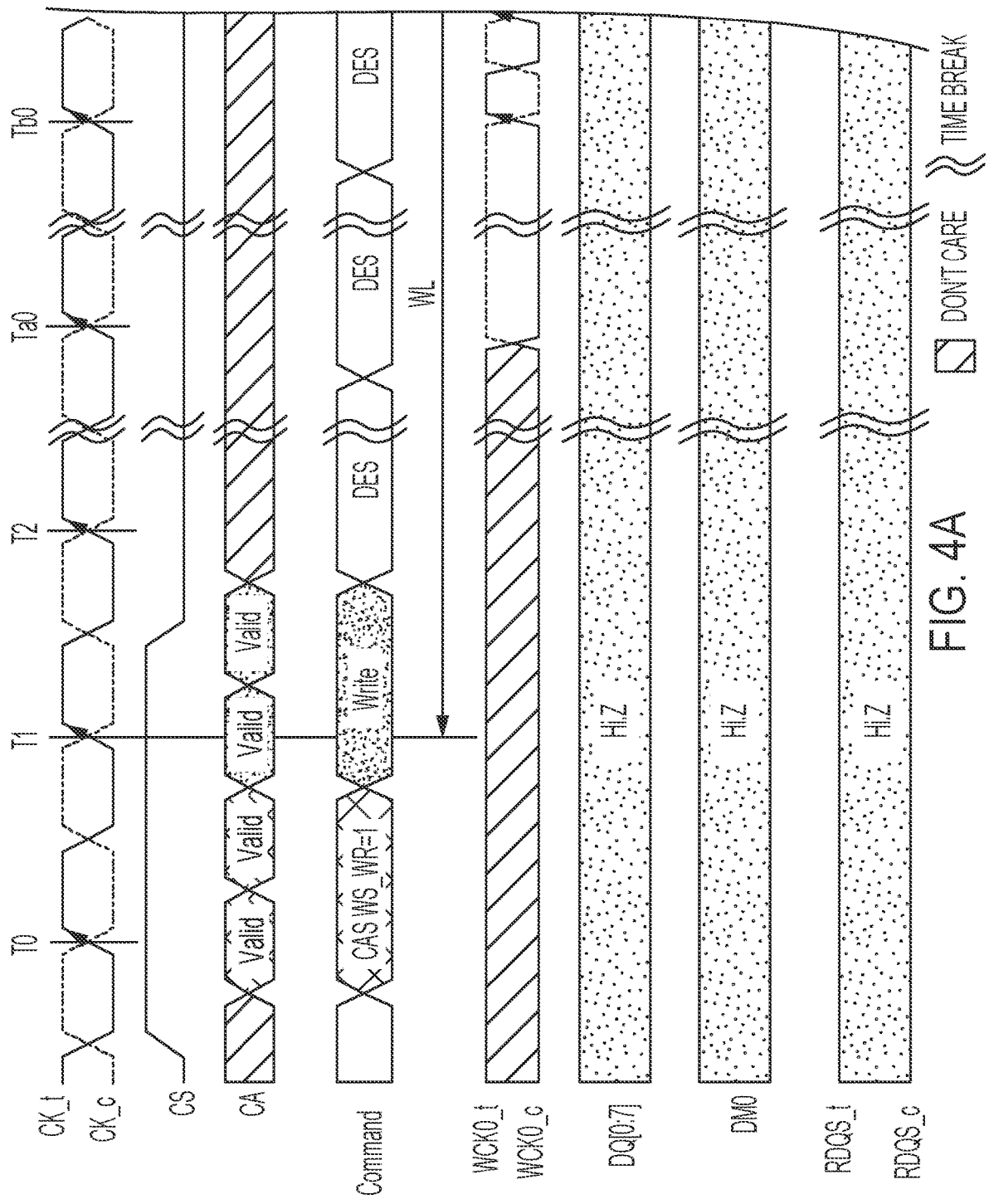
FIGS. 4A and 4B illustrate waveforms of a system error-correction code (ECC) function of the apparatus of FIG. 3 in a write operation, in accordance with certain aspects of the present disclosure.
Figure 4B:
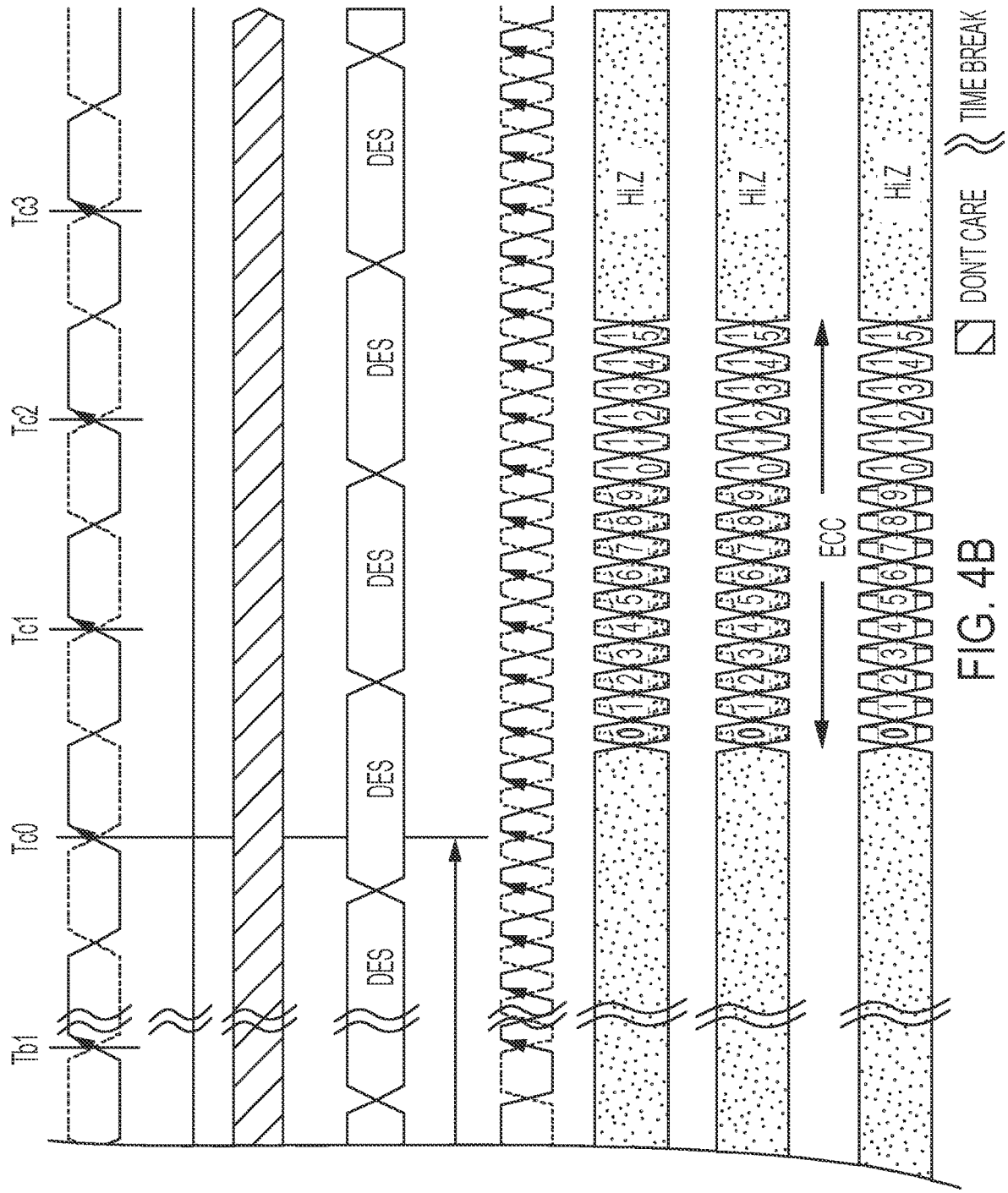

FIGS. 4A and 4B illustrate waveforms of a system ECC function of the apparatus 100_s of FIG. 3 in a write operation, in accordance with certain aspects of the present disclosure. The command and address clock, CK, may be a differential signal having CK_t and CK_c signal connections. The data clock WCK may be a differential signal having WCK0_t and WCK0_c signal connections. The read data strobe RDQS may be a differential signal having RDQS_t and RDQS_c signal connections. The data mask is labeled DM0 to indicate that DM0 corresponds to a lower byte of DQs (DQ[0:7]). At T0 (rising edge of CK_c and falling edge of CK_t), a CAS command may be provided by the host 110_s for a write operation to the memory 150_s. At T1, a write command may be provided by the host 110_s to the memory 150_s.

After a time period write latency (WL), the host 110_s may toggle the data clock WCK0_t and WCK0_c to provide the memory 150_s with clocking for receiving data for write, on the DQ signal connections. At Tc0-Tc2, the memory 150_s may receive 16 bytes of data serially, on each of the DQ[0:7] signal connections and clocked by the data clock WCK0_t and WCK0_c. The memory 150_s may receive 16 bits of the data mask DM0 serially (e.g., based on the data clock WCK0_t and WCK0_c) to mask certain portions of the received data from the write operation. In some examples, the 16 bytes of data and 16 bits of the data mask DM0 may be received by the memory 150_s, with each bit of the data mask DM0 masking a corresponding byte of the received data.

At Tc0-Tc2, the memory 150_s may receive, for example, 16 bits of ECC on the RDQS_t signal connection, based on the data clock WCK0_t and WCK0_c. In a read operation, the RDQS_t signal connection may be configured to provide a read data strobe (RDQS) from the memory 150_s to the host 110_s. In some examples, the ECC received by the memory 150_s may be link ECC. Referring to FIG. 3, the memory link ECC decoder 161 may utilize the received 16 bits of ECC to detect and/or correct errors in the received 16 bytes of data. As link ECC, the received 16 bits of ECC might not be stored in the memory array 175_s (see FIG. 3).

In some examples, the received ECC might be system ECC. The apparatus 100_s may be configured to operate the link ECC function and the system ECC function at different times/configurations, via shared signal connections (e.g., the data mask DM and/or the read data strobe RDQS). Moreover, the apparatus 100_s may be further configured to perform an array ECC function. Referring to FIG. 3, the memory 150_s may be configured to provide the 16 bytes of data and the 16 bits of system ECC to the array ECC encoder 172, via the node 163. The array ECC encoder 172 may be configured to generate an array ECC based on the 16 bytes of data and/or the 16 bits of system ECC and provide the data, the system ECC, and the array ECC to the memory array 175_s for storage (via the node 173). The memory array 175_s may be configured to store (e.g., write into) the received data, the received system ECC, and the array ECC from the array ECC encoder 172.

Figure 5A:
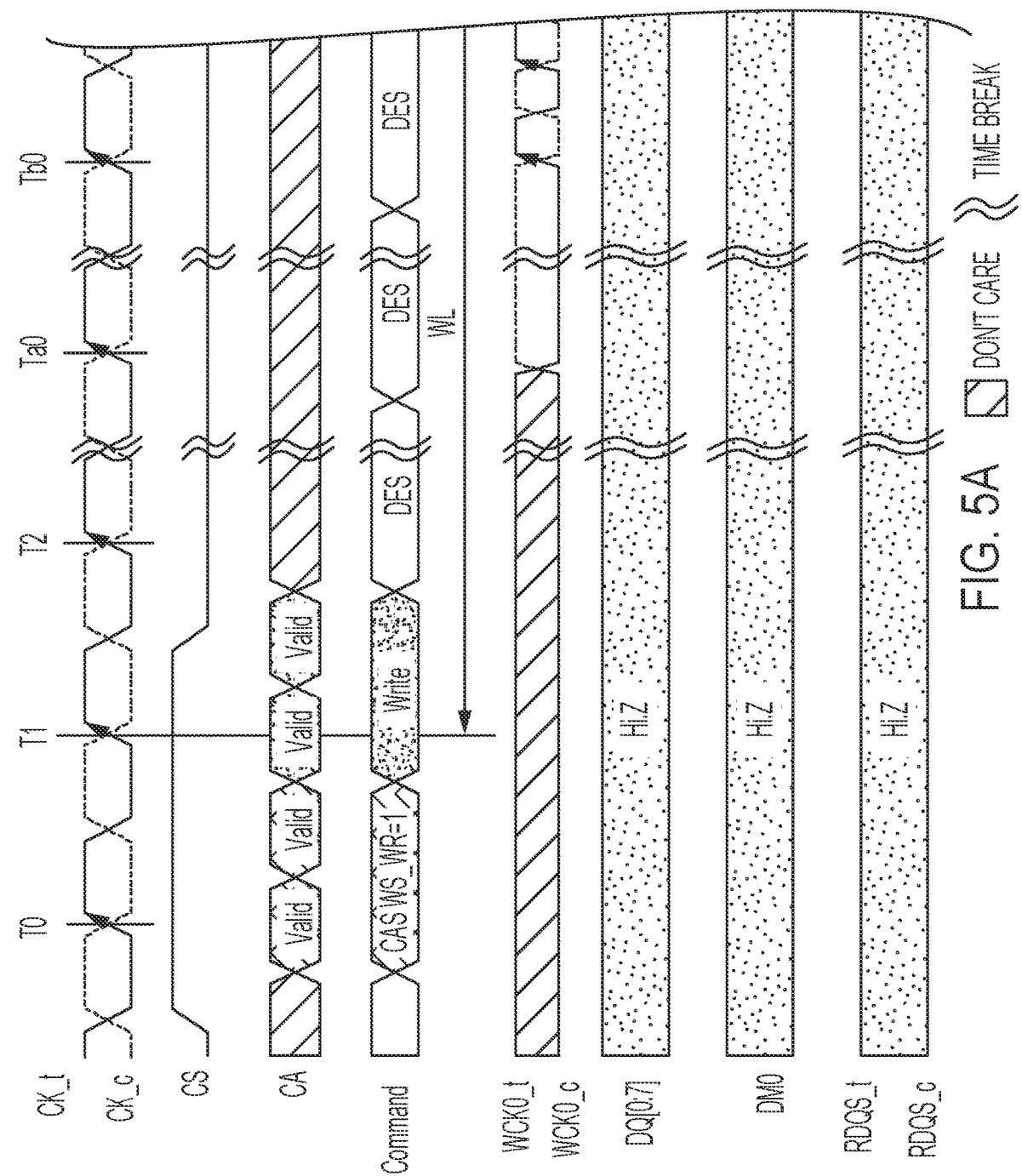
FIGS. 5A and 5B illustrate waveforms of another system ECC function of the apparatus of FIG. 3 in a write operation, in accordance with certain aspects of the present disclosure.
Figure 5B:
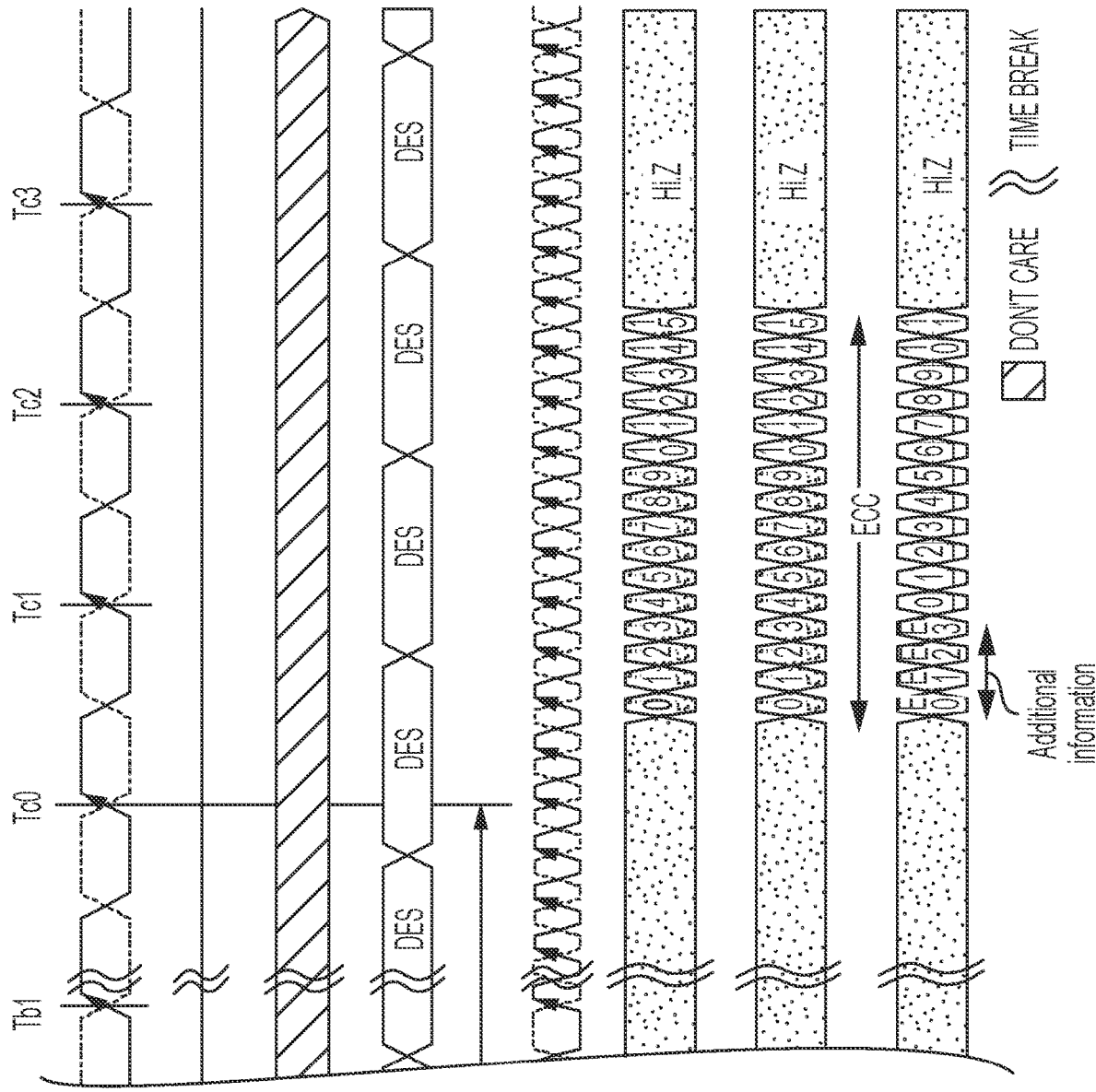

FIGS. 5A and 5B illustrate waveforms of another system ECC function of the apparatus 100_s of FIG. 3 in a write operation, in accordance with certain aspects of the present disclosure. In some examples, different ECC encoding/decoding protocols may require fewer bits of ECCs for the 16 bytes of data in the write operation. In this example, 12 bits of ECC are provided to the memory 150_s via the signal connection of the read data strobe RDQS_t. Further, the host 110_s may be configured to provide 4 bits of additional data information of the data in the write operation on the signal connection of the read data strobe RDQS_t. For example, the additional data information may indicate types of the data for write or usage information (e.g., data attributes, cacheable or not cacheable, etc.).

Figure 6A:
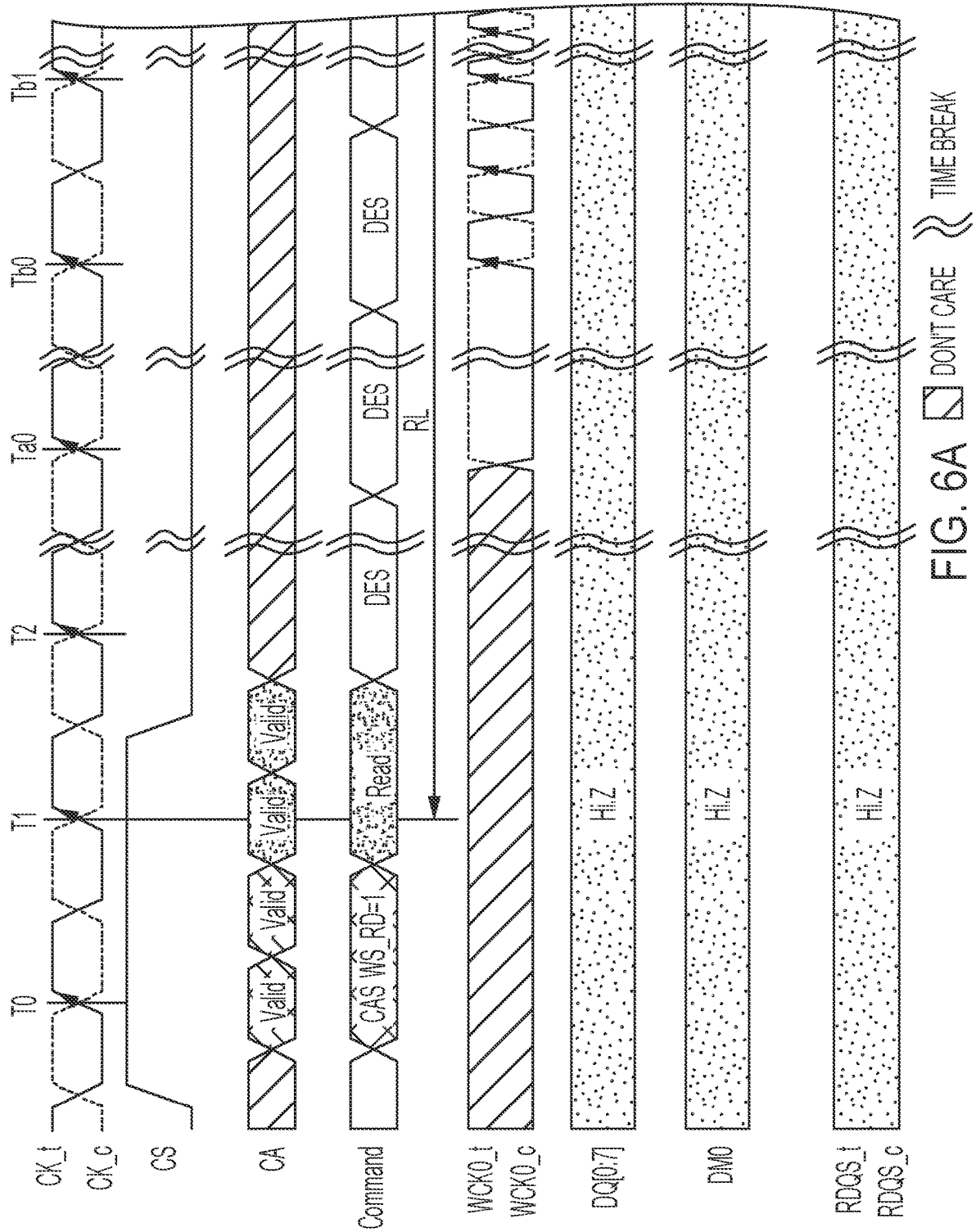

FIGS. 6A and 6B illustrate waveforms of the system ECC function of the apparatus 100_s of FIG. 3 in a read operation, in accordance with certain aspects of the present disclosure. The command and address clock, CK, may be a differential signal having CK_t and CK_c signal connections. The data clock WCK may be a differential signal having WCK0_t and WCK0_c signal connections. The read data strobe RDQS may be a differential signal having RDQS_t and RDQS_c signal connections. The data mask is labeled DM0 to indicate that DM0 corresponds to a lower byte of DQs (DQ[0:7]). At T0 (rising edge of CK_c and falling edge of CK_t), a CAS command may be provided by the host 110_s for a read operation to the memory 150_s. At T1, a read command may be provided by the host 110_s to the memory 150_s.

After a time period read latency (RL), the memory 150_s may toggle the read data strobe RDQS to provide the host 110_s with clocking to receive data for the read operation, on the DQ signal connections. At Tc0-Tc2, the host 110_s may receive 16 bytes of data serially, on each of the DQ[0:7] signal connections and clocked by the read data strobe RDQS_t and RDQS_c. Thus, in the example, 16 bytes of data are received by the host 110_s.

At Tc0-Tc2, the host 110_s may receive, for example, 16 bits of ECC on the data mask DM0 signal connection, based on (e.g., clocked by) the read data strobe RDQS_t and RDQS_c. In a write operation, the DM signal connection may be configured to provide a data mask from the host 110_s to the memory 150_s. In some examples, the ECC received by the host 110_s may be a link ECC. Referring to FIG. 3, the memory link ECC encoder 162 may generate the 16 bits of link ECC based on the 16 bytes of data stored in memory array 175_s (and provided to the host 110_s in the read operation). As link ECC, the 16 bits of ECC might not be stored in the memory array 175_s (see FIG. 3).

In some examples, the ECC received by the host 110_s may be a system ECC. The apparatus 100_s may be configured to operate the link ECC and the system ECC at different times/configurations, via shared signal connections (e.g., the data mask DM and/or the read data strobe RDQS). Referring to FIG. 3, the memory 150_s may be configured to provide the 16 bytes of data, associated array ECC, and associated system ECC (all stored in the memory array 175_s) to the array ECC decoder 171, via the node 174. The array ECC decoder 171 may be configured to detect/correct errors in the 16 bytes of data and/or the system ECC, based on the array ECC. The array ECC decoder 171 may be configured to output the corrected 16 bytes of data and/or the system ECC to the memory I/O module 160 and to the host 110_s in the read operation.

Figure 7A:
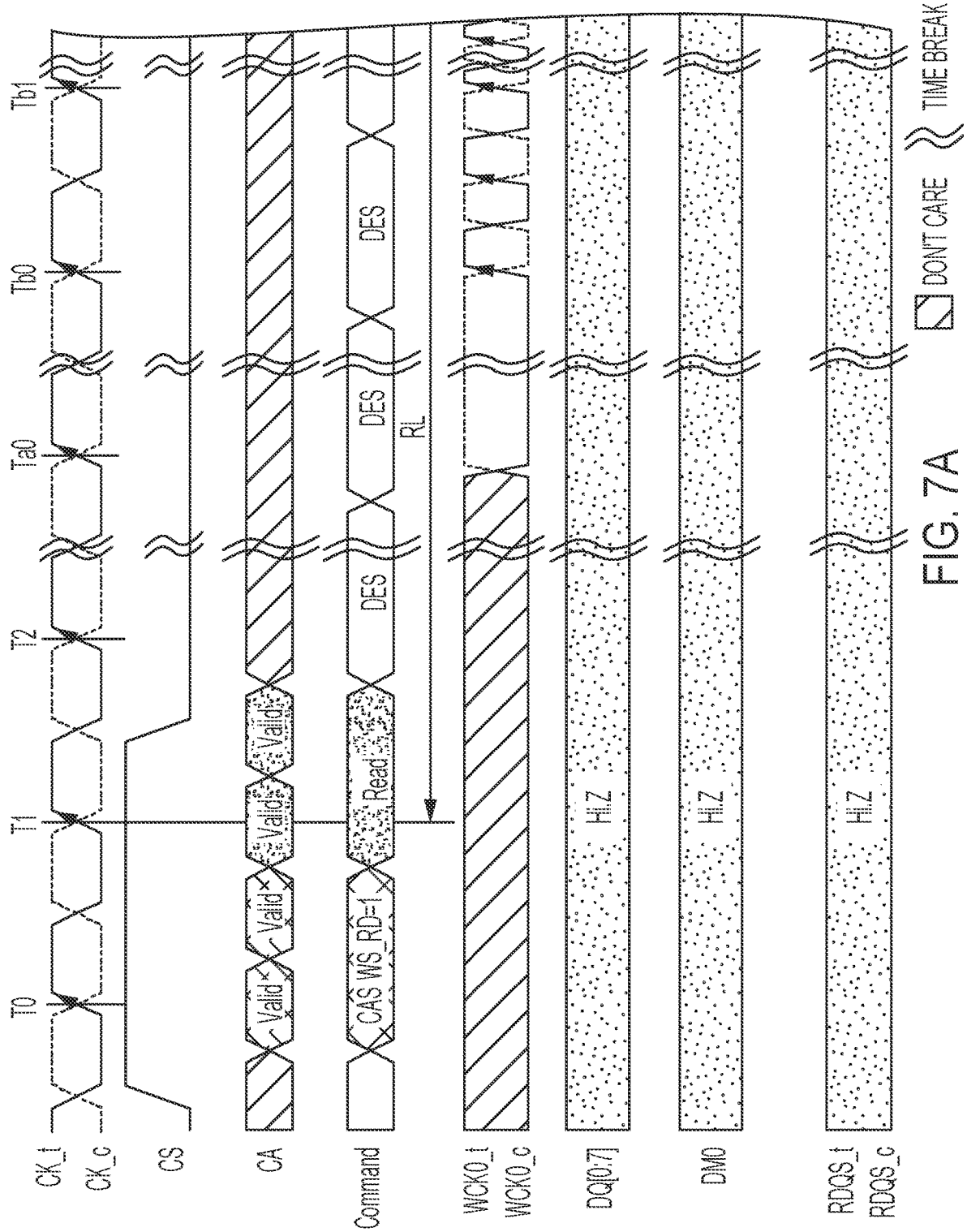
FIGS. 7A and 7B illustrate waveforms of another system ECC function of the apparatus of FIG. 3 in a read operation, in accordance with certain aspects of the present disclosure.
Figure 7B:
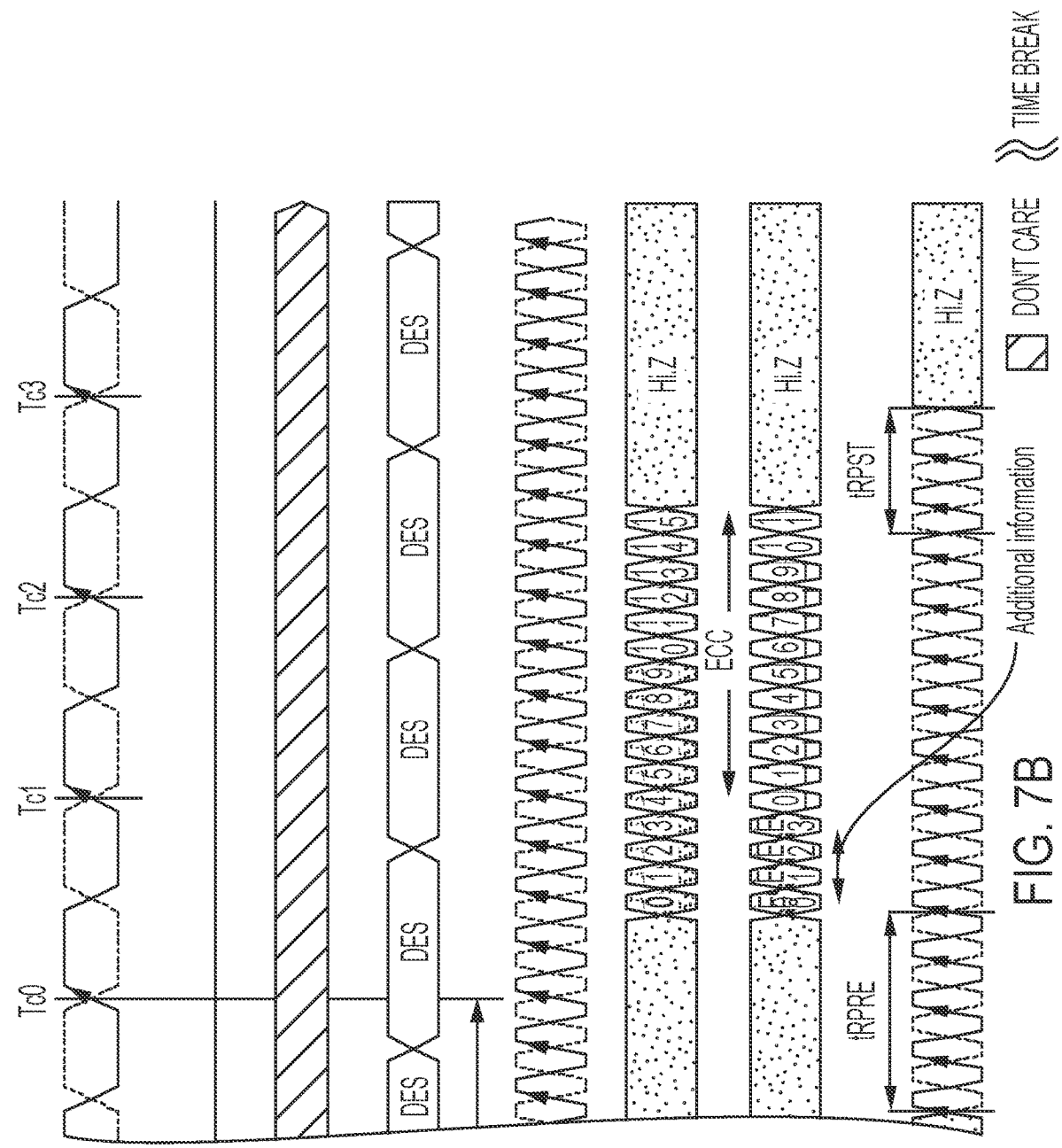

FIGS. 7A and 7B illustrate waveforms of another system ECC function of the apparatus 100_s of FIG. 3 in a read operation, in accordance with certain aspects of the present disclosure. In some examples, different ECC encoding/decoding protocols may require fewer bits for the 16 bytes of data outputted by the memory 150_s in the read operation. In this example, 12 bits of ECC are provided to the host 110_s via the signal connection of the data mask DM0. Further, the memory 150_s may be configured to provide 4 bits of additional data information on the signal connection of the data mask DM0. For example, the additional data information may indicate types of the data for write or usage information (e.g., cacheable or not cacheable). For example, the additional information may be provided by the host 110_s and associated with the data in the read operation and stored in the memory 150_s, prior to the read operation.

In some examples, the additional information may include additional ECC information. The additional ECC information may be based on, for example, an array ECC or information on the array ECC. For example, the additional ECC information may indicate a number of times the data in the read operation has been corrected by the array ECC or includes errors not corrected by the array ECC. In some examples, the host 110_s may utilize the additional ECC information and the system ECC to further detect/correct errors in the data received in the read operation, instead of using system ECC alone.

Figure 8:
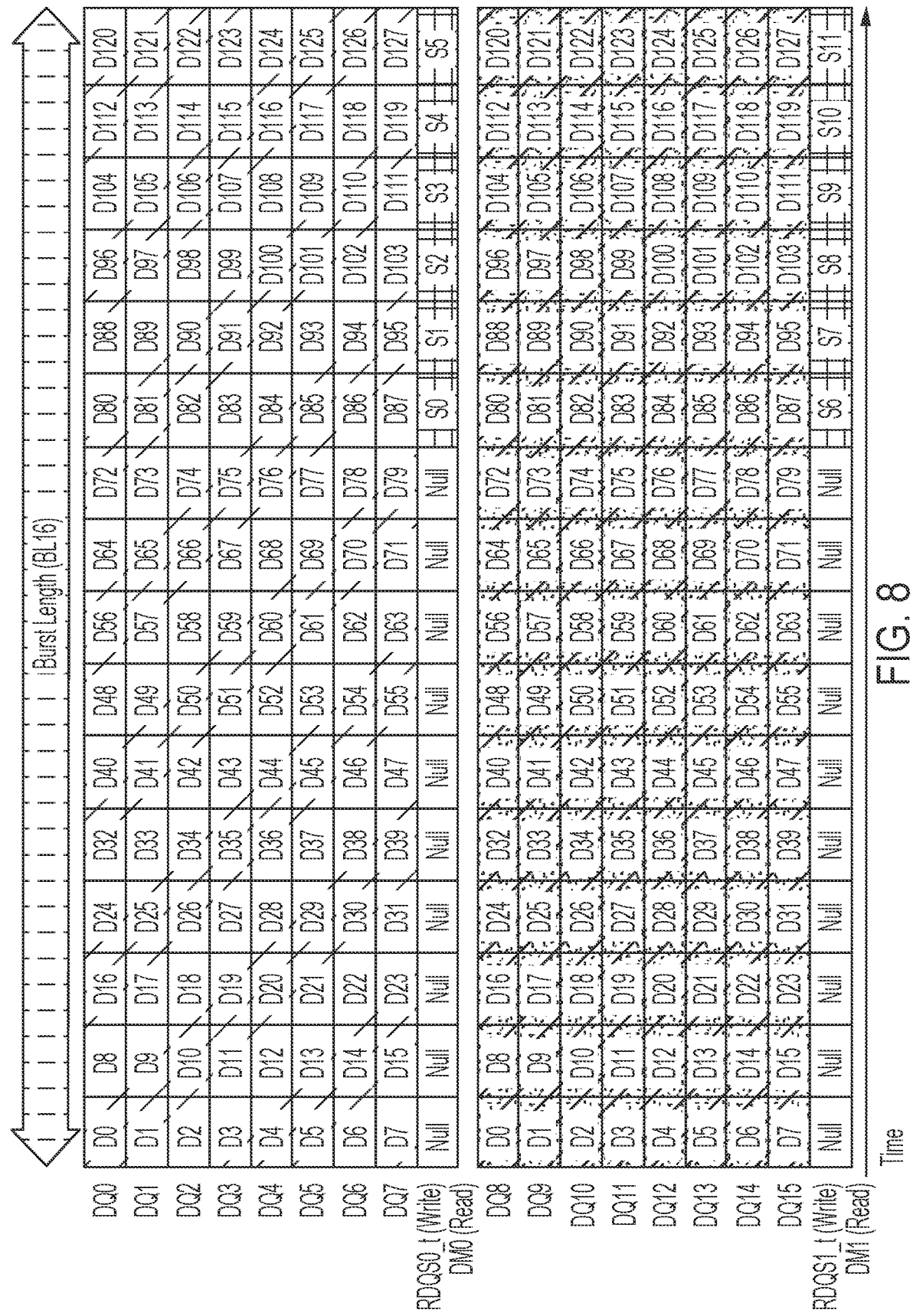
FIG. 8 illustrates data structures of another embodiment of the apparatus of FIG. 3, in accordance with certain aspects of the present disclosure.

FIG. 8 illustrates data read or written of another embodiment of the apparatus 100_s of FIG. 3, in accordance with certain aspects of the present disclosure. In some examples, the channel 190_s may be ×16 (two bytes of DQs; FIG. 3 illustrates only a lower byte of DQs for clarity). FIG. 8 illustrates a read/write of burst length 16. Thus, a total of 32 bytes of data are read or written in the figure. A corresponding data mask DM (DM0 and DM1) and read data strobe RDQS_t (RDQS0_t and RDQS1_t) may be provided for each byte of DQs. For example, a data mask DM0 may be provided for DQ[0:7], and a data mask DM1 may be provided for DQ[8:15] to mask certain portions of write data in a write operation. A read data strobe RDQS0_t may be provided for DQ[0:7], and a read data strobe RDQS1_t may be provided for DQ[8:15] to provide clocking of read data in a read operation.

In some examples, the system ECC function may be implemented and/or distributed over the byte boundary, in order to improve floor planning in the memory 150_s. For example, in some ECC functions, a 12-bit ECC might be sufficient for the 32 bytes of data read or written. The 12 bits of ECC may be transferred by the data mask DM0 and DM1 in a read operation (provided by the memory 150_s to the host 110_s) and transferred by the read data strobe RDQS0_t and RDQS1_t in a write operation (provided by the host 110_s to the memory 150_s). As illustrated in FIG. 8, 6 bits of the ECC may be transferred in the last six (6) cycle of the burst or the first 6 cycles of the burst for each byte of data read or written. For the remaining 10 cycles, the data mask DM0 and DM1 and/or the read data strobe RDQS0_t and RDQS1_t may be utilized to transfer additional information, such as additional ECC information and/or additional data information (see FIGS. 5 and 7).

FIG. 9 illustrates an embodiment of the mode register 179 of the apparatus 100_s of FIG. 3, in accordance with certain aspects of the present disclosure. As illustrated at 910, the mode register 179 may include 8 bits operands OP[7:0], among which OP[7:4] may be reserved. OP[3:0] may indicate System ECC Support and Configuration (SESC). As illustrated at 920, the mode register 179 may be read only. For example, the memory 150_s (e.g., by a manufacturer thereof) may set the mode register 179 regarding SESC, independent of the host 110_s. The host 110_s may be configured to read the mode register 179 to learn, for example, whether the memory 150_s supports the system ECC, sizes of the system ECCs, and/or additional information transferred in the system ECC (see FIGS. 5 and 7). However, the host 110_s might not write into the mode register 179.

For example, the mode register 179 may indicate whether the system ECC is supported. For example, OP[3:0] at 0000 may indicate that the system ECC is not supported. OP[3:0] may further indicate a size of the system ECC and a size of the additional information (e.g., on per number of DQs and/or per number of burst lengths basis). For example, OP[3:0] at 0010 may indicate 24 bits of ECC and 8 bits of additional information, per ×16 channel and burst length (BL) of 16. The additional information may be additional data information and/or additional ECC information. For example, the additional ECC information may be array ECC decode information (AED). For example, the AED may be an array ECC of read or write data and/or a system ECC thereof. In some examples, the AED may be information related to the array ECC function, such as a number of times the read or write data has been corrected by the array ECC function or whether the read or right data include errors not corrected by the array ECC function.

Figure 10:
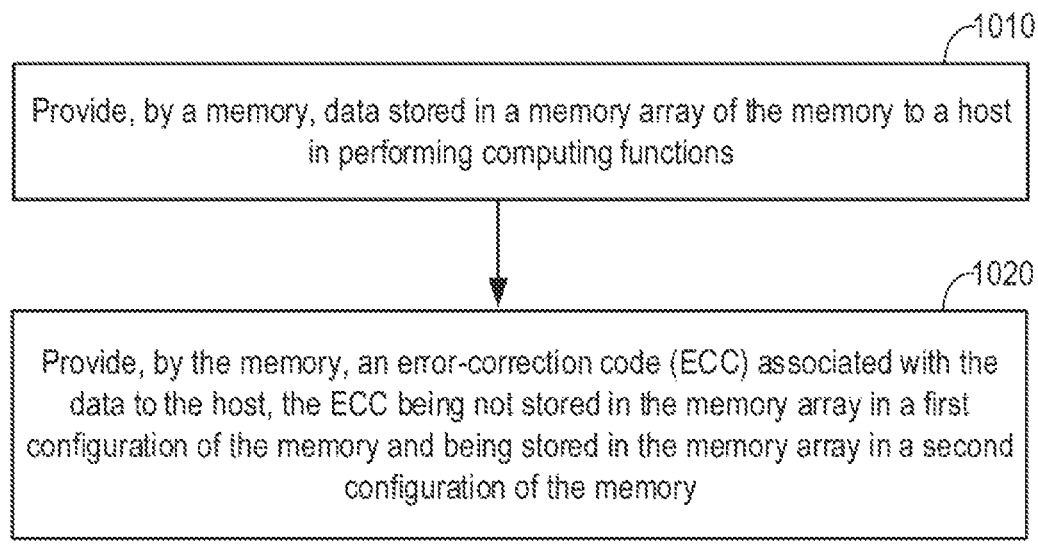
FIG. 10 illustrates a method to operate a system ECC function for the apparatus of FIG. 3, in accordance with certain aspects of the present disclosure.

FIG. 10 illustrates a method to operate system ECC function for the apparatus 100_s of FIG. 3, in accordance with certain aspects of the present disclosure. The operations of FIG. 10 may be implemented by, for example, the apparatus 100 or 100_s presented with FIGS. 1 and 3-9. The arrows indicate certain relationships among the operations, but not necessarily sequential relationships. At 1010, data stored in a memory array of a memory are provided by the memory to a host in performing computing functions. At 1020, an error-correction code (ECC) associated with the data is provided by the memory to the host, the ECC being not stored in the memory array in a first configuration of the memory and being stored in the memory array in a second configuration of the memory.

For example, the apparatus 100_s may include the memory 150_s configured to communicate with the host 110_s. The memory 150_s may include the memory array 175_s, the memory array 175_s being configured to store data (e.g., read data provided to the host 110_s or write data received from the host 110_s). The memory 150_s may be configured to provide the data stored in the memory array 175_s to the host 110_s in performing various computing functions and configured to provide an error-correction code (ECC) associated with the data to the host 110_s. The ECC might not be stored in the memory array in a first configuration of the memory 150_s (e.g., the memory 150_s being configured for the link ECC function) and might be stored in the memory array 175_s in a second configuration of the memory (e.g., the memory 150_s being configured for the system ECC function).

The first configuration and the second configuration of the memory 150_s may be based on at least one mode register 179 of the memory 150_s, the at least one mode register 179 being accessible separately from the memory array 175_s. For example, the at least one mode register 179 may indicate that the memory 150_s supports or enables the second configuration (e.g., the system ECC function). Moreover, the at least one mode register 179 may be accessed separately from the memory array 175_s. For example, the at least one mode register 179 may be read (or written) by a mode register read (or mode register write) command not shared with commands to read or write the memory array 175_s.

The memory 150_s may be further configured to provide the ECC (e.g., a link ECC or a system ECC) to the host 110_s for the first configuration and for the second configuration via a read ECC signal connection. For example, the read ECC signal connection may include the data mask DM configured to provide a data mask from the host 110_s to the memory 150_s in a write operation. In some examples, the first configuration may include a link ECC function, and the second configuration includes a system ECC function.

The at least one mode register 179 may be configurable to indicate the second configuration is enabled (see FIG. 9). For example, the memory 150_s may configure the at least one mode register 179 to indicate that the system ECC is enabled/supported. The at least one mode register 179 may be further configured (e.g., by the memory 150_s) to indicate a size of the ECC in the second configuration. The at least one mode register 179 may be further configurable to indicate the memory 150_s to provide additional ECC information or additional data information associated with the data (read data or write data) via the read ECC signal connection.

The additional ECC information may be based on an array ECC (the array ECC may be stored in the memory array 175_s; see FIG. 3). The memory 150_s may be further configured to generate the array ECC based on the data (e.g., read data) before storing the data in the memory array 175_s (e.g., by the array ECC encoder 172). The memory 150_s may be further configured to detect or correct error in the data (e.g., read data) stored in the memory array 175_s based on the array ECC (e.g., by the array ECC decoder 171). In some examples, the at least one mode register 179 may be readable but not writable by the host 110_s (see FIG. 9).

Figure 11:
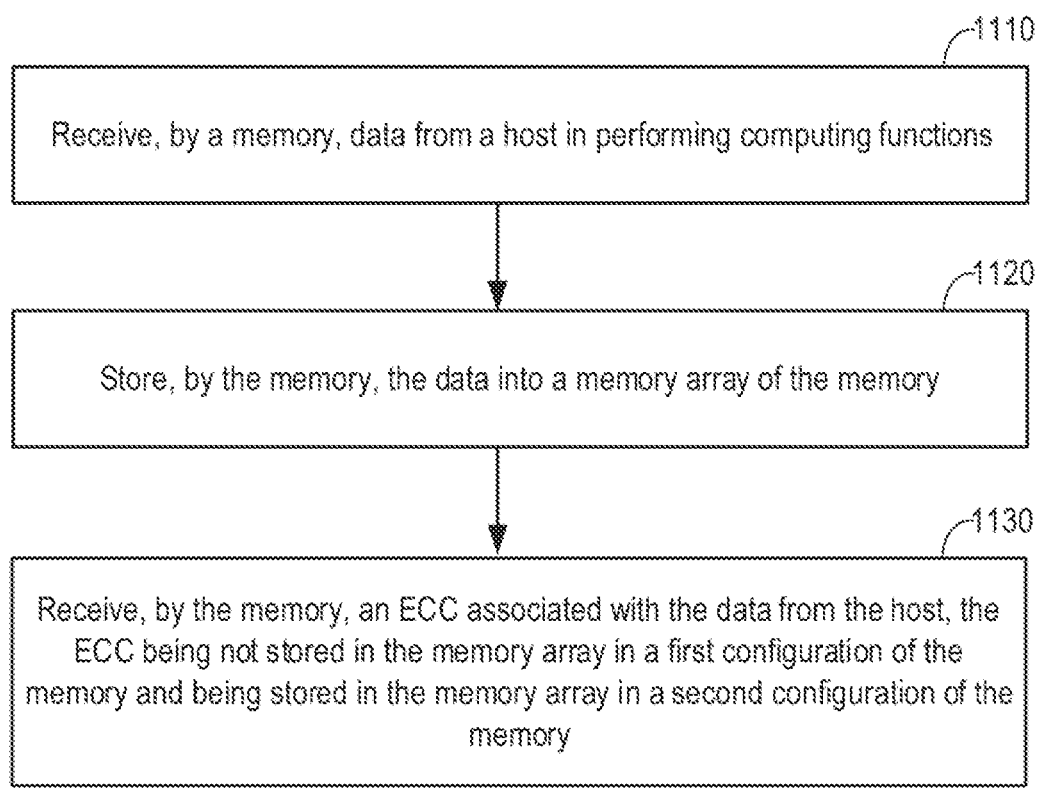
FIG. 11 illustrates another method to operate a system ECC function for the apparatus of FIG. 3, in accordance with certain aspects of the present disclosure.

FIG. 11 illustrates another method to operate a system ECC function for the apparatus 100_s of FIG. 3, in accordance with certain aspects of the present disclosure. The operations of FIG. 11 may be implemented by, for example, the apparatus 100 or 100_s presented with FIGS. 1 and 3-9. The arrows indicate certain relationships among the operations, but not necessarily sequential relationships. At 1110, data are received from a host by a memory in performing computing functions. At 1120, the data are stored by the memory into a memory array. At 1130, an ECC associated with the data from the host is received by the memory, the ECC being not stored in the memory array in a first configuration of the memory and being stored in the memory array in a second configuration of the memory.

For example, the memory 150_s may be configured to receive the data (e.g., write data) from the host 110_s in performing computing functions, to store or write the data into the memory array, and to receive the ECC (e.g., link ECC or system ECC) from the host 110_s. The memory may be further configured to receive the ECC from the host 110_s for the first configuration (e.g., configuration for supporting or implementing the link ECC function) and for the second configuration (e.g., configuration for supporting or implementing the system ECC function) via a write ECC signal connection (e.g., read data strobe RDQS). The write ECC signal connection may be further configured to provide a data strobe from the memory 150_s to the host 110_s in a read operation.

Referring to the apparatus 100 or 100_s, the at least one mode register 179 may be configurable to indicate a size of the ECC in the second configuration. The at least one mode register 179 may be further configurable to indicate the memory 150_s to provide additional ECC information associated with the data (e.g., read data) in the read operation via the read ECC signal connection (e.g., data mask DM) or to receive additional data information associated with the data (e.g., write data) in the write operation via the write ECC signal connection (e.g., read data strobe RDQS).

The additional ECC information provided by the memory 150_s may be based on an array ECC. The array ECC may be stored in the memory array 175_s. The memory 150_s may be further configured to generate the array ECC based on the data (e.g., received write data) before storing the data in the memory array 175_s and to detect or correct error in the data (e.g., read data) stored in the memory array based on the array ECC. In some examples, the at least one mode register 179 may be readable but not writable by the host 110_s.

For example, the memory 150_s may be configured to communicate with the host 110_s. The memory 150_s may include the memory array 175_s configured to store data. The memory 150 may be further configured to receive data (e.g., write data) from the host 110_s in performing computing functions, to write the data into the memory array 175_s, and to receive an ECC (e.g., link ECC or system ECC) associated with the data from the host 110_s. The ECC might not be stored in the memory array 175_s in a first configuration of the memory 150_s (e.g., configuration for supporting or implementing the link ECC function) and might be stored in the memory array 175_s in a second configuration of the memory 150_s (e.g., configuration for supporting or implementing the system ECC function). The first configuration and the second configuration may be based on at least one mode register 179 of the memory 150_s, the at least one mode register 179 might be accessible separately from the memory array 175_s.

The memory 150_s may be further configured to receive the ECC from the host 110_s for the first configuration and for the second configuration via a write ECC signal connection (e.g., read data strobe RDQS). The write ECC signal connection may be configured to provide a data strobe from the memory 150_s to the host 110_s in a read operation. The first configuration may include a link ECC. The second configuration may include a system ECC.

The at least one mode register 179 may be configurable to indicate the second configuration being enabled (see FIG. 9). The at least one mode register 179 may be configurable to indicate a size of the ECC. The at least one mode register 179 may be readable but not writable by the host 110_s. The at least one mode register 179 may be further configurable to indicate the memory 150_s to receive additional data information associated with the data via the write ECC signal connection.

Figure 12:
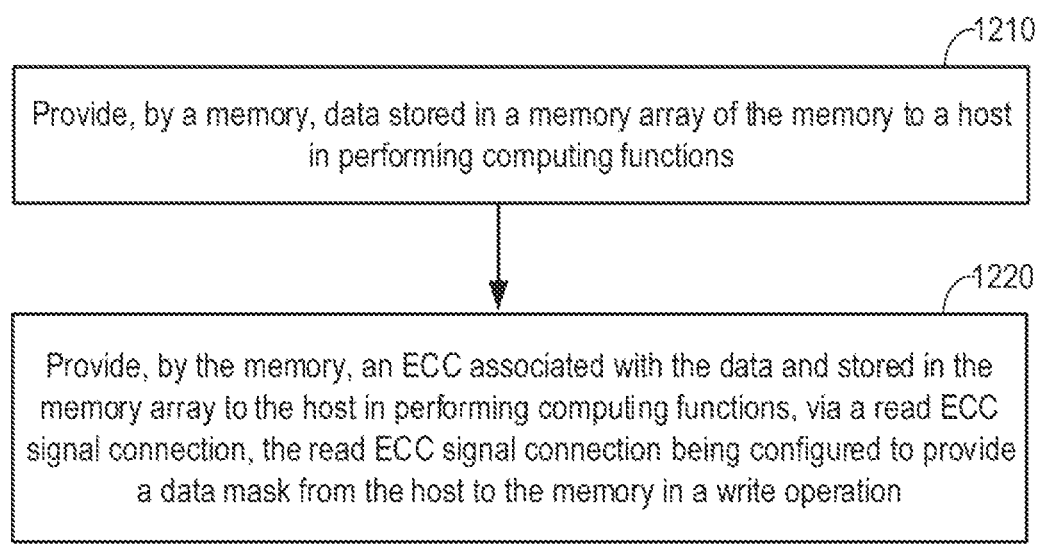
FIG. 12 illustrates another method to operate a system ECC function for the apparatus of FIG. 3, in accordance with certain aspects of the present disclosure.

FIG. 12 illustrates another method to operate a system ECC function for the apparatus 100_s of FIG. 3, in accordance with certain aspects of the present disclosure. The operations of FIG. 12 may be implemented by, for example, the apparatus 100 or 100_s presented with FIGS. 1 and 3-9. The arrows indicate certain relationships among the operations, but not necessarily sequential relationships. At 1210, data stored in a memory array of a memory are provided by the memory to a host in performing computing functions. At 1220, an ECC associated with the data and stored in the memory array is provided by the memory to the host in performing computing functions, via a read ECC signal connection. The read ECC signal connection is configured to provide a data mask from the host to the memory in a write operation.

For example, the memory 150_s may include the memory array 175_s configured to store data and an ECC associated with the data. The memory 150_s may be configured to provide the data (e.g., read data) and the ECC stored in the memory array 175_s to the host 110_s in performing computing functions, via a read ECC signal connection (e.g., data mask DM). The read ECC signal connection may be configured to provide a data mask from the host 110_s to the memory 150_s in a write operation. The at least one mode register 179 may be configurable to indicate enabling to provide the ECC stored in the memory 150_s to the host 110_s via the read ECC signal connection. The at least one mode register 179 may be further configurable to indicate the memory 150_s to provide additional ECC information via the read ECC signal connection.

Figure 13:
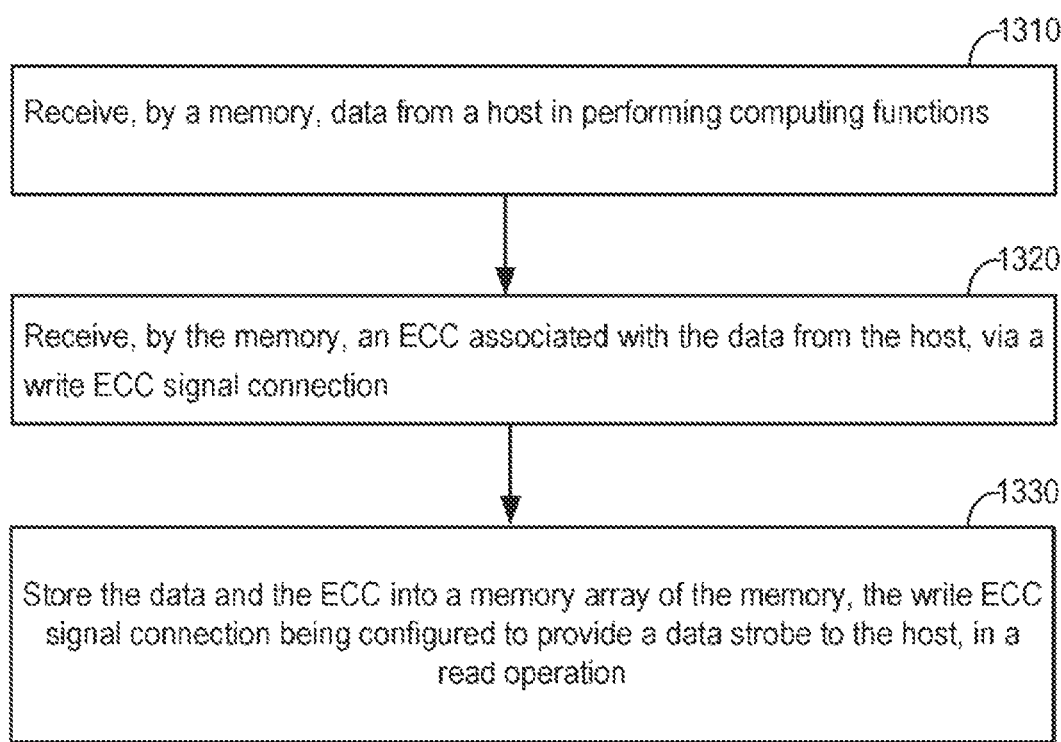
FIG. 13 illustrates another method to operate a system ECC function for the apparatus of FIG. 3, in accordance with certain aspects of the present disclosure.

FIG. 13 illustrates another method to operate a system ECC function for the apparatus 100_s of FIG. 3, in accordance with certain aspects of the present disclosure. The operations of FIG. 13 may be implemented by, for example, the apparatus 100 or 100_s presented with FIGS. 1 and 3-9. The arrows indicate certain relationships among the operations, but not necessarily sequential relationships. At 1310, data are received by a memory from a host in performing computing functions. At 1320, an ECC associated with the data is received from the host, via a write ECC signal connection. At 1330, the data and the ECC are stored into a memory array of the memory, the write ECC signal connection being configured to provide a data strobe to the host, in a read operation.

For example, the memory 150_s may be further configured to receive the data (e.g., write data) and the ECC from the host 110_s in performing computing functions, via a write ECC signal connection (e.g., read data strobe RDQS) and to store the data and the ECC into the memory array 175_s. The write ECC signal connection may be configured to provide a data strobe from the memory 150_s to the host 110_s in a read operation. The at least one mode register 179 may further be configurable to indicate the memory 150_s to provide additional ECC or data information associated with the data in the read operation via the read ECC signal connection or to receive additional ECC or data information associated with the data in the write operation via the write ECC signal connection.

Figure 14:
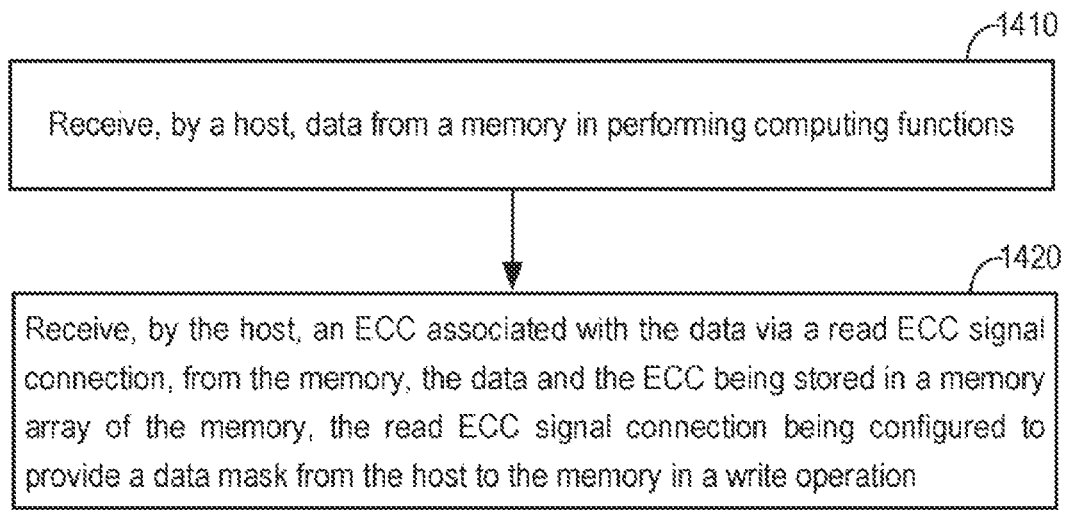
FIG. 14 illustrates another method to operate a system ECC function for the apparatus of FIG. 3, in accordance with certain aspects of the present disclosure.

FIG. 14 illustrates another method to operate a system ECC function for the apparatus 100_s of FIG. 3, in accordance with certain aspects of the present disclosure. The operations of FIG. 14 may be implemented by, for example, the apparatus 100 or 100_s presented with FIGS. 1 and 3-9. The arrows indicate certain relationships among the operations, but not necessarily sequential relationships. At 1410, data from a memory are received by a host in performing computing functions. At 1420, an ECC associated with the data is received by the host, via a read ECC signal connection, from the memory, the data and the ECC being stored in a memory array of the memory, the read ECC signal connection being configured to provide a data mask from the host to the memory in a write operation.

For example, the host 110_s may be configured to communicate with a memory 150_s. The host 110_s may be further configured to receive data in performing computing functions from the memory 150_s and to receive an ECC associated with the data, via a read ECC signal connection (data mask DM), from the memory 150_s. For example, in a system ECC function, the ECC associated with the data may be previously provided by the host 110_s along with the data and stored in the memory array 175_s. The data and the associated ECC may share a common address in the memory array 175_s. In a link ECC function, the ECC associated with the data may be generated by the memory link ECC encoder 162 (FIG. 3) based on the data stored in the memory array 175_s. The data and the ECC being stored in a memory array 175_s of the memory 150_s. The read ECC signal connection may be configured to provide a data mask from the host 110_s to the memory 150_s in a write operation.

The host 110_s may be further configured to read from the at least one mode register 179 in the memory 150_s. The at least one mode register 179 may be accessible separately from the memory array 175_s and may be configurable to indicate the memory 150_s being enabled to provide the ECC stored in the memory array 175_s via the read ECC signal connection. The at least one mode register 179 may be further configurable to indicate a size of the ECC. The host 110_s may be further configured to provide the data and to provide the ECC via a write ECC signal connection (e.g., read data strobe RDQS) to the memory 150_s in performing computing functions. The write ECC signal connection may be configured to provide a data strobe from the memory 150_s to the host 110_s in a read operation.

Figure 15:
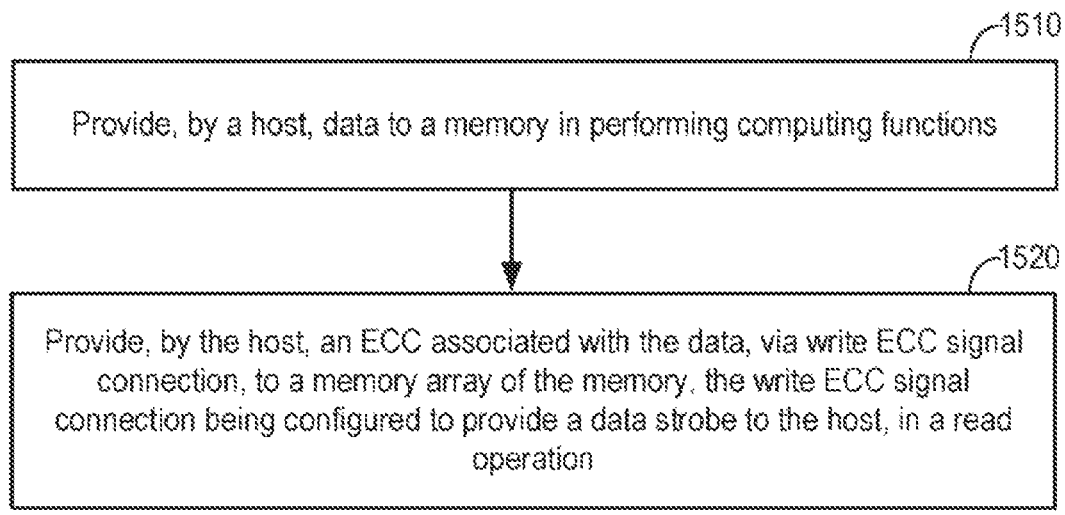
FIG. 15 illustrates another method to operate a system ECC function for the apparatus of FIG. 3, in accordance with certain aspects of the present disclosure.

FIG. 15 illustrates another method to operate a system ECC function for the apparatus 100_s of FIG. 3, in accordance with certain aspects of the present disclosure. The operations of FIG. 15 may be implemented by, for example, the apparatus 100 or 100_s presented with FIGS. 1 and 3-9. The arrows indicate certain relationships among the operations, but not necessarily sequential relationships. At 1510, data are provided by a host to a memory in performing computing functions. At 1520, an ECC associated with the data is provided by the host, via write ECC signal connection, to a memory array of the memory, the write ECC signal connection being configured to provide a data strobe to the host, in a read operation.

For example, the host 110_s may be further configured to provide data (e.g., write data) in performing computing functions and to provide an ECC associated with the data, via the write ECC signal connection (e.g., read data strobe RDQS), to the memory array 175_s of the memory 150_s. For example, in a link ECC function, the ECC may be generated by the link ECC encoder 136 (FIG. 3), based on the data. In a system ECC function, the ECC may be generated by the system ECC encoder 132 (FIG. 3), based on the data. The write ECC signal connection may be configured to provide a data strobe to the host, in a read operation.

Further features of the apparatus 100_s of FIG. 3 are presented herein. For ease of reference, a first mode may refer to a memory access (e.g., read or write) with no link ECC and no system ECC. A second mode may refer to a memory access with system ECC function enabled (e.g., the second configuration). In some examples, system ECC may be referred to as in-line ECC. A third mode may refer to a memory access with link ECC function enabled (e.g., the first configuration).

Referring to FIG. 3, the memory 150_s may be configured to store system error correction code (e.g., parity bits; also referred to as in-line ECC) to an agreed portion of the memory array 175_s, coupled with existing array ECC. As an example, the data "n" may be 256 bits, and the system ECC "s" may be 16 bits. The additional array ECC may protect "n+s" data without further die size increase. For example, the array ECC parity "c" may be 16 bits and may protect 272 bits (i.e. "n=256 bit"+"s=16 bits"). To be more flexible for system needs, at least one register, such as the mode register 179, may enable or disable the system ECC function. If a MRxx OP[y]=1b (e.g., system ECC enabled), the memory array 175_s may be apportioned into a portion for the data and a portion for the system ECC automatically (without further action following setting the mode register). If a MR OP[y]=0b (e.g., system ECC disabled), both portions may be used to store the data. In such fashion, the memory 150_s may support the system ECC function and maintain a maximum memory bandwidth when transmitting the system ECC.

Referring to FIG. 3, the memory 150_s may be configured to communicate with the host 110_s (and vice versa) via at least one data connection and at least one non-data connection. For example, the at least one non-data connection may include a first non-data connection and a second non-data connection. For example the at least on data connection may include DQ[0:7]; the first non-data connection may include the read data strobe RDQS; the second non-data connection may include the data mask (e.g., DM or DMI). For ease of reference, the first non-data connection and/or the second non-data connection may be referred to as at least one non-data connection. In some examples, the term "connection" may include signal connections presented above and may include, for example, conductive traces. In some examples, the at least on data connection may be configured to provide data in a memory access, while the first non-data connection and the second non-data connection may be configured to not provide data in the memory access.

Figure 16:
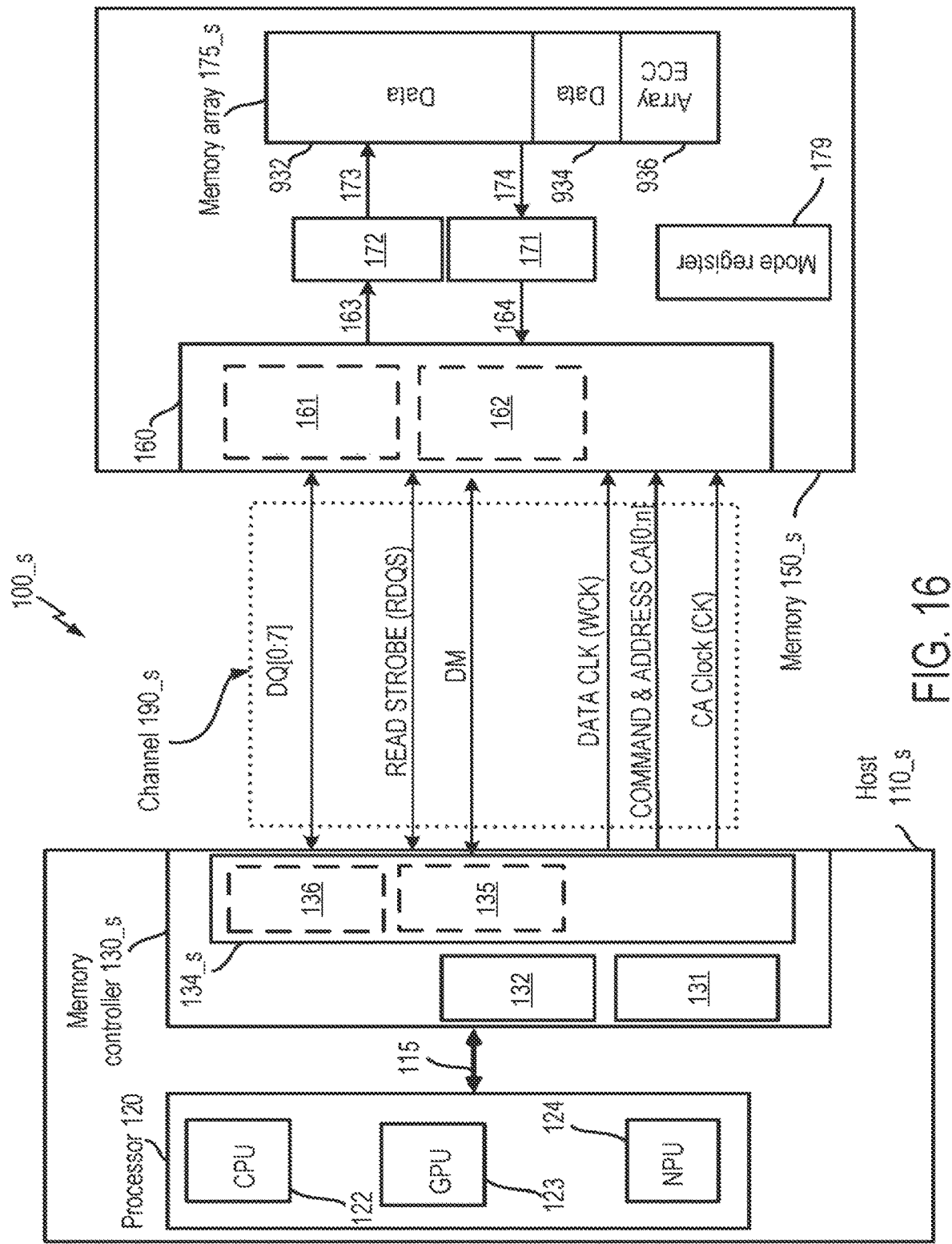
FIG. 16 illustrates the apparatus of FIG. 3 having the memory in the first mode (e.g., system ECC function is not enabled), in accordance with certain aspects of the present disclosure.

The memory 150_s may be further configured to receive data from the host 110_s via the at least one data connection and to output the data to the host 110_s via the at least one data connection (e.g., DQs). FIG. 16 illustrates the apparatus 100_s of FIG. 3 having the memory 150_s in the first mode (e.g., system ECC function is not enabled), in accordance with certain aspects of the present disclosure. FIG. 16 may further represent a state of the memory 150_s in a third mode (e.g., link ECC function is enabled) presented below.

Figure 17:
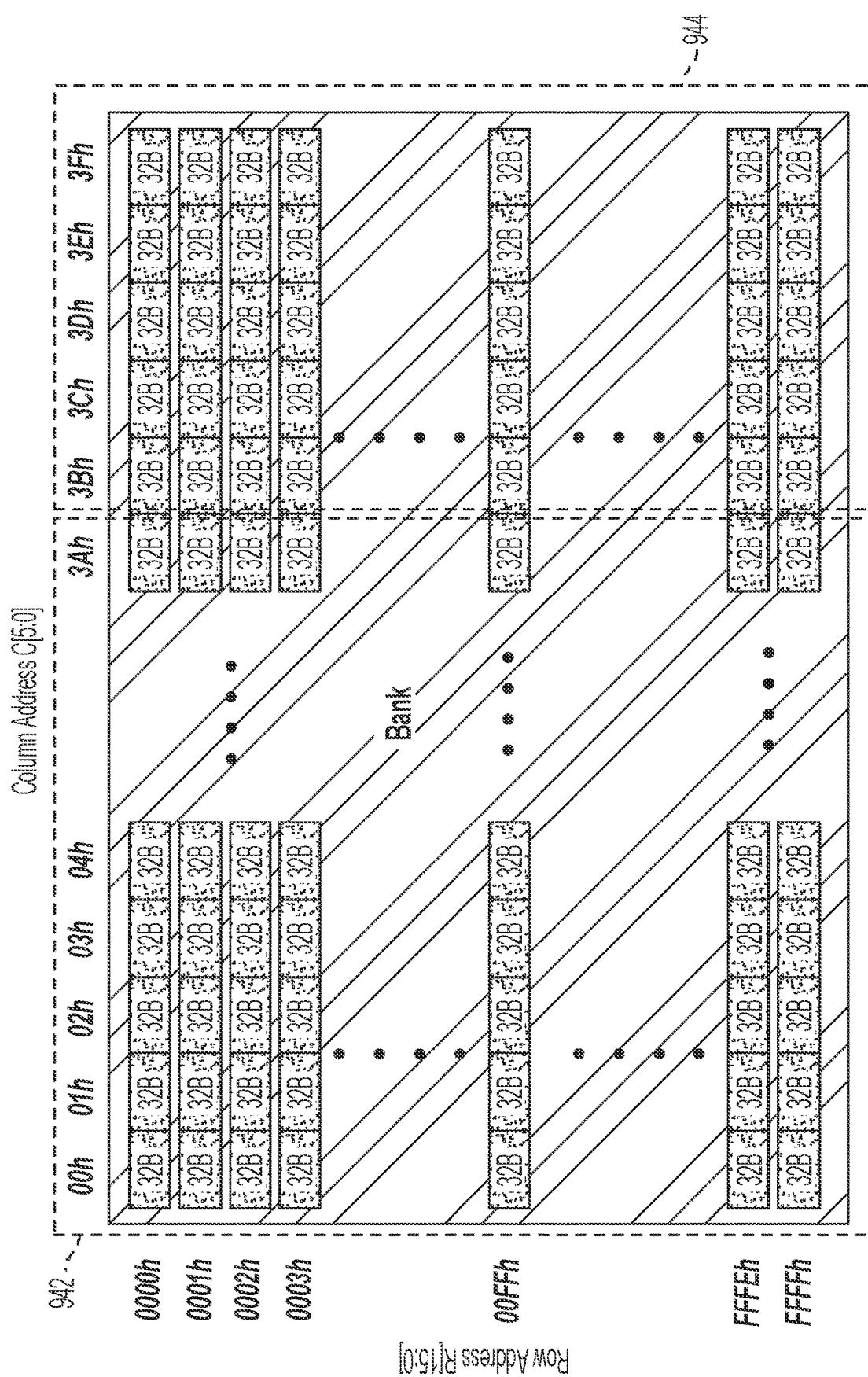
FIG. 17 illustrates a first address space to access the first portion and a second address space to access the second portion of the memory array, in accordance with certain aspects of the present disclosure.

In FIG. 16, the first portion 932 and the second portion 934 of the memory array 175_s may be configured to store data received from and outputted to the host 110_s, via the at least one data connection, in the first mode. FIG. 17 illustrates a first address space 942 to access the first portion 932 and a second address space 944 to access the second portion 934 of the memory array 175_s, in accordance with certain aspects of the present disclosure. In some examples, each of the first address space 942 and the second address space 944 may include row addresses and column addresses received from CAs of the channel 190_s (see FIG. 16). For example, the first address space 942 may correspond to row addresses 0000h to FFFFh and to column addresses 00h to 3Ah, and the second address space 944 may correspond to row addresses 0000h to FFFFh and to column addresses 3Bh to 3Fh. The total address space of the memory array 175_s thus ranges from row address 0000h and column address 00h to row address FFFFh and column address 3Fh.

In such fashion, the memory 150_s may be configured to store and output the data, in the first mode, in the first portion 932 and the second portion 934 of the memory array 175_s. The first portion 932 may be addressable by a first address (e.g., an address in the first address space 942), and the second portion 934 may be addressable by a second address (e.g., an address in the second address space 944). Thus, the first address and the second address may differ in column addressing. While the present disclosure utilizes an example of the first address space 942 and the second address space 944 vary in column space, other examples are possible.

Figure 18:
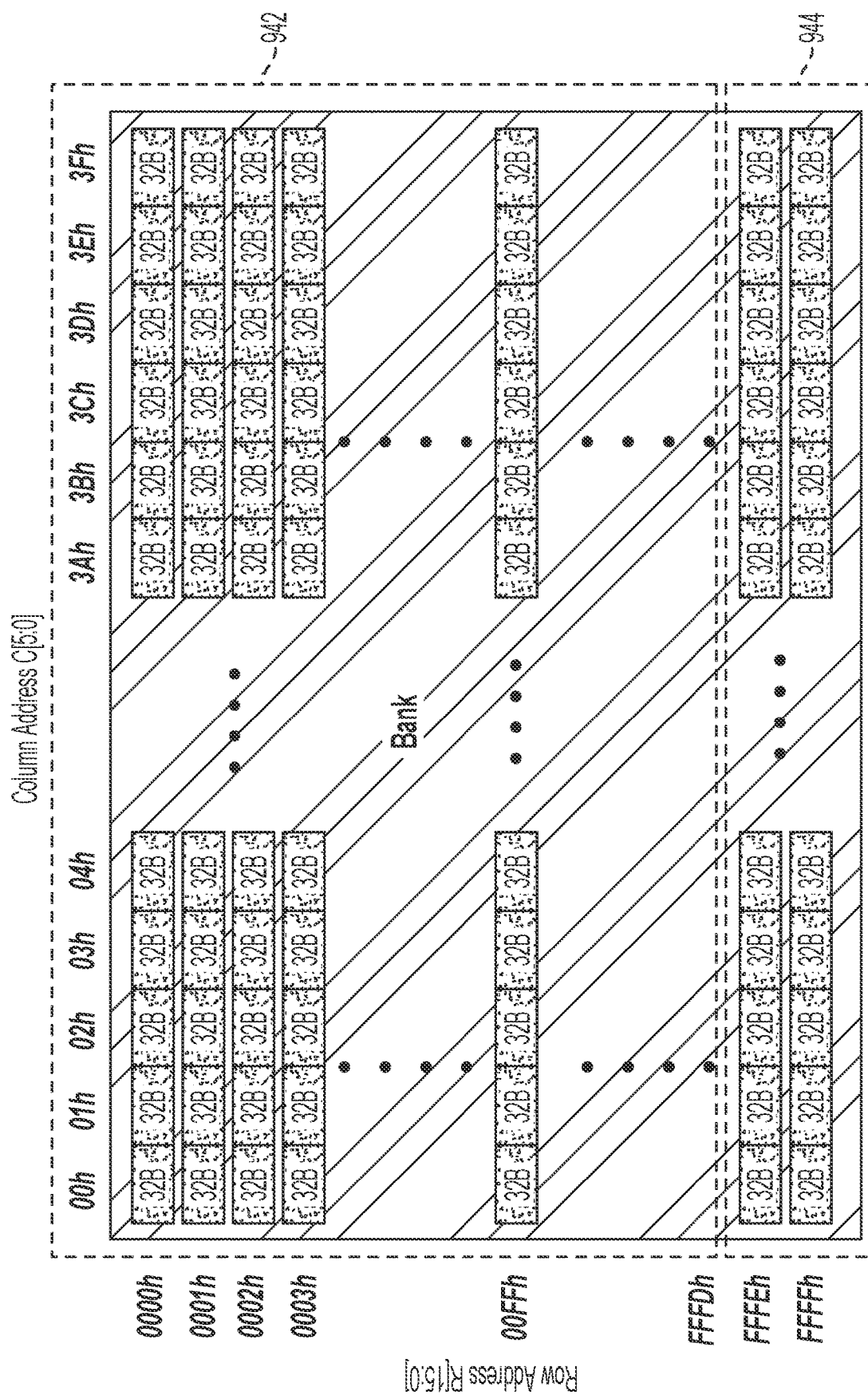
FIG. 18 illustrates an example of the first address space and the second address space differing in row space, in accordance with certain aspects of the present disclosure.

FIG. 18 illustrates an example of the first address space 942 and the second address space 944 differing in row space, in accordance with certain aspects of the present disclosure. In FIG. 18, the first portion 932 may be accessed by the first address space 942, which correspond to row addresses 0000h up to FFFDh. The second portion 934 may be accessed by the second address space 944, which correspond to row addresses FFFEh up to FFFFh. In the example, the first address space 942 and the second address space 944 may differ in row space, and accordingly, the first address used to access the first portion 932 and the second address used to access the second portion 934 may differ in row addressing.

Figure 19:
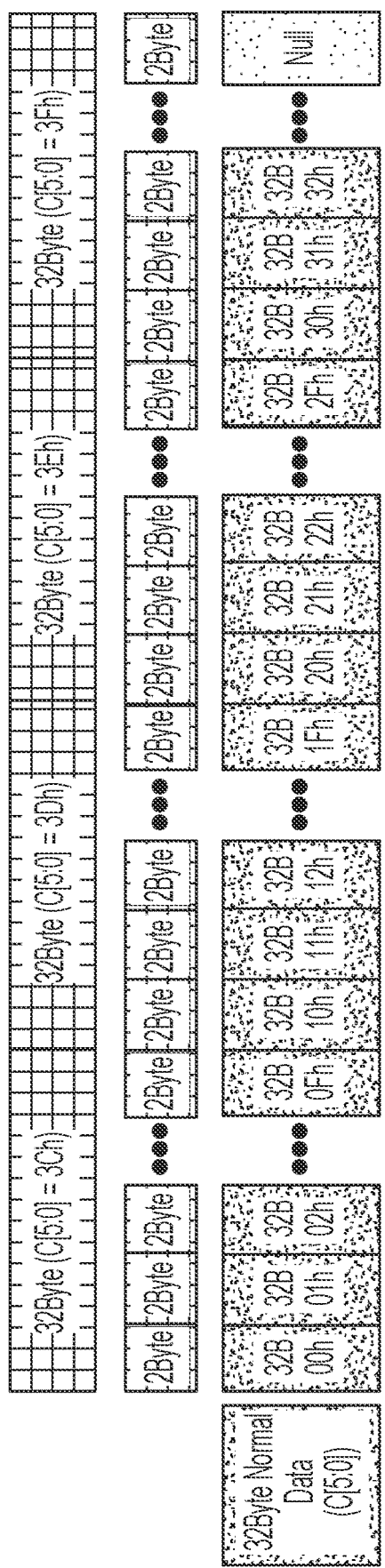
FIGS. 19 and 20 illustrate examples of data and address mapping of FIG. 17 in accordance with certain aspects of the present disclosure.
Figure 20:
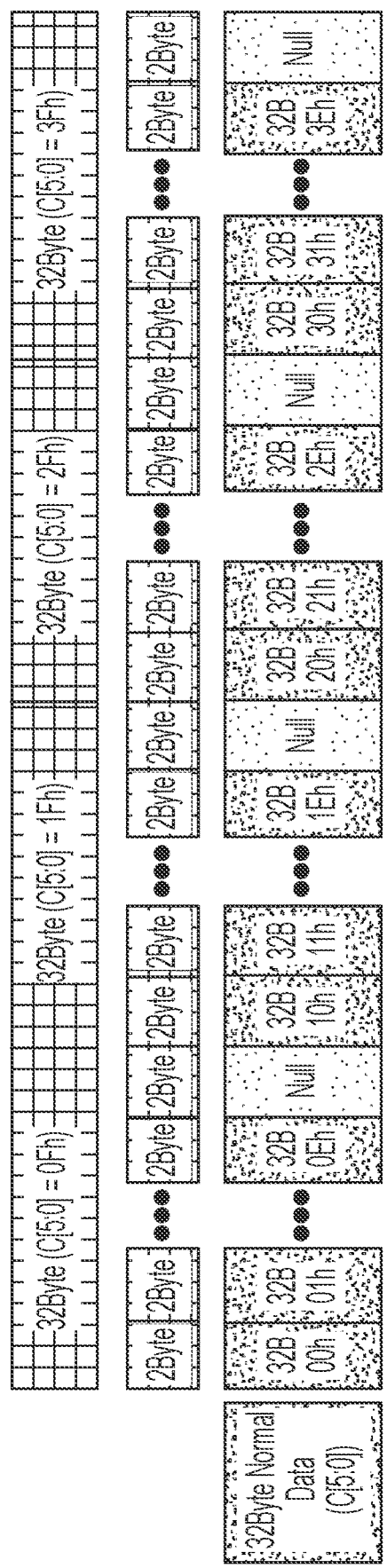

FIGS. 19 and 20 illustrate examples of data and address mapping of FIG. 17 in accordance with certain aspects of the present disclosure. FIGS. 19 and 20 illustrate, for example, the data (written into or read from the first portion 932; labeled as normal data) may be 32 Bytes and the system ECC (e.g., in-line ECC) (written into or read from the second portion 934) may be 16 bits or less. In FIG. 19, the address space not used ("null") is aggregated within the column address 3Fh space, while in FIG. 20, the address space not used is distributed among the column address space. In each read or write operation, a total of 34 Bytes (32 Bytes of the data and 2 Bytes of the system ECC) may be transmitted between the host 110_s and the memory 150_s (e.g., via the at least one data connection and the at least one non-data connection). In such fashion, 2 Bytes of the system ECC may be implemented with no memory bandwidth loss. Based on memory internal design preference and efficiency, different column address mapping may be possible. Moreover, additional 2 Bytes of array ECC ("c") may be implemented to further protect the 32 Bytes of the data ("n") and the two Bytes of the system ECC ("s").

FIG. 3 further illustrates the apparatus 100_s having memory array 175_s in the second mode (e.g., the system ECC function is enabled), in accordance with certain aspects of the present disclosure. The memory 150_s may be configured to receive system ECC from the host 110_s, via the first non-data connection (e.g., in a write operation). For example, referring to FIGS. 4A and 4B, the memory 150_s may be configured to receive system ECC on the data strobe RDQS (e.g., the first non-data connection). In some examples, non-data connection may be configured to provide information not to be stored or outputted in the first portion 932 of the memory 150_s, or to provide information not part of the data for computing functions.

Figure 21:
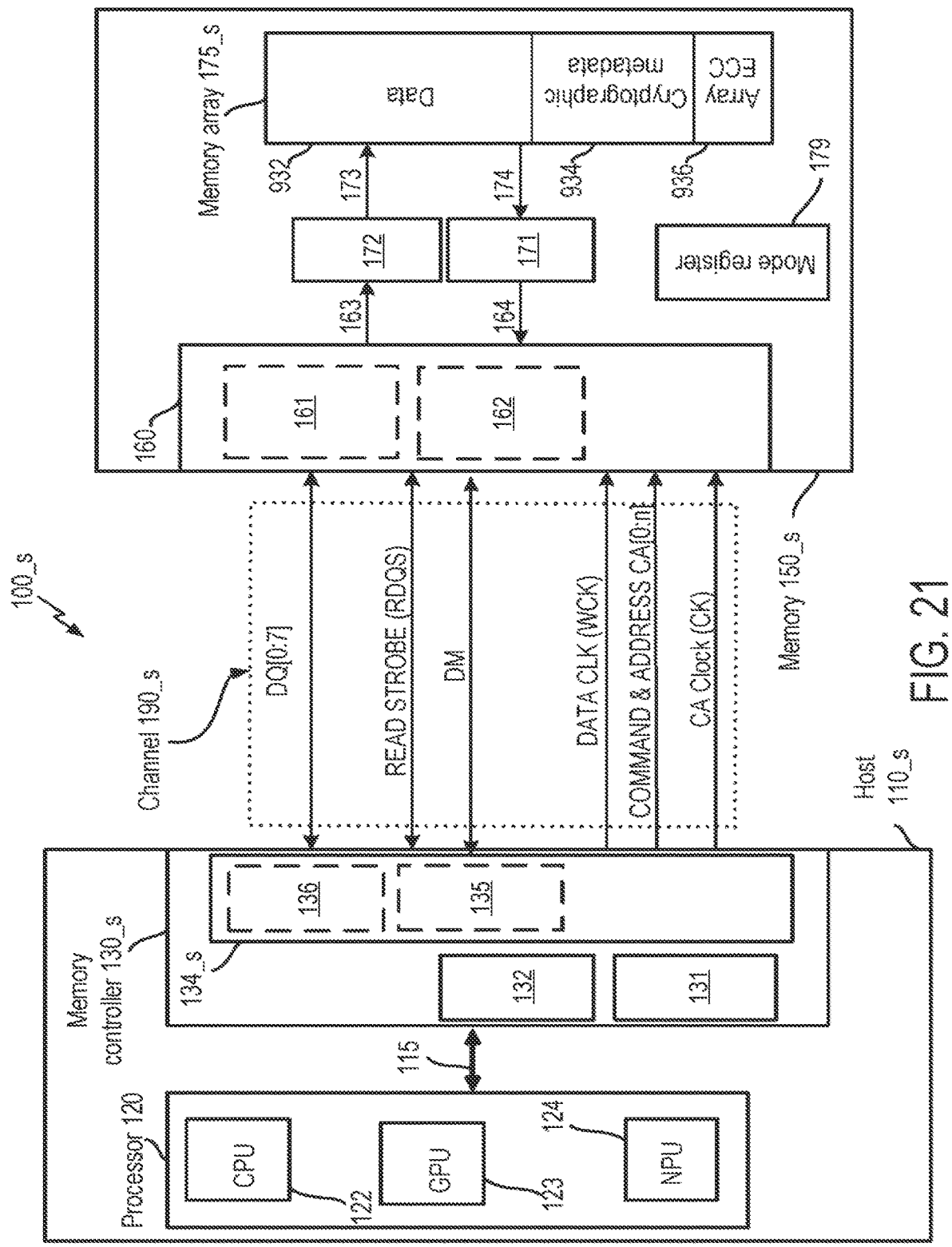
FIG. 21 illustrates the second portion being configured to store cryptographic metadata, in accordance with certain aspects of the present disclosure.

In some examples of the second mode, the second portion 934 may be configured to store the ECC of the data (stored in the first portion 932) (see FIG. 3) based on addressing of the first portion 932 (e.g., the first address). In other examples of the second mode, the second portion 934 may be configured to store metadata of the data stored in the first portion. Examples of the metadata (e.g., information about the data stored in the first portion 932 of the memory array 175_s) may include cryptographic metadata and/or compression metadata. FIG. 21 illustrates the second portion 934 being configured to store cryptographic metadata, in accordance with certain aspects of the present disclosure. For example, the at least one processor 120 (see FIG. 3) may be configured to cause the memory 150_s to store and to retrieve from the memory 150_s, via the host 110_s, cryptographic metadata and the data in performing security and/or authentication functions. The cryptographic metadata may be stored in the second portion 934 of the memory array 175_s in the second mode.

Figure 22:
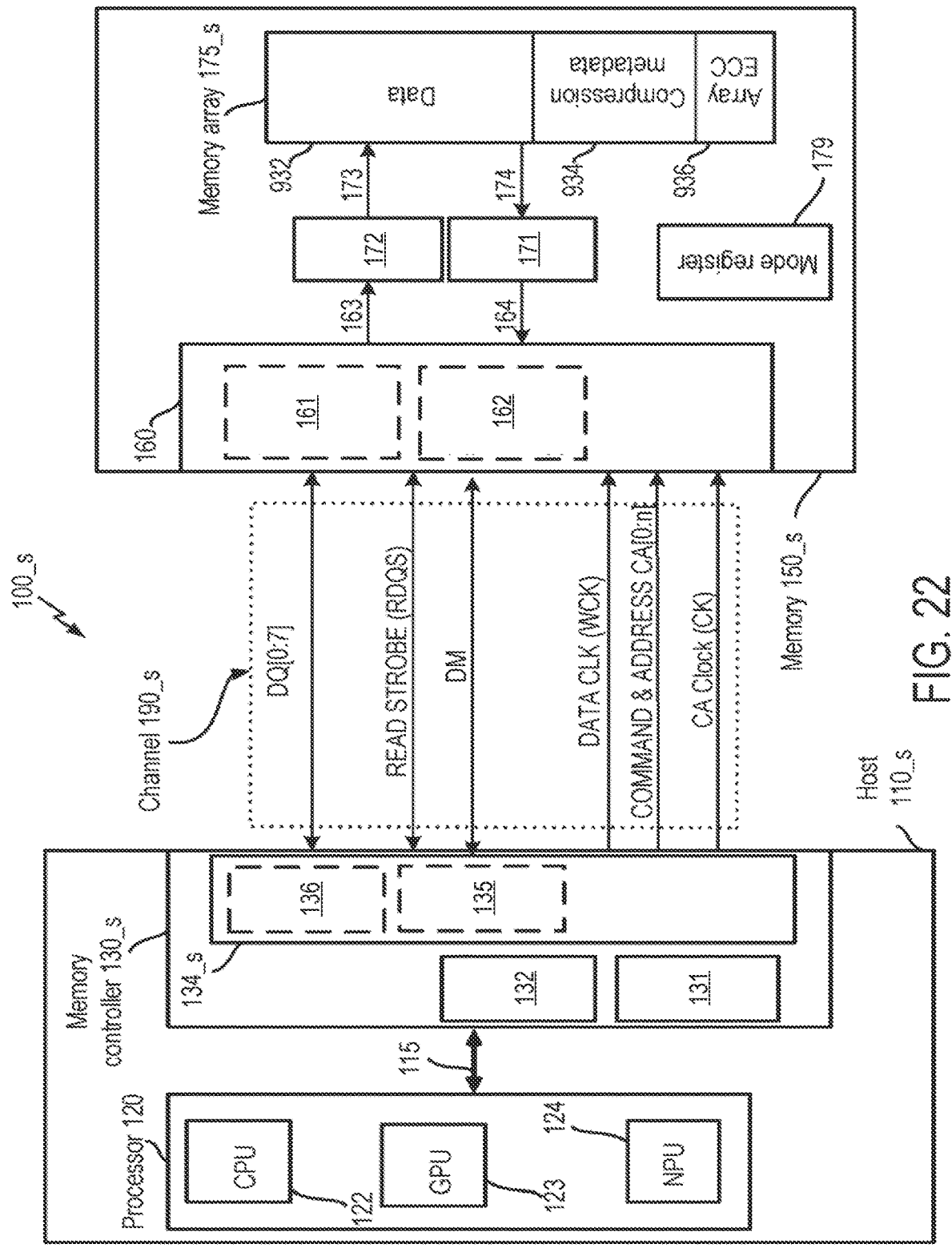
FIG. 22 illustrates the second portion being configured to store compression metadata, in accordance with certain aspects of the present disclosure.

FIG. 22 illustrates the second portion 934 being configured to store compression metadata, in accordance with certain aspects of the present disclosure. For example, the at least one processor 120 (see FIG. 3) may be configured to cause the memory 150_s to store and to retrieve from the memory 150_s, via the host 110_s, the data and compression metadata associated with the data in compressing and uncompressing the data. The compression metadata may be stored in the second portion 934 of the memory array 175_s in the second mode, based on the first address. In some examples, the second portion 934 storing the ECC or metadata may be transparent to the memory 150_s. Certain features of the memory 150_s configured for the first mode and the second mode are presented below.

Referring to FIGS. 3 and 6, in the second mode, the memory 150_s may be configured to store the data, received via the data connection (e.g., DQs), in the first portion 932 of the memory array 175_s (e.g., in a write operation). The memory 150_s may be further configured to receive the system ECC (or metadata) via the first non-data connection. The first non-data connection may be, for example, data strobe RDQS in the write operation. The memory 150_s may be further configured to store the system ECC (or metadata) in the second portion 934 of the memory array 175_s in the write operation. Further, in the second mode, the memory 150_s may be configured to output the data stored in the first portion 932 to the host 110_s, via the data connection (e.g., DQs) and to output the ECC (or metadata) stored in the second portion 934 to the host 110_s, via a second non-data connection. The second non-data connection may be, for example, data mask DM in the read operation. Moreover, in the second mode, the first portion 932 and the second portion 934 of the memory array 175_s may be accessed (written or read) sharing the first address space 942 (the second address space 944 being not in use). Thus, the memory 150_s in the second mode may be configured to store the system ECC (or the metadata) in the second portion 934 and to output the system ECC (or the metadata) store in the second portion 934 based on the first address space 942, such as the first address used for the first portion 932.

Figure 23:
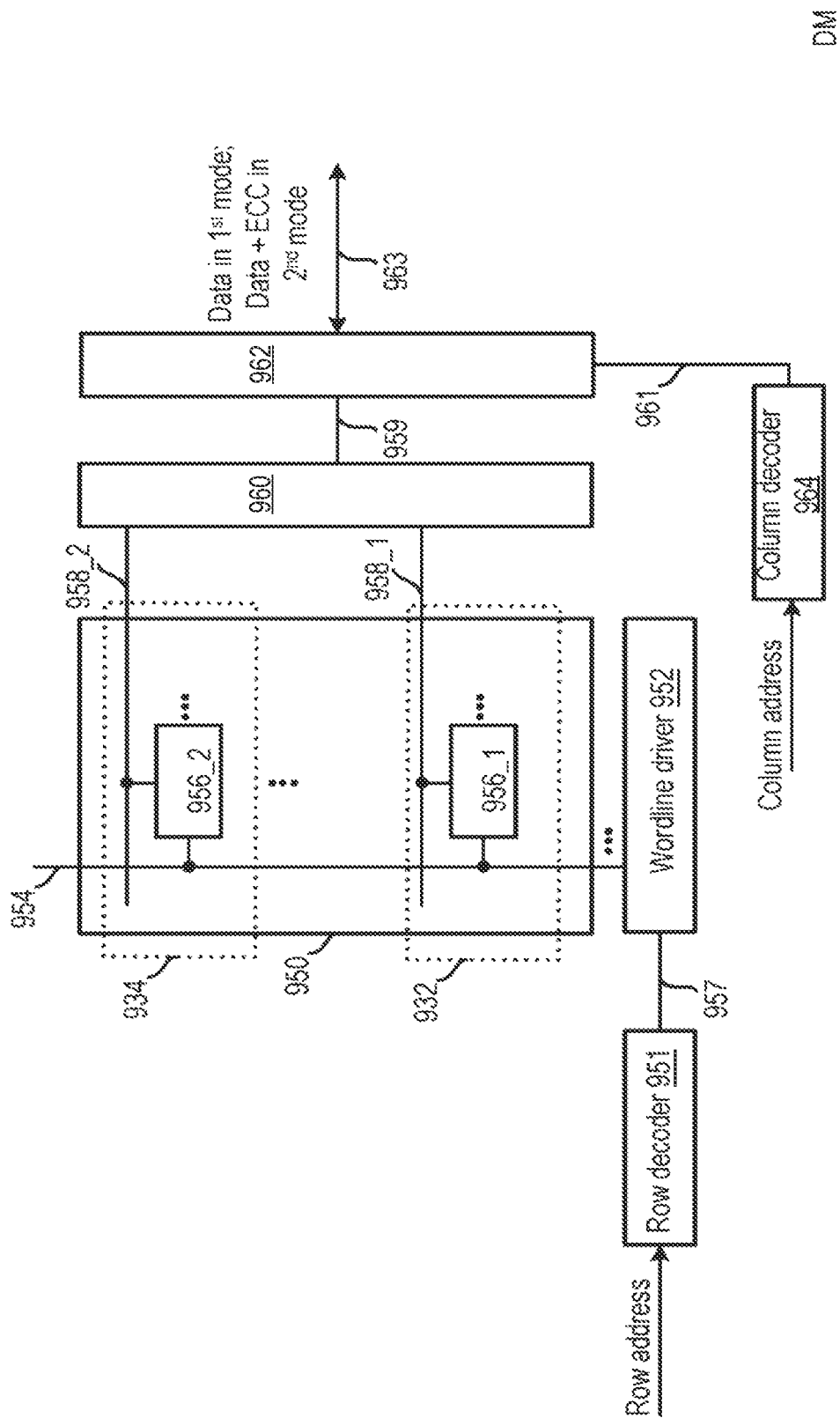
FIG. 23 illustrates an example block of the memory array of FIG. 3 having the first portion and the second portion sharing a physical wordline, in accordance with certain aspects of the present disclosure.

FIG. 23 illustrates an example block 950 of the memory array 175_s of FIG. 3 having the first portion 932 and the second portion 934 sharing a physical wordline 954, in accordance with certain aspects of the present disclosure. FIG. 23 includes the block 950, a row decoder 951, a wordline driver 952, sense amplifiers 960, a column select 962, and a column decoder 964. The block 950, as illustrates, may include memory cells 956 arranged as an array (e.g., having rows and columns). The memory cells 956 may be further arranged as the first portion 932 and the second portion 934. For example, a memory cell 956_1 may be part of the first portion 932, and a memory cell 956_2 may be part of the second portion 934. The block 950 may further include wordlines, such as physical wordline 954. The block 950 may further include bitlines 958 coupled to the memory cells 956. The bitlines 958 may include a bitline 958_1 coupled to the memory cell 956_1 and a bitline 958_2 coupled to the memory cell 956_2.

The row decoder 951 may be configured to couple to a row address, and to decode the row address. The row decoder 951 may be further configured to output a decoded row address to the wordline driver 952, via signal connections 957. The wordline driver 952 may be configured to turn on a wordline, such as the physical wordline 954, based on the decoded row address. The physical wordline 954 being turned on would allow accesses (e.g., read or write) to memory cells 956 (such as the memory cell 956_1 and the memory cell 956_2) coupled to the physical wordline 954. For example, responsive to the physical wordline 954 being turned on, a state (e.g., logic zero or logic one) stored in the memory cell 956_1 and a state stored in the memory cell 956_2 would be provided to the sense amplifier 960 via, respectively, the bitline 958_1 and the bitline 958_2 in a read operation. Further, in a write operation, states stored in the sense amplifiers 960 would be written into the memory cells 956_1 and 956_2 via, respectively, the bitline 958_1 and the bitline 958_2.

The column decoder 964 may be configured to couple to a column address and to decode the column address. The column decoder 964 may be further configured to output a decoded column address to the column select 962 via signal connects 961. The column select 962 may be configured to couple to signal connects 963 and, via signal connects 959, to the sense amplifiers 960. The signal connects 963 may be configured to carry the data and/or the ECC of the data (e.g., the link ECC or the system ECC; or the metadata). The column select 962 may be further configured to select among certain ones of the sense amplifiers 960, based on the decoded column address from the signal connects 961, from which the data or both the data and the ECC (or the metadata) are received via the signal connects 959, in the read operation. The column select 962 may be further configured to select among certain ones of the sense amplifiers 960, based on the decoded column address from the signal connects 961, to which the data or both the data and the ECC (or the metadata) (from the signal connects 963) are provided via the signal connects 959 in the write operation.

In some examples, in the first mode, the column decoder 964 may be configured to cause the column select 962 to select one of the sense amplifiers 960 coupled to the bitline 958_1, based on the first address (a column address part of the first address) to read from or write to. Further, in the first mode, the column decoder 964 may be configured to cause the column select 962 to select one of the sense amplifiers 960 coupled to the bitline 958_2, based on the second address (a column address part of the second address) to read from or write to. In such fashion, both the first portion 932 (including the memory cell 956_1 coupled to the bitline 958_1) and the second portion 934 (including the memory cell 956_2 coupled to the bitline 958_2) may be accessed for the data in the first mode.

In the second mode, the column decoder 964 may be configured to cause the column select 962 to select the one of the sense amplifiers 960 coupled to the bitline 958_1, based on the first address (the column address part of the first address) to read from or write to. Further, in the second mode, the column decoder 964 may be configured to cause the column select 962 to select the one of the sense amplifiers 960 coupled to the bitline 958_2, based on the first address (the column address part of the first address) to read from or write to. In such fashion, the first portion 932 (including the memory cell 956_1) may be access for the data, and the second portion 934 (including the memory cell 956_2) may be accessed for the ECC (or the metadata) of the data. In the second mode, access to both the first portion 932 and the second portion 934 may be based on the first address.

Figure 24:
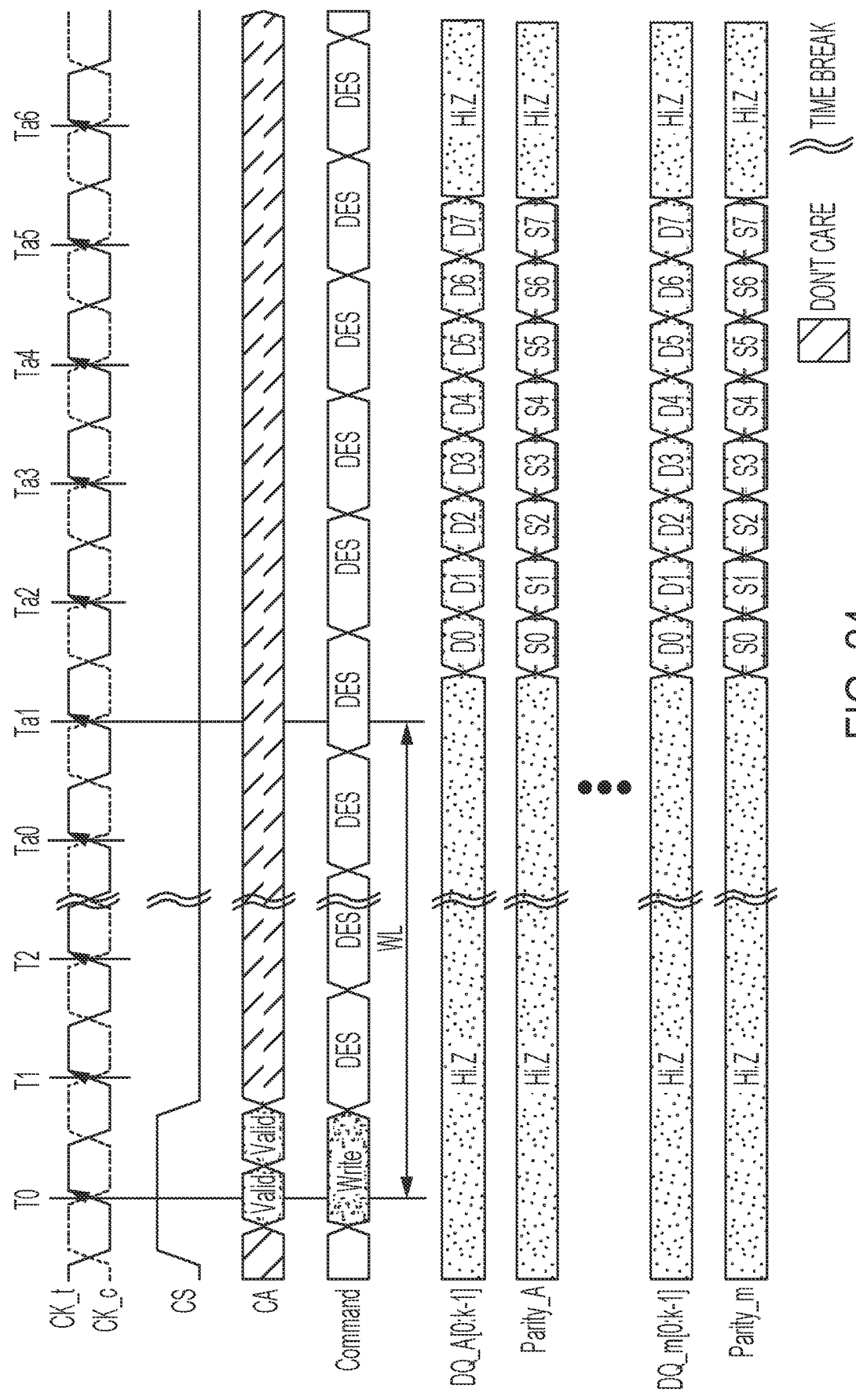
FIG. 24 illustrates waveforms in an example of the at least one non-data connection in a write operation, in accordance with certain aspects of the present disclosure.
Figure 25:
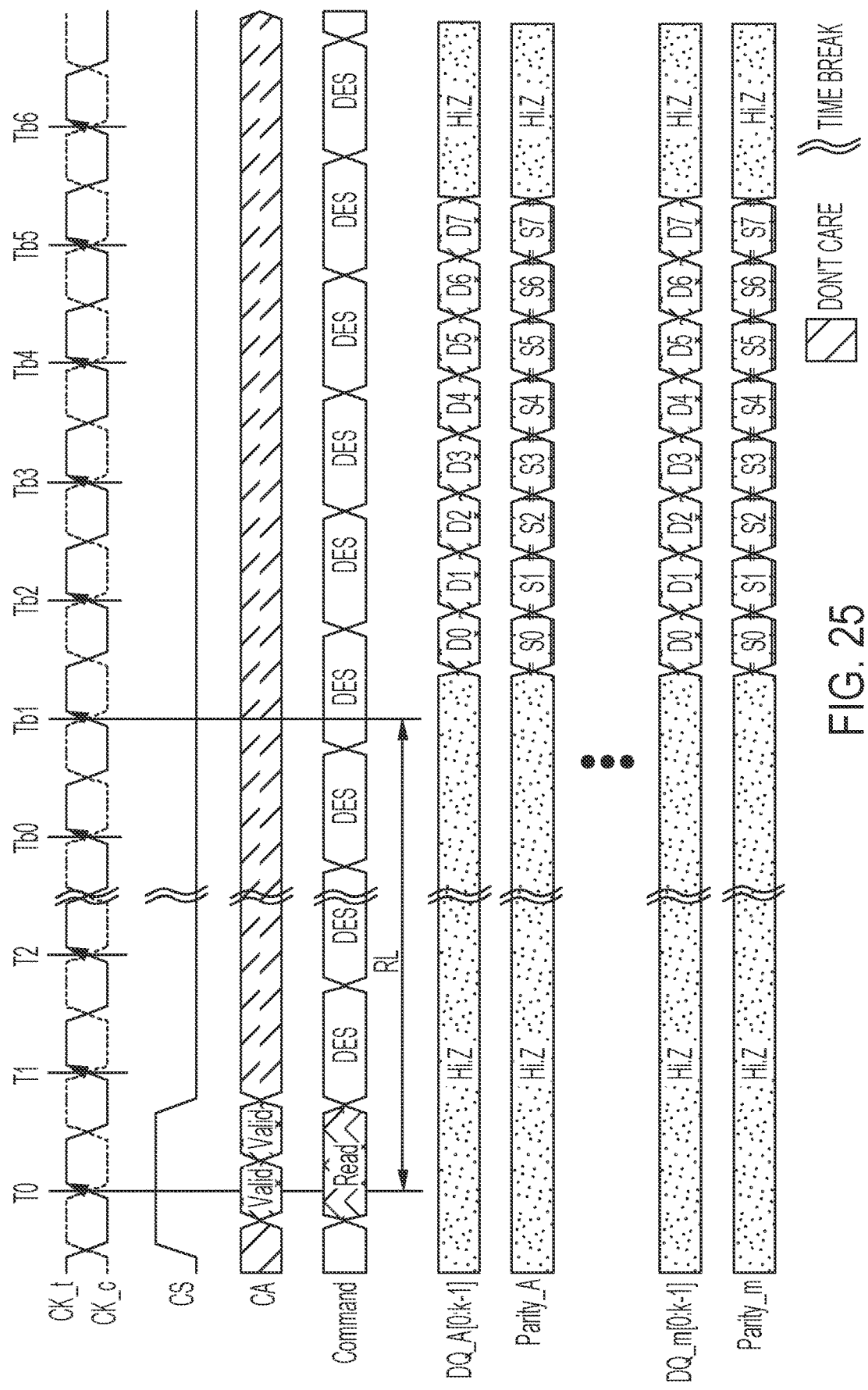
FIG. 25 illustrates waveforms in another example of the at least one non-data connection in a write operation, in accordance with certain aspects of the present disclosure.

FIG. 24 illustrates another example of the at least one non-data connection in a write operation, in accordance with certain aspects of the present disclosure. FIG. 25 illustrates the another example of the at least one non-data connection in a read operation, in accordance with certain aspects of the present disclosure. In FIG. 3, the at least one non-data connection may include the data strobe (RDQS)(for reference, the first non-data connection) in the write operation. The at least one non-data connection may include the data mask DM (for reference, the second non-data connection) in the read operation. FIGS. 23 and 24 provide that, for example, the at least one non-data connection may share a same connection for both read and write operations. Interfaces other than LPDDR5, such as High Bandwidth Memory (HBM) and Graphic DDR may use a dedicated parity (non-data) connection for both read and write. For example, system ECC bits (s[0:7]) (e.g., parity bits) may be transferred between a host and a memory via a parity pin/connection. For example, the memory may store (i.e. write operation) "8*k" bits of data and "s" bits (8 bits in this example) system ECC parity bits to a part of a memory array which is pre-determined with given row and column addresses. To improve memory yield and quality, the memory may encode array ECC ("c") for "8*k+s" (data+system ECC parity bits) with vendor's own array ECC scheme.

One channel memory interface may include multiple of memory interfaces shown in FIGS. 24 and 25. For example, with k=32 and one parity connection per 32 DQs, a total input/output width may be ×128 with 4 parity connections per channel (×128). The configuration may include 1024 bits of data (128 DQs×8 burst length) with 32 bits parity (4 parity connection×8 burst length). Data protection unit and system ECC parity size may be configured as a system prefers. For example, 16 system ECC parity bits for 512 bits of data; 32 system ECC parity bits for 1024 bits of data, etc.

Accordingly, the apparatus 100_s may be configured to reduce addressable space of the memory 150_s by not accessing the second address space 944 in the second mode (e.g., the system ECC being enabled). In such fashion, the host 110_s may be configured to, in response to operating mission-critical applications, enter the second mode (e.g., enable the system ECE function) to add an additional layer ECC. A same memory 150_s may be configured to operate in both the first mode and the second mode with no wasted memory cells. For example, the second portion 934 would be used in the first mode (as storage for the data) and in the second mode (as storage for the ECC or the metadata).

Further, the memory 150_s may include at least one mode register 179, separate from the memory array 175_s. The host 110_s may be configured to set the at least one mode register 179, and the memory 150_s may operate based on the at least one mode register 179. For example, the host 110_s may be configured to set the at least one mode register 179 in the memory 150_s, the first mode and the second mode being based on the at least one mode register 179. For example, the memory 150_s may enter or exit the first mode and/or the second mode based on the at least one mode register 179.

Moreover, the memory 150_s may be configured to operate in a third mode (e.g., the link ECC function being enabled). In the third mode, both the first address space 942 and the second address space 944 may be available for access. The host 110_s may be configured to set the at least one mode register 179 to indicate, to the memory 150_s, the first mode (system ECC function is not enabled), the second mode (system ECC function is enabled), or the third mode (link ECC function is enabled). In the third mode, the memory 150_s may be configured to receive the ECC from the host 110_s, via the first non-data connection (e.g., the data strobe RDQS) in the write operation. Referring to FIG. 3, the memory link ECC decoder 161 may be configured to perform error detection or correction on the data based on the ECC. After the error detection or correction, the memory 150_s may be further configured to provide the data (e.g., corrected data) to the memory array 175_s and to store the data in the first portion 932 and in the second portion 934.

In the third mode and in the read operation, the memory link ECC encoder 162 may be configured generate the ECC based on the data stored in the first portion 932 and in the second portion 934 of the memory array 175_s. The memory 150_s may be further configured to output the ECC to the host 110_s via the at least one non-data connection (e.g., the data mask DM). In the third mode, the ECC is not stored in the memory array 175_s.

Referring to FIGS. 3 and 16, features relating to the host 110_s are presented. The host 110_s may include a memory controller 130_s configured to communicate with the memory 150_s (e.g., outputting and receiving signaling on the channel 190). The host 110_s may further include at least one processor 120 configured to couple with the memory controller 130_s in performing various computing functions (e.g., telephony, wireless data access, and camera/video function, etc.). The host 110_s may be further configured to receive the data from and provide the data to the memory 150_s (e.g., to be stored in the memory array 175_s) via the at least one data connection (e.g., DQs).

The host 110_s may be further configured to, in the first mode, output the first address to the memory 150_s to access the data in the first portion 932 of the memory array 175_s (e.g., via the Commands and Addresses (CAs)). The host 110_s may be further configured to output the second address to the memory 150_s to access the data in the second portion 934 of the memory array 175_s. For example, referring to FIG. 17, the first address may be an address in the first address space 942, and the second address may be an address in the second address space 944. Thus, in the first mode (e.g., the system ECC function is not enabled), the host 110_s may be configured to access both address spaces 942 and 944.

The host 110_s may be further configured to, in the second mode, output the first address to the memory to access the data in the first portion 932 and to access the ECC (or metadata) of the data in the second portion 934 of the memory array 175_s via the at least one non-data connection (e.g., data mask DM in the read operation; RDQS in the write operation). Accordingly, the host 110_s may be configured to reduce addressable space of the memory 150_s by not accessing the second address space 944. In such fashion, the host 110_s may be configured to, in response to operating mission-critical applications, enter the second mode (e.g., enable the system ECE function) to add an additional layer ECC. Moreover, the apparatus 100_s may be configured to utilize the second portion 934 for metadata to operate, for example, authentication/security or compression functions.

Moreover, in the second mode, the host 110_s may be configured to reduce address space used to access the memory array 175_s. For example, referring to FIG. 17, the host 110_s may be configured to not use the second address space 944 in the second mode. Such arrangement may be agreed upon prior to any operation of the memory 150_s. For example, both the host 110_s and the memory 150_s may be configured to agree to not access the second portion 934 in the second mode without exchanging information identifying the second address space 944 (e.g., including the second address). For example, the host 110_s may be configured to set the at least one mode register 179 (see FIG. 3) to cause memory 150_s to operate in the second mode. No information on the second address space 944 would be required for memory accesses in the second mode.

Certain features of the memory controller 130_s and the at least one processor 120 (see FIG. 3) in the second mode (e.g., system ECC enabled) and in the third mode (e.g., link ECC enabled) are presented. In the second mode, the memory controller 130_s may be configured to provide the ECC (e.g., system ECC) received from the memory 150_s to the at least one processor 120 and to receive from the at least one processor 120 the ECC to be provided to the memory 150_s (e.g., via the bus system 115).

In the third mode, the memory controller 130_s may be further configured to receive the ECC (e.g., the link ECC) from the memory 150_s, via the at least one non-data connection (e.g., the data strobe RDQS in the write operation and the data mask DM in the read operation). The memory controller 130_s (e.g., by the link ECC decoder 135) may be further configured to perform error detection or correction on the data based on the ECC. The memory controller 130_s may be further configured to provide, after error detection or correction, the data (e.g., corrected data) to the at least one processor 120. The memory controller 130_s may be further configured to receive the data from the at least one processor 120, generate the ECC (e.g., the link ECC encoder 136 generating link ECC) based on the data from the at least one processor 120, and provide the ECC to the memory 150_s via the at least one non-data connection.

Figure 26:
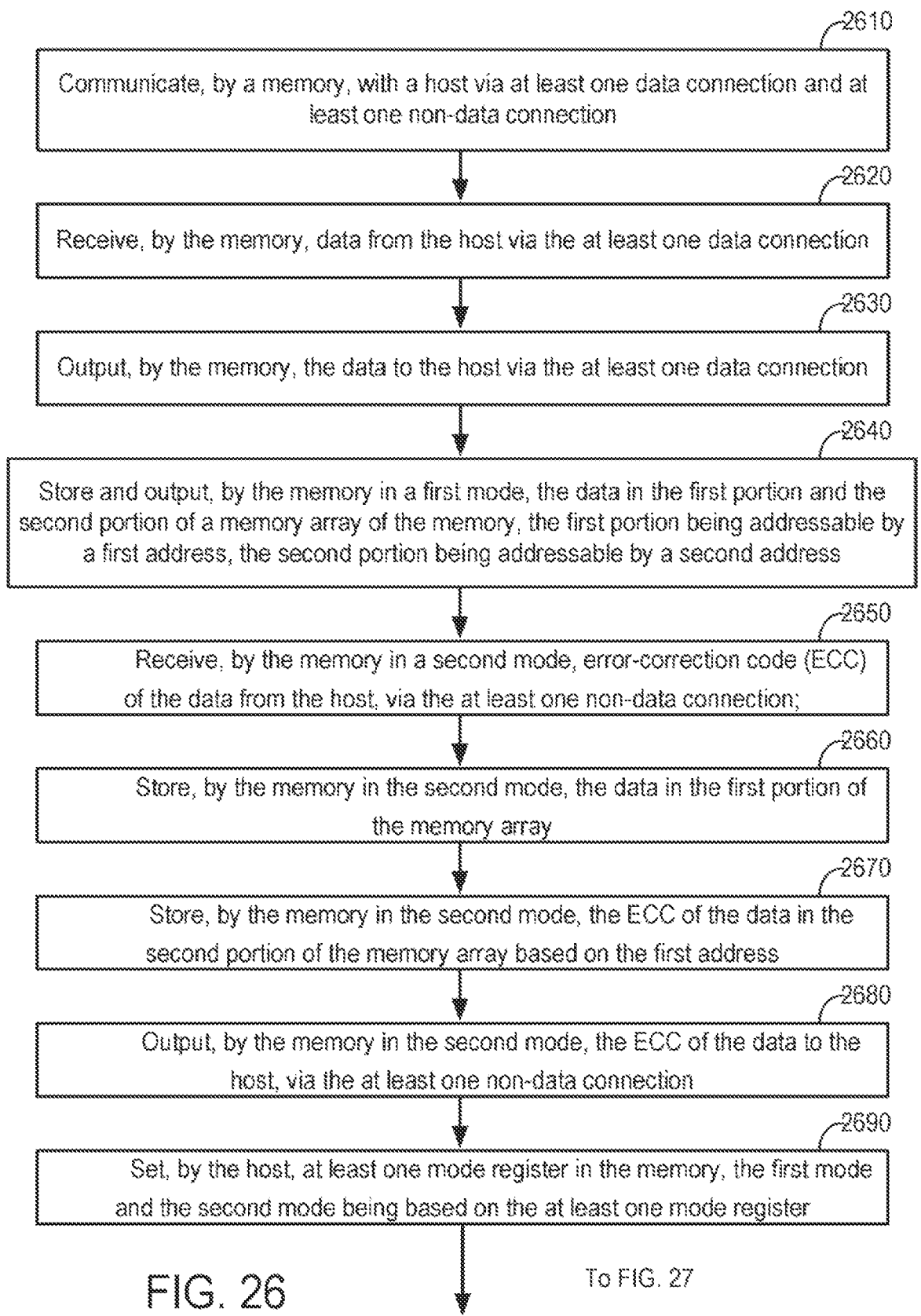
FIGS. 26 and 27 illustrate a method or methods to communicate error correction code between a host and a memory, in accordance with certain aspects of the present disclosure.
Figure 27:
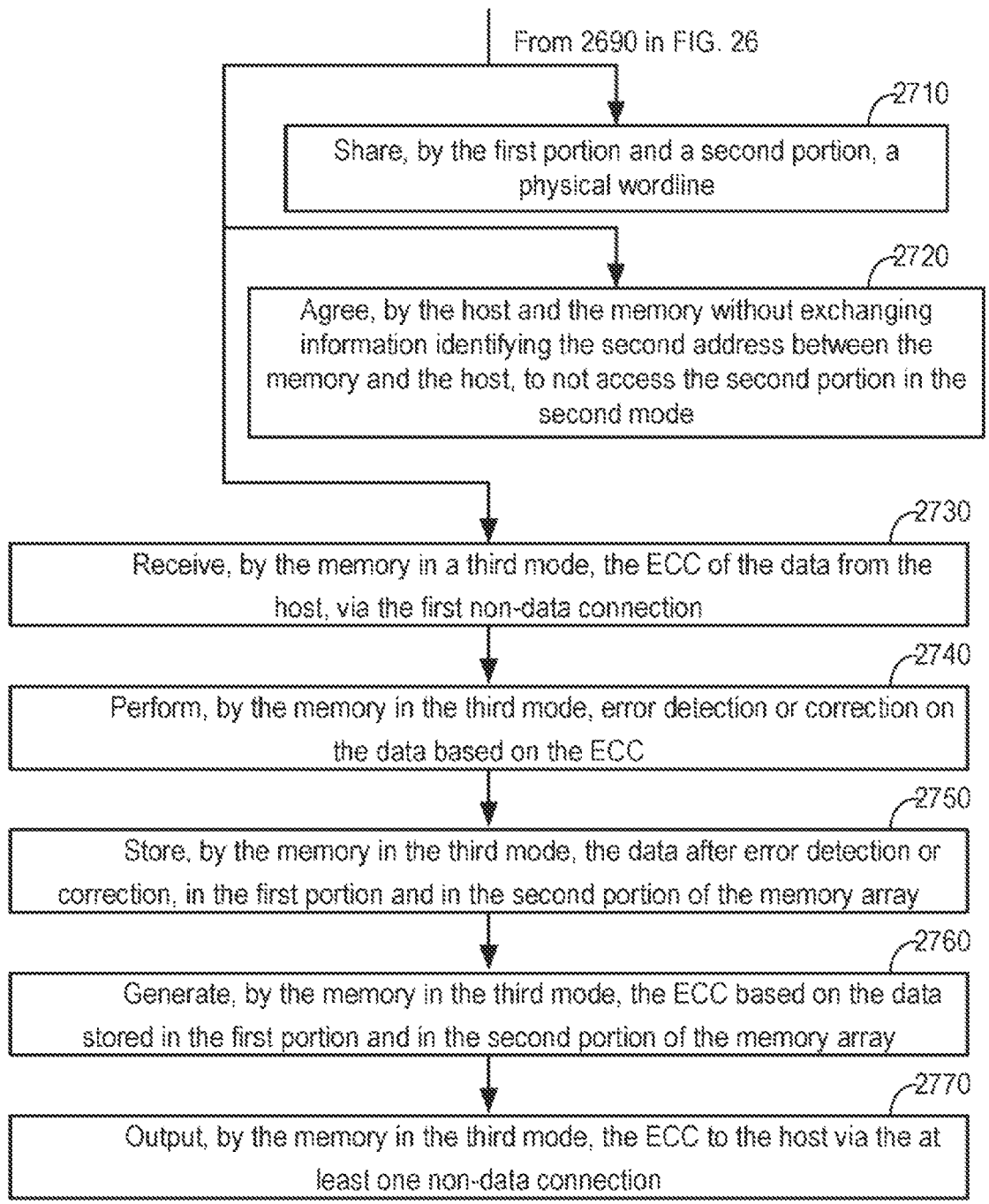

FIGS. 26 and 27 illustrate a method or methods to communicate error correction code between a host and a memory, in accordance with certain aspects of the present disclosure. The operations of FIGS. 26 and 27 may be implemented by, for example, the apparatus 100_s presented with FIGS. 3, 16, 17, and 23. The arrows indicate certain relationships among the operations, but not necessarily sequential relationships.

At 2610, a host and a memory communicate via at least one data connection and at least one non-data connection. For example, referring to FIGS. 3 and 16, the host 110_s writes to and reads from the memory 150_s via a channel 190. The channel 190 includes at least on data connection, such as the DQs, and at least one non-data connection, such as the data mask DM (also referred to as DMI) and the data strobe RDQS. At 2620, data is received by the memory from the host via the at least one data connection. For example, in a write operation, the memory 150_s receives write data from the host 110_s via the DQs. At 2630, the data is outputted by the memory to the host via the at least one data connection. For example, in a read operation, the memory 150_s outputs read data to the host 110_s via the DQs.

At 2640, the data in the first portion and the second portion of a memory array of the memory is stored and outputted by the memory in a first mode. The first portion is addressable by a first address, and the second portion is addressable by a second address. For example, referring to FIG. 16, in the first mode (e.g., the system ECC function is not enabled), the data received by the memory 150_s is stored in and outputted from the first portion 932 and the second portion 934 of the memory array 175_s of the memory 150_s. Referring to FIG. 17, the first portion 932 is addressable by a first address in the first address space 942, and the second portion 934 is addressable by a second address in the second address space 944.

At 2650, error-correction code (ECC) of the data is received from the host by the memory in a second mode, via the at least one non-data connection. For example, referring to FIG. 3, the memory 150_s in the second mode (e.g., system ECC function is enabled) receives system ECC from the host 110_s via the data strobe RDQS (in a write operation). At 2660, the data is stored in the first portion of the memory array by the memory in the second mode. Referring to FIG. 3, the memory 150_s stores the data received via the DQs in the first portion 932 of the memory array 175_s. At 2670, the ECC of the data is stored in the second portion of the memory array by the memory in the second mode, based on the first address. For example, in the second mode, the address space of the memory 150_s is reduced to the first address space 942, and the first portion 932 and the second portion 934 share the first address space 942. The memory 150_s uses the first address to access (e.g., to store) the received system ECC into the second portion 934. At 2680, the ECC of the data is outputted to the host via the at least one non-data connection, by the memory in the second mode. For example, referring to FIG. 3, the memory 150_s outputs the system ECC stored in the second portion 934 to the host via the data mask DM (in a read operation).

At 2690, at least one mode register in the memory is set by the host, the first mode and the second mode being based on the at least one mode register. For example, referring to FIG. 3, the memory 150_s includes at least one mode register 179 separate from the memory array 175_s. The host 110_s is configured to set the at least one mode register 179, and the memory 150_s operates based on the at least one mode register 179. For example, the host 110_s sets the at least one mode register 179 in the memory 150_s, the first mode and the second mode are based on the at least one mode register 179. For example, the memory 150_s enters or exits the first mode and/or the second mode based on the at least one mode register 179. At 2710, a physical wordline is shared by the first portion and the second portion. For example, referring to FIG. 23, the first portion 932 and the second portion 934 share a physical wordline 954.

At 2720, to not access the second portion in the second mode is agreed by the host and the memory without exchanging information identifying the second address between the memory and the host. In the second mode, the host 110_s reduces address space used to access the memory array 175_s. For example, referring to FIG. 17, the host 110_s does not use the second address space 944 in the second mode. Such arrangement is agreed upon prior to any operation of the memory 150_s. For example, both the host 110_s and the memory 150_s agree to not access the second portion 934 in the second mode without requiring exchange information identifying the second address space 944 (e.g., including the second address). For example, the host 110_s sets the at least one mode register 179 (see FIG. 3) to cause to memory 150_s to operate in the second mode. No information on the second address space 944 would be required for memory accesses in the second mode.

At 2730-2770, features of the memory 150_s operating in a third mode (e.g., link ECC function enabled) are presented. At 2730, the ECC of the data is received from the host by the memory in the third mode, via the first non-data connection. At 2740, error detection or correction on the data is performed by the memory in the third mode, based on the ECC. At 2750, the data after error detection or correction is stored, by the memory in the third mode, in the first portion and in the second portion of the memory array. At 2760, the ECC is generated by the memory in the third mode based on the data stored in the first portion and in the second portion of the memory array. At 2770, the ECC is outputted to the host by the memory in the third mode via the at least one non-data connection.

In the third mode, both the first address space 942 and the second address space 944 may be available for access. Referring to FIG. 16, the host 110_s sets the at least one mode register 179 to indicate the third mode (link ECC function is enabled). In the third mode, the memory 150_s receives the ECC (e.g., link ECC such as parity bits) from the host 110_s, via the first non-data connection (e.g., the data strobe RDQS) in the write operation. The memory link ECC decoder 161 performs error detection or correction on the data based on the ECC. After the error detection or correction, the memory 150_s provides the data (e.g., corrected data) to the memory array 175_s and to store the data in the first portion 932 and in the second portion 934.

In the third mode and in the read operation, the memory link ECC encoder 162 generates the ECC based on the data stored in the first portion 932 and in the second portion 934 of the memory array 175_s. The memory 150_s outputs the ECC to the host 110_s via the at least one non-data connection (e.g., the data mask DM). In the third mode, the ECC is not stored in the memory array 175_s.

Figure 28:
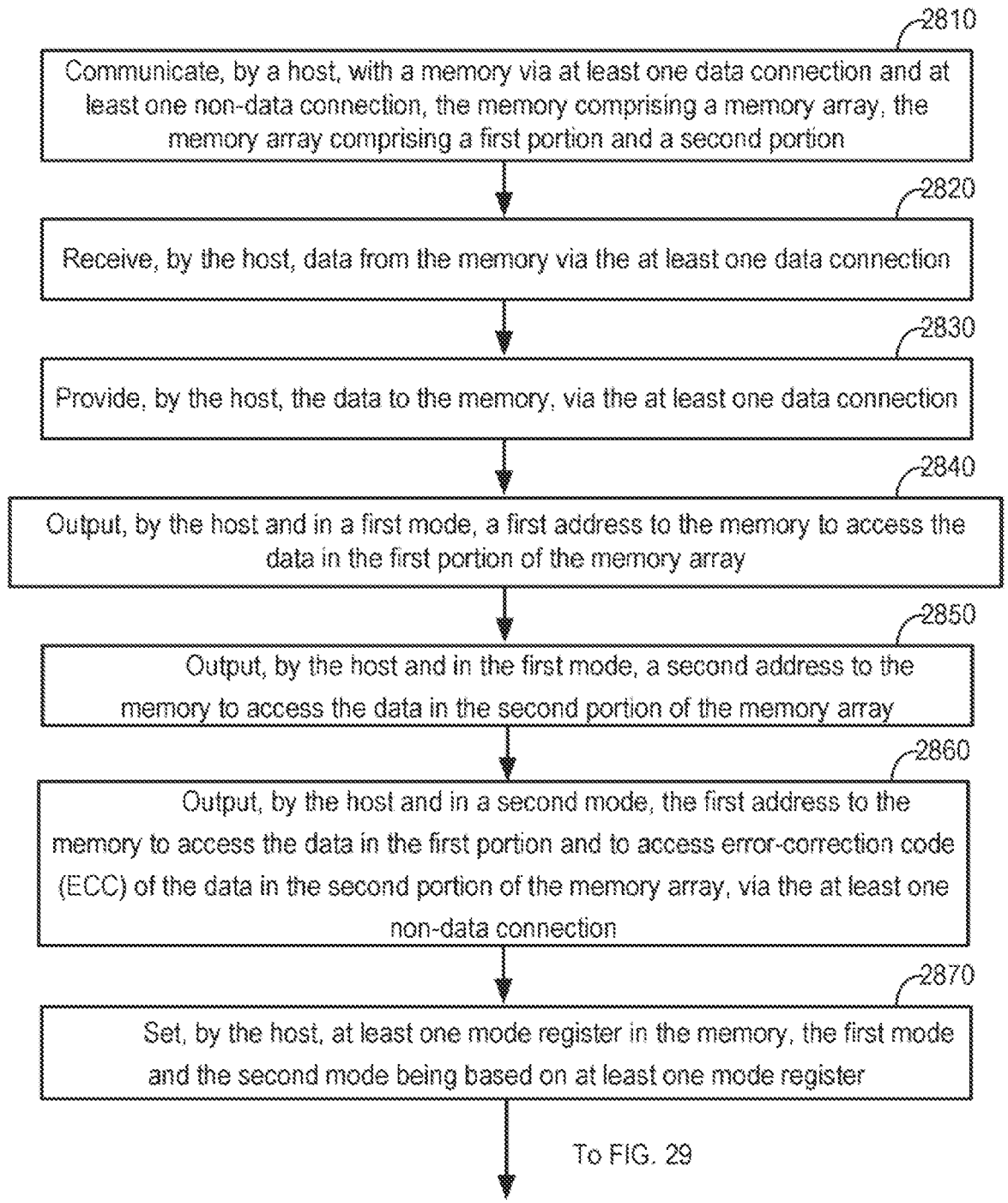
FIGS. 28, 29, and 30 illustrate other method or methods to communicate error correction code between a host and a memory, in accordance with certain aspects of the present disclosure.
Figure 29:
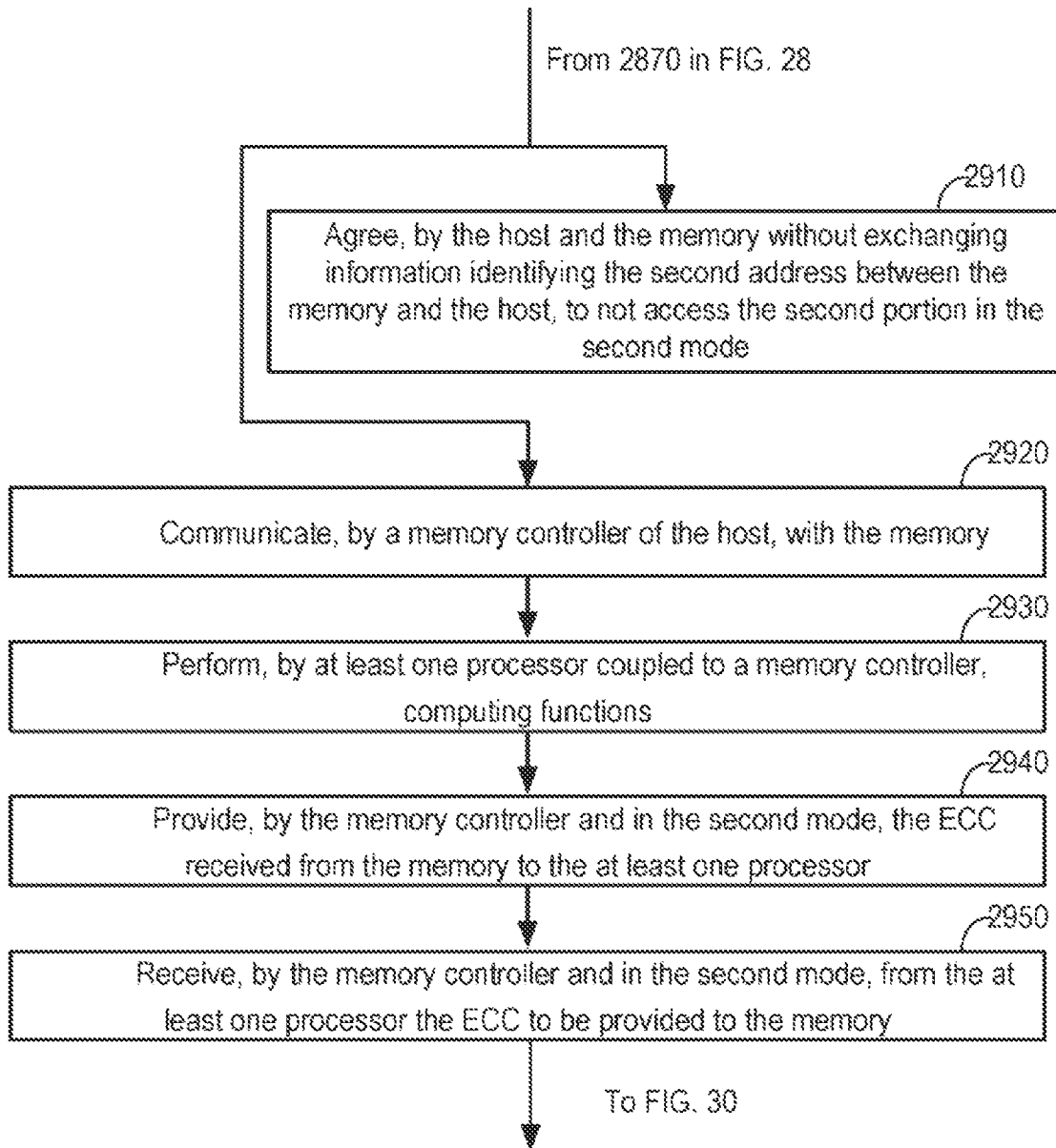
Figure 30:
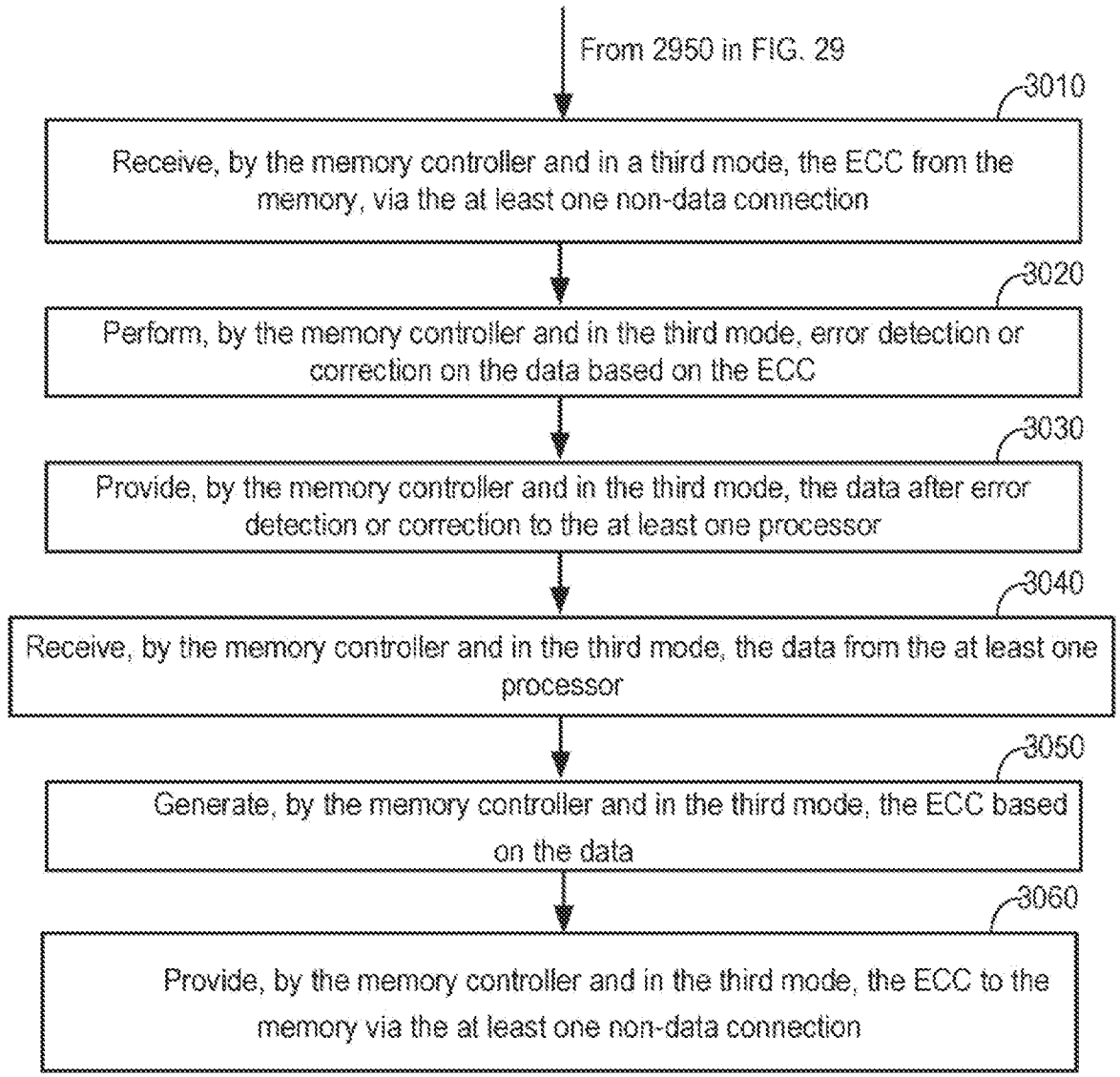

FIGS. 28, 29, and 30 illustrate other method or methods to communicate error correction code between a host and a memory, in accordance with certain aspects of the present disclosure. The operations of FIGS. 28, 29, and 30 may be implemented by, for example, the apparatus 100_s presented with FIGS. 3, 16, 17, and 23. The arrows indicate certain relationships among the operations, but not necessarily sequential relationships.

At 2810, communicate, by a host, with a memory via at least one data connection and at least one non-data connection. The memory includes a memory array. The memory array includes a first portion and a second portion. For example, referring to FIGS. 3 and 16, the host 110_s writes to and reads from the memory 150_s via a channel 190. The channel 190 includes at least on data connection, such as the DQs, and at least one non-data connection, such as the data mask DM (also referred to as DMI) and the data strobe RDQS. At 2820, data is received from the memory by the host via the at least one data connection. For example, in a read operation, the host 110_s receives read data from the memory 150_s via the DQs. At 2830, the data is provided by the host to the memory, via the at least one data connection.

For example, in a write operation, the host 110_s outputs and provides data to the memory 150_s via the DQs.

At 2840, a first address is outputted by the host in a first mode to the memory to access the data in the first portion of the memory array. At 2850, a second address is outputted by the host in the first mode to the memory to access the data in the second portion of the memory array. For example, referring to FIG. 16, the host 110_s in the first mode outputs a first address in the first address space 942 to the memory 150_s to access (e.g., read or write) data in the first portion 932 of the memory array 175_s. The host 110_s in the first mode outputs a second address in the second address space 944 to the memory 150_s to access (e.g., read or write) data in the second portion 934 of the memory array 175_s. At 2860, the first address is outputted by the host in the second mode to the memory to access the data in the first portion and to access error-correction code (ECC) of the data in the second portion of the memory array, via the at least one non-data connection. For example, in the second mode, the address space of the memory 150_s is reduced to the first address space 942, and the first portion 932 and the second portion 934 share the first address space 942. The host 110_s in the second mode outputs the first address to the memory 150_s, via the at least one non-data connection (e.g., the write mask DM or the data strobe RDQS) to access (e.g., to read or to write) the data in the first portion 932 and to access error-correction code (ECC) of the data in the second portion 934 of the memory array 175_s.

At 2870, set, by the host, at least one mode register in the memory, the first mode and the second mode being based on the at least one mode register. For example, referring to FIG. 3, the memory 150_s includes at least one mode register 179 separate from the memory array 175_s. The host 110_s is configured to set the at least one mode register 179, and the memory 150_s operates based on the at least one mode register 179. For example, the host 110_s sets the at least one mode register 179 in the memory 150_s, the first mode and the second mode are based on the at least one mode register 179. For example, the memory 150_s enters or exits the first mode and/or the second mode based on the at least one mode register 179.

At 2910, to not access the second portion in the second mode is agreed by the host and the memory without exchanging information identifying the second address between the memory and the host. In the second mode, the host 110_s reduces address space used to access the memory array 175_s. For example, referring to FIG. 17, the host 110_s does not use the second address space 944 in the second mode. Such arrangement is agreed upon prior to any operation of the memory 150_s. For example, both the host 110_s and the memory 150_s agree to not access the second portion 934 in the second mode without requiring exchange information identifying the second address space 944 (e.g., including the second address). For example, the host 110_s sets the at least one mode register 179 (see FIG. 3) to cause to memory 150_s to operate in the second mode. No information on the second address space 944 would be required for memory accesses in the second mode.

At 2920, the memory communicates with a memory controller of the host. At 2930, computing functions are performed by at least one processor coupled to the memory controller. Referring to FIGS. 3 and 16, the host 110_s includes a memory controller 130_s configured to communicate with the memory 150_s (e.g., outputting and receiving signaling on the channel 190). The host 110_s includes at least one processor 120 configured to couple with the memory controller 130_s in performing various computing functions (e.g., telephony, wireless data access, and camera/video function, etc.). The host 110_s receives the data from and provides the data to the memory 150_s (e.g., to be stored in the memory array 175_s) via the at least one data connection (e.g., DQs).

At 2940, the ECC received from the memory is provided to the at least one processor by the memory controller in the second mode. At 2950, ECC to be provided to the memory is received from the at least one processor by the memory controller in the second mode. For example, Referring to FIG. 3, the memory controller 130_s in the second mode (e.g., the system ECC function is enabled) receives the system ECC from the memory 150_s, the system ECC being stored in the second portion 934 of the memory array 175_s. The memory controller 130_s further provides the system ECC to the at least one processor 120 via the bus system 115. Further in the second mode, the memory controller 130_s receives from the at least one processor 120 the system ECC via the bus system 115. The memory controller 130_s in turn provides the system ECC to the memory 150_s. In some examples, the memory controller 130_s does not encode or decode the system ECC.

At 3010-3060, features of the host 110_s operating in a third mode (e.g., link ECC function enabled) are presented. At 3010, the ECC from the memory is received by the memory controller in a third mode, via the at least one non-data connection. At 3020, error detection or correction is performed by the memory controller in the third mode on the data based on the ECC. At 3030, the data after error detection or correction is provided by the memory controller in the third mode to the at least one processor. At 3040, the data from the at least one processor is received by the memory controller in the third mode. At 3050, the ECC is generated based on the data by the memory controller in the third mode. At 3060, the ECC is provided by the memory controller in the third mode to the memory via the at least one non-data connection.

For example, in the third mode, the memory controller 130_s receives the ECC (e.g., the link ECC) from the memory 150_s, via the at least one non-data connection (e.g., the data strobe RDQS in the write operation and the data mask DM in the read operation). The memory controller 130_s (e.g., by the link ECC decoder 135) performs error detection or correction on the data based on the ECC. The memory controller 130_s further provides, after error detection or correction, the data (e.g., corrected data) to the at least one processor 120 via the bus system 115. The memory controller 130_s further receives the data from the at least one processor 120, generates the ECC (e.g., the link ECC encoder 136 generating link ECC) based on the data from the at least one processor 120, and provides the ECC to the memory 150_s via the at least one non-data connection.

Figure 31:
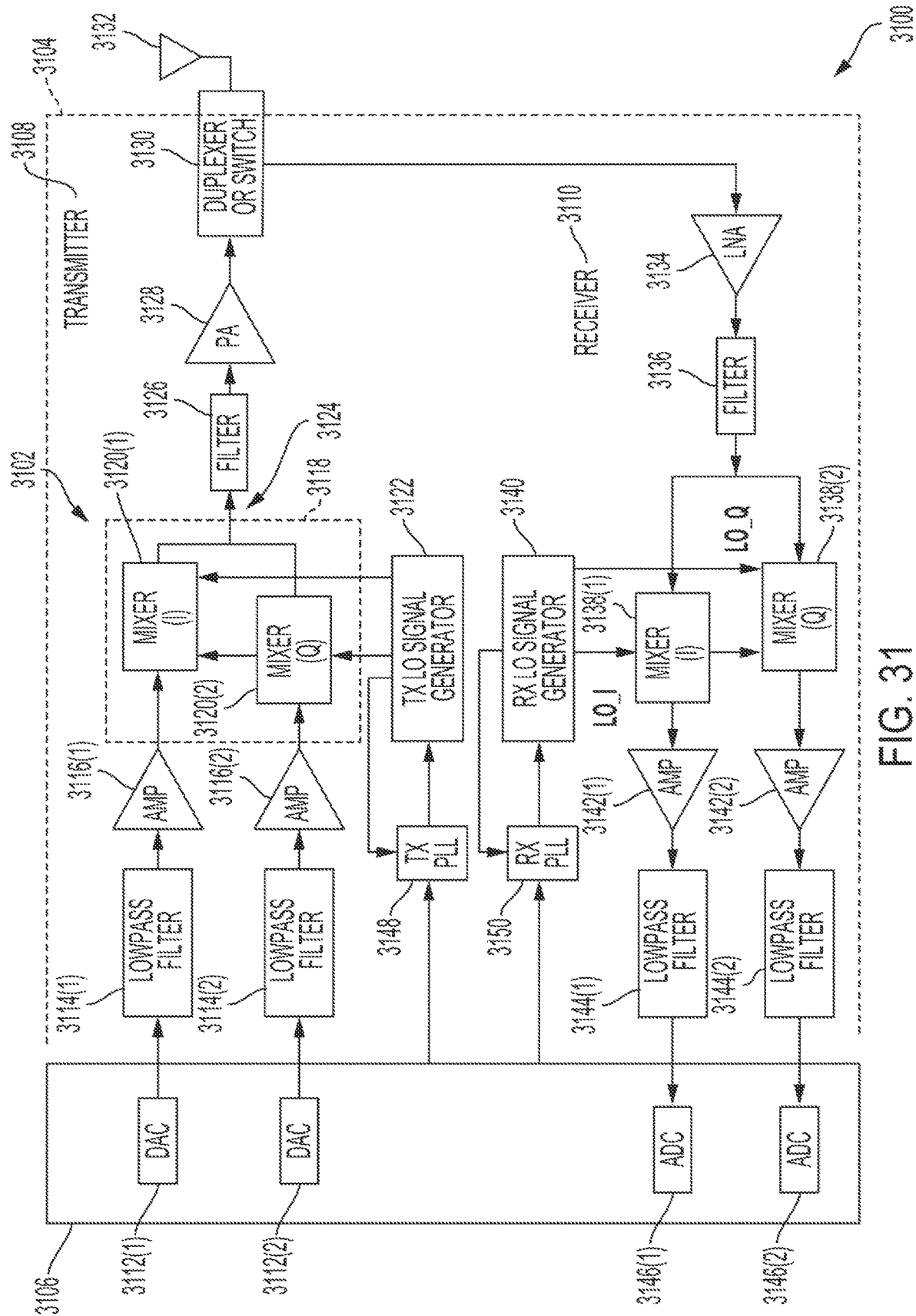
FIG. 31 is a block diagram of an exemplary wireless communications device that includes a radio-frequency (RF) module including the system ECC function.

FIG. 31 illustrates an exemplary wireless communications device 3100 that includes radio-frequency (RF) components formed from one or more integrated circuits (ICs) 3102, wherein the wireless communications device 3100 can include a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any of the aspects disclosed herein. As shown in FIG. 31, the wireless communications device 3100 includes a transceiver 3104 and a data processor 3106. The data processor 3106 may include a memory to store data and program codes. The transceiver 3104 includes a transmitter 3108 and a receiver 3110 that support bi-directional communications. In general, the wireless communications device 3100 may include any number of transmitters 3108 and/or receivers 3110 for any number of communication systems and frequency bands. All or a portion of the transceiver 3104 may be implemented on one or more analog ICs, RFICs, mixed-signal ICs, etc.

The transmitter 3108 or the receiver 3110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 3100 in FIG. 31, the transmitter 3108 and the receiver 3110 are implemented with the direct-conversion architecture.

In the transmit path, the data processor 3106 processes data to be transmitted and provides I and Q analog output signals to the transmitter 3108. In the exemplary wireless communications device 3100, the data processor 3106 includes digital-to-analog converters (DACs) 3112(1), 3112(2) for converting digital signals generated by the data processor 3106 into the I and Q analog output signals, e.g., I and Q output currents, for further processing.

Within the transmitter 3108, lowpass filters 3114(1), 3114(2) filter the I and Q analog output signals, respectively, to remove undesired signals caused by the prior digital-to-analog conversion. Amplifiers (AMPs) 3116(1), 3116(2) amplify the signals from the lowpass filters 3114(1), 3114(2), respectively, and provide I and Q baseband signals. An upconverter 3118 upconverts the I and Q baseband signals with I and Q transmit (TX) local oscillator (LO) signals from a TX LO signal generator 3122 through mixers 3120(1), 3120(2) to provide an upconverted signal 3124. A filter 3126 filters the upconverted signal 3124 to remove undesired signals caused by the frequency upconversion as well as noise in a receive frequency band. A power amplifier (PA) 3128 amplifies the upconverted signal 3124 from the filter 3126 to obtain the desired output power level and provides a transmit RF signal. The transmit RF signal is routed through a duplexer or switch 3130 and transmitted via an antenna 3132.

In the receive path, the antenna 3132 receives signals transmitted by base stations and provides a received RF signal, which is routed through the duplexer or switch 3130 and provided to a low noise amplifier (LNA) 3134. The duplexer or switch 3130 is designed to operate with a specific receive (RX)-to-TX duplexer frequency separation, such that RX signals are isolated from TX signals. The received RF signal is amplified by the LNA 3134 and filtered by a filter 3136 to obtain a desired RF input signal. Down-conversion mixers 3138(1), 3138(2) mix the output of the filter 3136 with I and Q RX LO signals (i.e., LO_I and LO_Q) from an RX LO signal generator 3140 to generate I and Q baseband signals. The I and Q baseband signals are amplified by AMPs 3142(1), 3142(2) and further filtered by lowpass filters 3144(1), 3144(2) to obtain I and Q analog input signals, which are provided to the data processor 3106. In this example, the data processor 3106 includes analog-to-digital converters (ADCs) 3146(1), 3146(2) for converting the analog input signals into digital signals to be further processed by the data processor 3106.

In the wireless communications device 3100 of FIG. 31, the TX LO signal generator 3122 generates the I and Q TX LO signals used for frequency upconversion, while the RX LO signal generator 3140 generates the I and Q RX LO signals used for frequency downconversion. Each LO signal is a periodic signal with a particular fundamental frequency. A TX phase-locked loop (PLL) circuit 3148 receives timing information from the data processor 3106 and generates a control signal used to adjust the frequency and/or phase of the TX LO signals from the TX LO signal generator 3122. Similarly, an RX PLL circuit 3150 receives timing information from the data processor 3106 and generates a control signal used to adjust the frequency and/or phase of the RX LO signals from the RX LO signal generator 3140.

Wireless communications devices 3100 that each include a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 32:
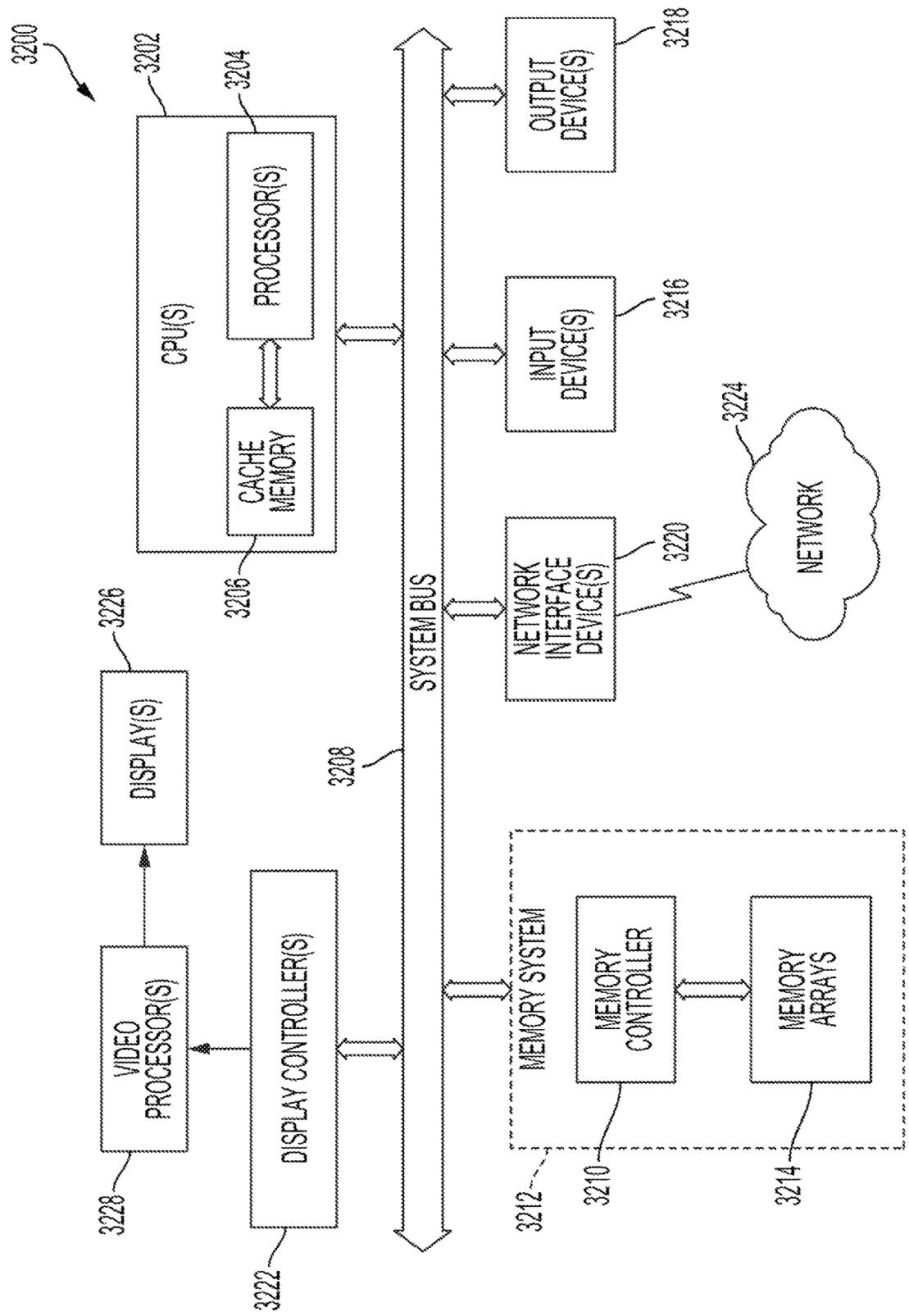
FIG. 32 is a block diagram of an exemplary processor system including the system ECC function, and according to any of the aspects disclosed herein.

In this regard, FIG. 32 illustrates an example of a processor-based system 3200 including a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any aspects disclosed herein. In this example, the processor-based system 3200 includes one or more central processor units (CPUs) 3202, which may also be referred to as CPU or processor cores, each including one or more processors 3204. The CPU(s) 3202 may have cache memory 3206 coupled to the processor(s) 3204 for rapid access to temporarily stored data. As an example, the processor(s) 3204 could include a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any aspects disclosed herein. The CPU(s) 3202 is coupled to a system bus 3208 and can intercouple master and slave devices included in the processor-based system 3200. As is well known, the CPU(s) 3202 communicates with these other devices by exchanging address, control, and data information over the system bus 3208. For example, the CPU(s) 3202 can communicate bus transaction requests to a memory controller 3210 as an example of a slave device. Although not illustrated in FIG. 32, multiple system buses 3208 could be provided, wherein each system bus 3208 constitutes a different fabric.

Other master and slave devices can be connected to the system bus 3208. As illustrated in FIG. 32, these devices can include a memory system 3212 that includes the memory controller 3210 and one or more memory arrays 3214, one or more input devices 3216, one or more output devices 3218, one or more network interface devices 3220, and one or more display controllers 3222, as examples. Each of the memory system 3212, the one or more input devices 3216, the one or more output devices 3218, the one or more network interface devices 3220, and the one or more display controllers 3222 can include a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any of the aspects disclosed herein. The input device(s) 3216 can include any type of input device, including, but not limited to, input keys, switches, voice processors, etc. The output device(s) 3218 can include any type of output device, including, but not limited to, audio, video, other visual indicators, etc. The network interface device(s) 3220 can be any device configured to allow exchange of data to and from a network 3224. The network 3224 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 3220 can be configured to support any type of communications protocol desired.

The CPU(s) 3202 may also be configured to access the display controller(s) 3222 over the system bus 3208 to control information sent to one or more displays 3226. The display controller(s) 3222 sends information to the display(s) 3226 to be displayed via one or more video processors 3228, which process the information to be displayed into a format suitable for the display(s) 3226. The display(s) 3226 can include any type of display, including, but not limited to, a cathode ray tube (CRT), a liquid crystal display (LCD), a plasma display, a light emitting diode (LED) display, etc. The display controller(s) 3222, display(s) 3226, and/or the video processor(s) 3228 can include a memory configured to receive and output data on at least one data connection and, in a first mode, store data in a first portion of a memory array addressable by a first address and in a second portion of the memory array addressable by a second address and, in a second mode, receive and output ECC via at least one non-data connection, store data in the first portion at a first address, and store the ECC in the second portion based on the first address, as illustrated in at least FIGS. 3, 16, 21, and 22, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the claim language. Reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

Implementation examples are described in the following numbered clauses:

1. An apparatus, comprising:
   a memory configured to communicate with a host via at least one data connection and at least one non-data connection, the memory comprising a memory array, the memory array comprising a first portion and a second portion;
   the memory further configured to:
      receive data from the host via the at least one data connection; and
      output the data to the host via the at least one data connection;
   the memory further configured to, in a first mode:
      store and output the data in the first portion and the second portion of the memory array, the first portion being addressable by a first address, the second portion being addressable by a second address; and
   the memory further configured to, in a second mode:
      receive error-correction code (ECC) of the data from the host, via the at least one non-data connection;
      store the data in the first portion of the memory array;
      store the ECC of the data in the second portion of the memory array based on the first address; and
      output the ECC of the data to the host, via the at least one non-data connection.

2. The apparatus of clause 1, wherein the memory further comprises at least one mode register configurable to be set by the host, the first mode and the second mode being based on the at least one mode register.

3. The apparatus of clause 1 or clause 2, wherein the memory is further configured to agree to not access the second portion addressable by the second address in the second mode, without exchanging information identifying the second address between the memory and the host.

4. The apparatus of any of clauses 1-3, wherein the first address and the second address differ in row addressing.

5. The apparatus of any of clauses 1-3, wherein the first address and the second address differ in column addressing.

6. The apparatus of any of clauses 1-5, wherein the first portion and the second portion share a physical wordline.

7. The apparatus any of clauses 1-6, wherein the memory is further configured to, in a third mode:
   receive the ECC of the data from the host, via the at least one non-data connection;
   perform error detection or correction on the data based on the ECC;
   store the data, after the error detection or correction, in the first portion and in the second portion of the memory array;
   generate the ECC based on the data stored in the first portion and in the second portion of the memory array; and
   output the ECC to the host via the at least one non-data connection.

8. The apparatus of any of clauses 1-7, further comprising a device selected from one of a computing system, a mobile computing system, an Internet of Things device, a virtual reality system, or an augmented reality system,
   the device incorporating the memory, the host, the at least one data connection, and the at least one non-data connection.

9. An apparatus, comprising:
   a host configured to communicate with a memory via at least one data connection and at least one non-data connection, the memory comprising a memory array, the memory array comprising a first portion and a second portion;
   the host further configured to:
      receive data from the memory and provide the data to the memory, via the at least one data connection;
   the host further configured to, in a first mode:
      output a first address to the memory to access the data in the first portion of the memory array; and
      output a second address to the memory to access the data in the second portion of the memory array; and
   the host further configured to, in a second mode:
      output the first address to the memory to access the data in the first portion and to access error-correction code (ECC) of the data in the second portion of the memory array, via the at least one non-data connection.

10. The apparatus of clause 9, wherein the host is further configured to set at least one mode register in the memory, the first mode and the second mode being based on the at least one mode register.

11. The apparatus of clause 9 or clause 10, wherein the host is further configured to agree to not access the second portion addressable by the second address in the second mode, without exchanging information identifying the second address between the memory and the host.

12. The apparatus of any of clauses 9-11, wherein the first address and the second address differ in row addressing.

13. The apparatus of any of clauses 9-11, wherein the first address and the second address differ in column addressing.

14. The apparatus of any of clauses 9-13, wherein the host comprises a memory controller and at least one processor, the memory controller configured to communicate with the memory, the at least one processor coupled with the memory controller in performing computing functions,
 wherein, in the second mode, the memory controller is configured to:
  provide the ECC received from the memory to the at least one processor; and
  receive from the at least one processor the ECC to be provided to the memory,
 wherein, in a third mode, the memory controller is further configured to:
  receive the ECC from the memory, via the at least one non-data connection;
  perform error detection or correction on the data based on the ECC; and
  provide, after the error detection or correction, the data to the at least one processor, and
 wherein, in the third mode, the memory controller is further configured to:
  receive the data from the at least one processor;
  generate the ECC based on the data; and
  provide the ECC to the memory via the at least one non-data connection.

15. The apparatus of any of clauses 9-14, further comprising a device selected from one of a computing system, a mobile computing system, an Internet of Things device, a virtual reality system, or an augmented reality system,
 the device incorporating the memory, the host, the at least one data connection, and the at least one non-data connection.

16. A method to communicate error correction code between a host and a memory, comprising:
 communicating, by the memory, with the host via at least one data connection and at least one non-data connection, the memory comprising a memory array, the memory array comprising a first portion and a second portion;
 receiving, by the memory, data from the host via the at least one data connection;
 outputting, by the memory, the data to the host via the at least one data connection;
 storing and outputting, by the memory in a first mode, the data in the first portion and the second portion of the memory array of the memory, the first portion being addressable by a first address, the second portion being addressable by a second address;
 receiving, by the memory in a second mode, error-correction code (ECC) of the data from the host, via the at least one non-data connection;
 storing, by the memory in the second mode, the data in the first portion of the memory array;
 storing, by the memory in the second mode, the ECC of the data in the second portion of the memory array based on the first address; and
 outputting, by the memory in the second mode, the ECC of the data to the host, via the at least one non-data connection.

17. The method of clause 16, further comprising setting, by the host, at least one mode register in the memory, the first mode and the second mode being based on the at least one mode register.

18. The method of clause 16 or clause 17, further comprising:
 agreeing, by the host and the memory without exchanging information identifying the second address between the memory and the host, to not access the second portion addressable by the second address in the second mode.

19. The method of any of clauses 16-18, wherein the first address and the second address differ in row addressing.

20. The method of any of clauses 16-18, wherein the first address and the second address differ in column addressing.

21. The method of any of clauses 16-20, further comprising:
 sharing, by the first portion and the second portion, a physical wordline.

22. The method of any of clauses 16-21, further comprising:
 receiving, by the memory in a third mode, the ECC of the data from the host, via the at least one non-data connection;
 performing, by the memory in the third mode, error detection or correction on the data based on the ECC;
 storing, by the memory in the third mode, the data, after the error detection or correction, in the first portion and in the second portion of the memory array;
 generating, by the memory in the third mode, the ECC based on the data stored in the first portion and in the second portion of the memory array; and
 outputting, by the memory in the third mode, the ECC to the host via the at least one non-data connection.

23. A method to communicate error correction code between a host and a memory, comprising:
 communicating, by the host, with the memory via at least one data connection and at least one non-data connection, the memory comprising a memory array, the memory array comprising a first portion and a second portion;
 receiving, by the host, data from the memory via the at least one data connection;
 providing, by the host, the data to the memory, via the at least one data connection;
 outputting, by the host in a first mode, a first address to the memory to access the data in the first portion of the memory array;
 outputting, by the host in the first mode, a second address to the memory to access the data in the second portion of the memory array; and
 outputting, by the host in a second mode, the first address to the memory to access the data in the first portion and to access the error-correction code (ECC) of the data in the second portion of the memory array, via the at least one non-data connection.

24. The method of clause 23, further comprising setting, by the host, at least one mode register in the memory, the first mode and the second mode being based on the at least one mode register.

25. The method of clause 23 or clause 24, further comprising agreeing, by the host and the memory without exchanging information identifying the second address between the memory and the host, to not access the second portion addressable by the second address in the second mode.

26. The method of any of clauses 23-25, wherein the first address and the second address differ in row addressing.

27. The method of any of clauses 23-25, wherein the first address and the second address differ in column addressing.

28. The method of any of clauses 23-27, further comprising, communicating, by a memory controller of the host, with the memory;

performing, by at least one processor coupled to the memory controller, computing functions;

providing, by the memory controller in the second mode, the ECC received from the memory to the at least one processor;

receiving, by the memory controller in the second mode, from the at least one processor the ECC to be provided to the memory;

receiving, by the memory controller in a third mode, the ECC from the memory, via the at least one non-data connection;

performing, by the memory controller in the third mode, error detection or correction on the data based on the ECC;

providing, by the memory controller in the third mode, the data after the error detection or correction to the at least one processor;

receiving, by the memory controller in the third mode, the data from the at least one processor;

generating, by the memory controller in the third mode, the ECC based on the data; and providing, by the memory controller in the third mode, the ECC to the memory via the at least one non-data connection.

29. An apparatus, comprising:
a memory configured to communicate with a host,
the memory comprising a memory array, the memory array comprising a first portion and a second portion;
the memory further configured to:
receive data from the host; and
output the data to the host;
the memory further configured to, in a first mode, store and output the data in the first portion and the second portion of the memory array, the first portion being addressable by a first address, the second portion being addressable by a second address; and
the memory further configured to, in a second mode:
store and output the data in the first portion, based on the first address;
receive metadata of the data from the host; and
store and output the metadata in the second portion, based on the first address.

30. The apparatus of clause 29, wherein the metadata is cryptographic metadata.

31. The apparatus of clause 29, wherein the metadata is compression metadata.

32. The apparatus of any of clauses 29-31, wherein the memory array further comprises a third portion, the memory further configured to:
generate array error-correction code (ECC) based on the data received from the host; and
store the array ECC in the third portion.

33. An apparatus, comprising:
a host configured to communicate with a memory, the memory comprising a memory array, the memory array comprising a first portion and a second portion;
the host further configured to receive data from the memory and provide the data to the memory;
the host further configured to, in a first mode:
output a first address to the memory to access the data in the first portion of the memory array; and
output a second address to the memory to access the data in the second portion of the memory array; and
the host further configured to, in a second mode output the first address to the memory to access the data in the first portion and to access metadata of the data in the second portion of the memory array.

34. The apparatus of clause 33, wherein the metadata is cryptographic metadata.

35. The apparatus of clause 33, wherein the metadata is compression metadata.

36. The apparatus of any of clauses 33-35, integrated into a radio-frequency (RF) front end module.

37. The apparatus of any of clauses 33-36, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

What is claimed is:

1. An apparatus, comprising:
a memory configured to communicate with a host,
the memory comprising a memory array, the memory array comprising a first portion, a second portion, and a third portion;
the memory further configured to:
receive data from the host; and
output the data to the host;
the memory further configured to, in a first mode:
store and output the data in the first portion and the second portion of the memory array, the first portion being addressable by a first address, the second portion being addressable by a second address;
generate first array error-correction code (ECC) based on the data in the first portion; and
store the first array ECC in the third portion; and
the memory further configured to, in a second mode:
store and output the data in the first portion, based on the first address;
receive metadata of the data from the host; and
store and output the metadata in the second portion, based on the first address.

2. The apparatus of claim 1, wherein the metadata is cryptographic metadata.

3. The apparatus of claim 1, wherein the metadata is compression metadata.

4. The apparatus of claim 1, wherein the memory is further configured to, in the first mode:
generate second array ECC based on the data in the second portion; and
store the second array ECC in the third portion.

5. The apparatus of claim 1, wherein the memory is further configured to, in the second mode:
generate third array ECC based on the data and the metadata; and
store the third array ECC in the third portion.

6. An apparatus, comprising:
a host configured to communicate with a memory, the memory comprising a memory array, the memory array comprising a first portion, a second portion, and a third portion;

the host further configured to receive data from the memory and provide the data to the memory;

the host further configured to, in a first mode:
  output a first address to the memory to access the data in the first portion of the memory array;
  generate first array error-correction code (ECC) based on the data in the first portion;
  store the first array ECC in the third portion; and
  output a second address to the memory to access the data in the second portion of the memory array; and the host further configured to, in a second mode, output the first address to the memory to access the data in the first portion and to access metadata of the data in the second portion of the memory array.

7. The apparatus of claim 6, wherein the metadata is cryptographic metadata.

8. The apparatus of claim 6, wherein the metadata is compression metadata.

9. The apparatus of claim 6, integrated into a radio-frequency (RF) front end module.

10. The apparatus of claim 6 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. The apparatus of claim 6, wherein the host is further configured to, in the first mode:
  generate second array ECC based on the data in the second portion; and
  store the second array ECC in the third portion.

12. The apparatus of claim 6, wherein the host is further configured to, in the second mode:
  generate third array ECC based on the data and the metadata; and
  store the third array ECC in the third portion.

* * * * *